(12) United States Patent
Nakahata et al.

(10) Patent No.: US 7,655,960 B2
(45) Date of Patent: Feb. 2, 2010

(54) $Al_xIn_yGA_{1-x-y}N$ MIXTURE CRYSTAL SUBSTRATE, METHOD OF GROWING SAME AND METHOD OF PRODUCING SAME

(75) Inventors: Seiji Nakahata, Hyogo (JP); Ryu Hirota, Hyogo (JP); Kensaku Motoki, Hyogo (JP); Takuji Okahisa, Hyogo (JP); Kouji Uematsu, Hyogo (JP)

(73) Assignee: Sumito Electric Industries, Ltd., Osaka (JP)

( * ) Notice: Subject to any disclaimer, the term of this patent is extended or adjusted under 35 U.S.C. 154(b) by 525 days.

(21) Appl. No.: 11/501,817

(22) Filed: Aug. 10, 2006

(65) Prior Publication Data

US 2006/0273343 A1 Dec. 7, 2006

Related U.S. Application Data

(60) Division of application No. 11/041,202, filed on Jan. 25, 2005, now Pat. No. 7,105,865, which is a continuation-in-part of application No. 10/700,495, filed on Nov. 5, 2003, now Pat. No. 7,112,826, which is a division of application No. 10/246,559, filed on Sep. 19, 2002, now Pat. No. 6,667,184.

(30) Foreign Application Priority Data

Sep. 19, 2001 (JP) ............................. 2001-284323
Aug. 8, 2002 (JP) ............................. 2002-230925

(51) Int. Cl.
*H01L 33/00* (2006.01)
(52) U.S. Cl. ......................... 257/103; 257/22; 257/74; 257/75; 438/22; 438/24; 438/42

(58) Field of Classification Search ................. 257/15, 257/17–18, 22, 190, 103, 74, 75, E33.028; 438/481, 46, 22, 24, 42
See application file for complete search history.

(56) References Cited

U.S. PATENT DOCUMENTS 6,051,849 A 4/2000 Davis et al.

(Continued)

FOREIGN PATENT DOCUMENTS

EP 0 966 047 A 12/1999

(Continued)

OTHER PUBLICATIONS

European Search Report issued in European Patent Application No. EP 02 02 1243, dated Apr. 2, 2008.

(Continued)

*Primary Examiner*—Thinh T Nguyen
(74) *Attorney, Agent, or Firm*—McDermott Will & Emery LLP

(57) ABSTRACT

Seeds are implanted in a regular pattern upon an undersubstrate. An $Al_xIn_yGa_{1-x-y}N$ ($0 \leq x \leq 1$, $0 \leq y \leq 1$, $0 < x+y \leq 1$) mixture crystal is grown on the seed implanted undersubstrate by a facet growth method. The facet growth makes facet pits above the seeds. The facets assemble dislocations to the pit bottoms from neighboring regions and make closed defect accumulating regions (H) under the facet bottoms. The closed defect accumulating regions (H) arrest dislocations permanently. Release of dislocations, radial planar defect assemblies and linear defect assemblies are forbidden. The surrounding accompanying low dislocation single crystal regions (Z) and extra low dislocation single crystal regions (Y) are low dislocation density single crystals.

3 Claims, 13 Drawing Sheets

U.S. PATENT DOCUMENTS

| | | | |
|---|---|---|---|
| 6,252,261 | B1 | 6/2001 | Usui et al. |
| 6,447,604 | B1* | 9/2002 | Flynn et al. .................. 117/89 |
| 6,500,747 | B1 | 12/2002 | Lee et al. |
| 6,537,839 | B2 | 3/2003 | Ota et al. |
| 6,555,846 | B1 | 4/2003 | Watanabe et al. |
| 6,576,533 | B2* | 6/2003 | Tomiya et al. .............. 438/481 |
| 6,693,021 | B1 | 2/2004 | Motoki et al. |
| 6,815,728 | B2 | 11/2004 | Tsuda et al. |
| 6,841,274 | B2 | 1/2005 | Ueno et al. |
| 7,112,826 | B2* | 9/2006 | Motoki et al. .............. 257/103 |
| 2003/0001168 | A1 | 1/2003 | Tsuda et al. |
| 2005/0092234 | A1 | 5/2005 | Motoki et al. |
| 2005/0095861 | A1 | 5/2005 | Ueno et al. |
| 2005/0179130 | A1 | 8/2005 | Tanaka et al. |
| 2007/0012943 | A1 | 1/2007 | Okahisa et al. |

FOREIGN PATENT DOCUMENTS

| | | |
|---|---|---|
| EP | 1 041 610 A | 10/2000 |
| EP | 1 088 914 A1 | 4/2001 |
| JP | 10-112438 | 4/1998 |
| JP | 10-171276 | 6/1998 |
| JP | 10-9008 | 1/2000 |
| JP | 10-102546 | 4/2001 |
| JP | 2001-102307 | 4/2001 |
| JP | 2003-165799 | 6/2003 |
| JP | 2003-183100 | 7/2003 |
| JP | 2006-066496 | 3/2006 |
| WO | WO 99/23693 | 5/1999 |

OTHER PUBLICATIONS

Hiramatsu, K., et al. "Fabrication and characterization of low defect density GaN using facet-controlled epitaxial lateral overgrowth (FACELO)," Journal of Crystal Growth, 2000, p. 316-326, vol. 221, Elsevier Science B.V.

European Search Report issued in European Patent Application No. EP 07 01 0274 dated May 18, 2009.

T. Ogino & M. Aoki, "Mechanism of Yellow Luminescence in GaN," Japanese Journal of Applied Physics, vol. 19, No. 12, Dec. 1980, pp. 2395-2405.

Powell, A.R. "New Approach to growth of low dislocation relaxed SiGe material." Applied Physics Letter, 64 (14) Apr. 4, 1994, pp. 1856-1858.

Miyake, H et al., "Fabrication of GaN with buried tungsten (W) structures using epitaxial lateral overgrowth (ELO) via LP-MOVPE" GaN and Related Alloys—1999. Symposium (Materials Research Society Symposium Proceedings vol. 595), GaN and Related Alloys-13 1999. Symposium, Boston, MA, USA, Nov. 28-Dec. 3, 1999. 'Online! pp. W2.3.1.-6, XP002228660.

Kuan, T S et al., "Dislocation mechanisms in the GaN lateral overgrowth by hydride vapor phase epitaxy", GaN and Related Alloys—1999. Symposium (Materials Research Society Symposium Proceedings vol. 595), GaN and Related Alloys—1999. Symposium, Boston, MA, USA, Nov. 28-Dec. 3, 1999, 'Online!, pp. W2.6.1-6, XP002228659.

Zhang, et al., "Epitaxial lateral overgrowth of GaN with chloride-based growth chemistries in both hydride and metalorganic vapor phase epitaxy", GaN and Related Alloys, Symposium, GaN and Related Alloys, Symposium, Boston, MA, USA, Nov. 30-Dec. 4, 1998, 'Online!, p. G4. 7/6 pp. XP002228658.

Kawaguchi, Y. et al., "Selective area growth (SAG) and epitaxial lateral overgrowth (ELO) of GaN using tungsten mask", GaN and Related Alloys, Symposium, GaN and Related Alloys, Symposium, Boston, MA, USA, Nov. 30-Dec. 4, 1998, 'Online!, p. G4 1/6 pp. XP002228657.

Li, X et al., "Characteristics of GaN stripes grown by selective-area metalorganic chemical vapor deposition", Proceedings of the 38th Electronic Materials Conference, Santa Barbara, CA, USA, Jun. 26-28, 1996, vol. 26, No. 3, pp. 306-310, XP009004611.

Wu, J et al., "Selective growth of cubic GaN on patterned GaAs (100) substrates by metalorganic vapor phase epitaxy", 3rd International Conference on Nitride Semconductors, Montpellier, France, Jul. 4-9, 1999, 'Online!, vol. 176, No. 1, pp. 557-560, XP002228656.

Kapolnek, D et al. "Anisotropic Epitaxial Lateral Growth in GaN Selective Area Epitaxy", Applied Physics Letters, American Institute of Physics, New York, US, vol. 71, No. 9, Sep. 1, 1997, pp. 1204-1206, XP000720234.

Akasaka, T et al., "GaN Hexagonal Microprisms With Smooth Vertical Facets Fabricated by Selective Metalorganic Vapor Phase Epitaxy", Applied Physics Letters, American Institute of Physics, New York, US, vol. 71, No. 15, Oct. 13, 1997, pp. 2196-2198, XP000725873.

Usui, A et al., "Thick GaN Epitaxial Growth With Low Disclocation Density by Hydride Vapor Phase Epitaxy", Japanese Journal of Applied Physics, Publication Office Japanese Journal of Applied Physics. Tokyo, JP, vol. 36., No. 7B, Part 2, Jul. 15, 1997, pp. L899-L902, XP000742410.

Beaumont, B, et al., Lateral Overgrowth of GaN on Patterned GaN/Sapphire Substrate via Selective Metal Organic Vapour Phase Epitaxy: A Route to Produce Self Supported GaN Substrates, Journal of Crystal Growth, North-Holland Publishing Co., Amsterdam, NL, vol. 189/190, Jun. 2, 1998, pp. 97-102, XP000667735.

Yoshiki, K., et al., "Selective Growth of Wurtzite GaN and ALXGA1-XN on GaN/Sapphire Substrates by Metalorganic Vapor Phase Epitaxy", Journal of Crystal Growth, North-Holland Publishing Co. Amsterdam, NL, vol. 144, No. 3/4, Dec. 2, 1994, pp. 133-140, XP000483655.

Usui, A "Growth of Thick GaN Layers by Hydride Vapor-Phase Epitaxy", Electronics & Communications in Japan, Part II—Electronics, Scripta Technica. New York, US, vol. 81, No. 7, Jul. 1998, pp. 57-63, XP000835031.

* cited by examiner

Fig.1　Prior Art
decrement of dislocations by a pit made by facets
(a) a pit made by facets
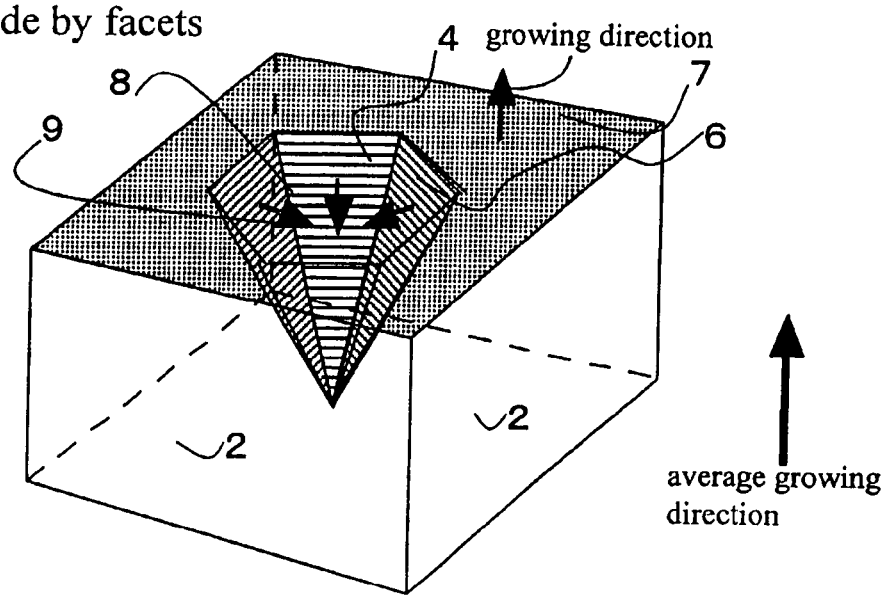
(b) after continual growth
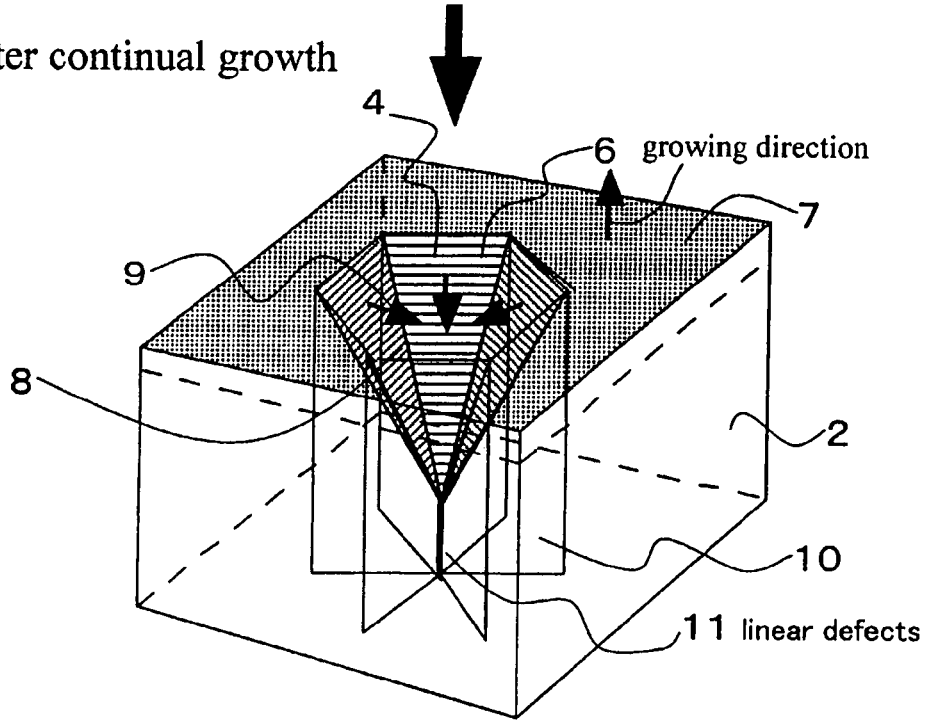

Movements of dislocations inside a pit made by facets

Fig.3 Prior Art facet growth
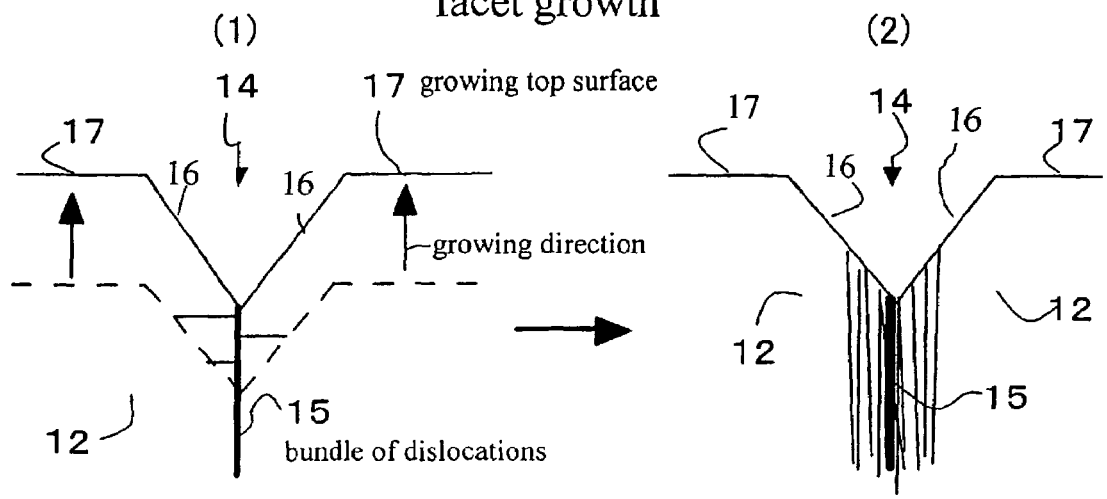
Fig.4 growing method of the present invention
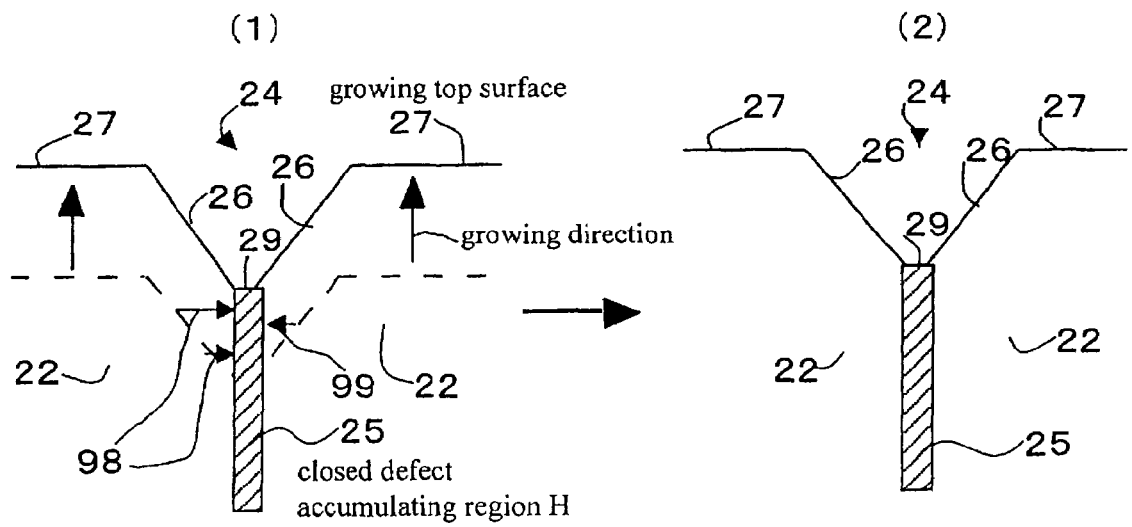

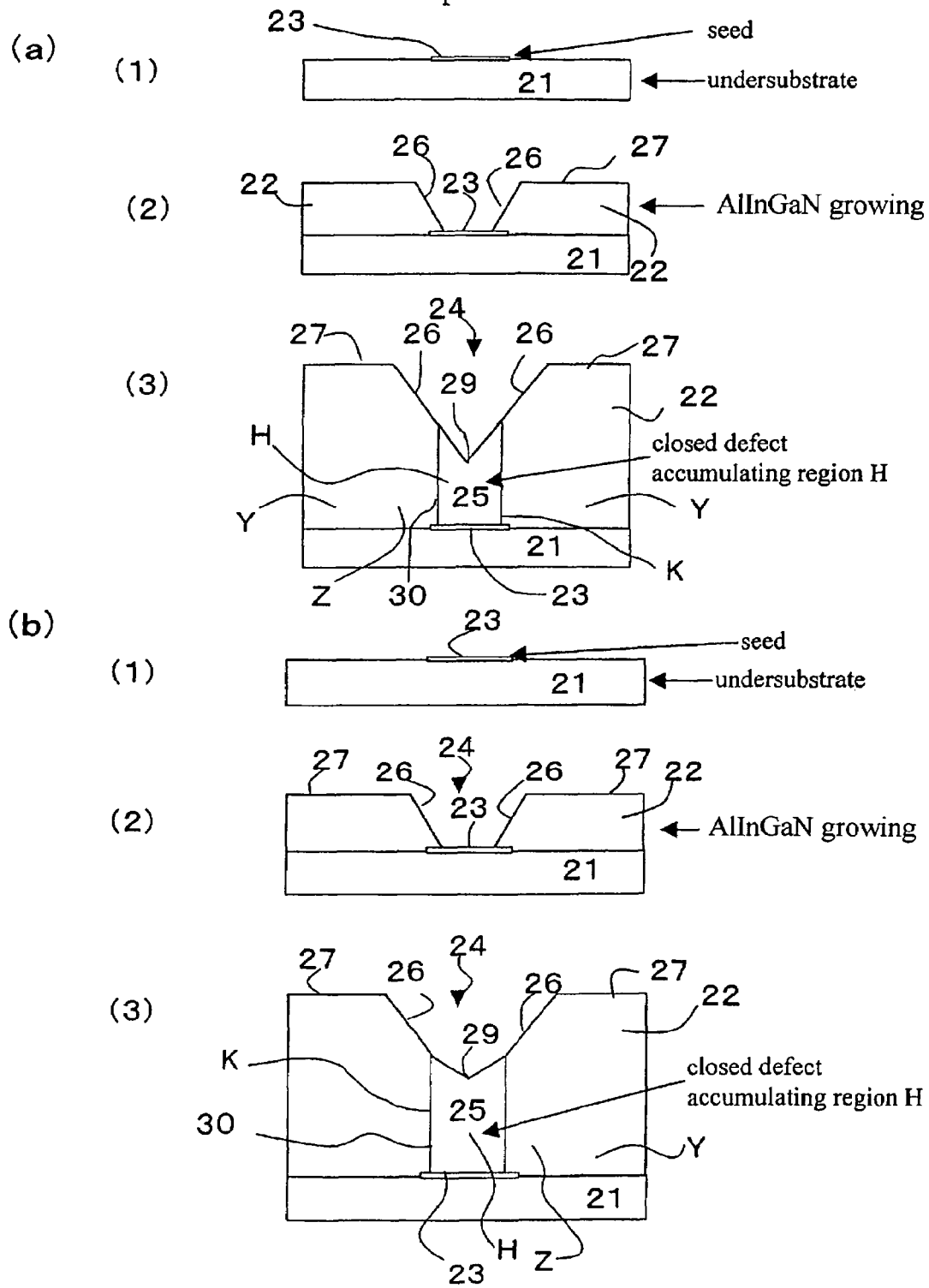
Fig.5 relation between seed and closed defect accumulating region H in the present invention relation between seeds and closed defect accumulating regions H in the present invention seed arrangement six-fold rotational symmetry arrangement on undersubstrate Fig.9 four-fold rotational arrangement on undersubstrate two-fold rotational symmetry arrangement on undersubstrate Fig.11 Embodiment 1
Processes of producing an AlGaN substrate Fig. 12 Embodiment 2
Processes of producing an InGaN substrate Embodiment 4

Sample A (Embodiment 1)

Embodiment 5

Sample E (Embodiment 2)

Embodiment 6

Sample M (Embodiment 3)

$Al_xIn_yGa_{1-x-y}N$ MIXTURE CRYSTAL SUBSTRATE, METHOD OF GROWING SAME AND METHOD OF PRODUCING SAME

RELATED APPLICATIONS

This application is a divisional of Ser. No. 11/041,202, filed Jan. 25, 2005 now U.S. Pat No. 7,105,865, which is a continuation-in-part of Ser. No. 10/700,495, filed Nov. 5, 2003, now U.S. Pat. No. 7,112,826 which is a divisional of Ser. No. 10/246,559, filed Sep. 19, 2002, now U.S. Pat. No. 6,667,184, which claims priority of Japanese Patent application Nos. 2001-284323, filed Sep. 19, 2001 and 2002-230925, filed Aug. 8, 2002, the contents of which are herewith incorporated by reference.

BACKGROUND OF THE INVENTION

Field of the Invention

This invention relates to an aluminum indium gallium nitride ($Al_xIn_yGa_{1-x-y}N$: $0 \leq x \leq 1$, $0 \leq y \leq 1$, $0<x+y \leq 1$) mixture crystal substrate for producing ultraviolet, blue light emitting diodes (LEDs) and ultraviolet, blue light laser diodes (LDs) composed of group 3-5 nitride type semiconductors, a method of growing an aluminum indium gallium nitride ($Al_xIn_yGa_{1-x-y}N$: $0 \leq x \leq 1$, $0 \leq y \leq 1$, $0<x+y \leq 1$) mixture crystal substrate, and a method of producing an aluminum indium gallium nitride ($Al_xIn_yGa_{1-x-y}N$: $0 \leq x \leq 1$, $0 \leq y \leq 1$, $0<x+y \leq 1$) substrate.

This application claims the priority of Japanese Patent Applications No. 2001-284323 filed on Sep. 19, 2001 and No. 2002-230925 filed on Aug. 8, 2002, which are incorporated herein by reference.

A substrate means a thick freestanding base plate on which thin films are grown. A substrate should not be confused thin films of similar components. The scope of component ratios of the $Al_xIn_yGa_{1-x-y}N$ mixture crystals of the present invention is defined by mixture parameters x and y. Designated ranges are $0 \leq x \leq 1$, $0 \leq y \leq 1$ and $0<x+y \leq 1$. When $x=0$, $Al_xIn_yGa_{1-x-y}N$ means $In_yGa_1-yN$ (0y1; abbr. InGaN). No prior art of making InGaN substrates was found. When $y=0$, $Al_xIn_yGa_{1-x-y}N$ means $Al_xGa_{1-x}N$ (0x1; abbr, AlGaN). No prior art of making AlGaN substrates was found yet by the applicants. The third inequality $0<x+y \leq 1$ forbids the case that x and y simultaneously take 0value ($x=0$ and $y=0$). Thus GaN is excluded from the collective expression of $Al_xIn_yGa_{1-x-y}N$ ($0 \leq x \leq 1, 0 \leq y1, 0<x+y \leq 1$) of the present invention. GaN lies out of the scope of the present invention. When x and y are not zero, $Al_xIn_yGa_{1-x-y}N$ is sometimes abbreviated to AlInGaN. No prior art of producing AlInGaN substrates was found The bandgap energy Eg of a semiconductor is proportional to an inverse of the wavelength λ of light which is absorbed or emitted from the semiconductor. A simple inverse relation λ (nm)=1239.8/Eg(eV) holds between Eg and λ. Gallium nitride has a bandgap of 3.2 eV. Emission or absorption light wavelength is 387 nm for GaN. Aluminum nitride AlN has a high bandgap energy Eg=6.2 eV. Emission or absorption light wavelength is 200 nm for AlN. Indium nitride (InN) has a low bandgap energy of Eg=0.9 eV. Emission or absorption light wavelength is 13370 nm for InN. If a light emitting devices having a light receiving layer composed by aluminum indium gallium nitride $Al_xIn_yGa_{1-x-y}N$ were produced, the devices could produce various light having a wide range wavelength between 200 nm and 1300 nm. However such devices relying upon nitride semiconductors have not been made yet. The reason why such nitride semiconductor devices have not been made is that no pertinent substrates are available. A light emitting devices (light emitting diodes or laser diodes) are made by preparing a substrate wafer, growing several semiconductor thin films on the substrate, etching some regions of some films, doping with dopants and forming electrodes. The substrate is a starting material. The lattice constant of aluminum nitride (AlN) is 0.3112 nm. The lattice constant of gallium nitride (GaN) is 0.3189 nm. The lattice constant of indium nitride (InN) is 0.3545 nm. Sapphire ($\alpha$-$Al_2O_3$) which has been used as a substrate of InGaN-type blue ray LEDs is not a promising candidate for AlInGaN devices. Sapphire is insulating and uncleavable. Sapphire is not a promising candidate for producing nitride semiconductor devices thereon. Nitride semiconductor substrates would be preferable to sapphire as substrates for making nitride light emitting devices.

Among simple nitride compounds GaN, InN and AlN, only GaN substrates can now be produced by strong efforts of the applicants. But nobody has succeeded in producing InN substrates or AlN substrates of good quality. Neither InN substrates nor AlN substrates are available at present.

If indimu nitride (InN) films were epitaxially grown on an obtainable GaN substrate, large lattice misfit would induce a lot defects and strong stress in the InN films. If aluminum nitride AlN films were grown on an obtainable GaN substrate, the AlN film would be plagued with many defects. Thus GaN wafer is not a pertinent candidate for the substrate of making $Al_xIn_yGa_{1-x-y}N$ films.

The most suitable substrate for making $Al_xIn_yGa_{1-x-y}N$ ($0 \leq x \leq 1$, $0 \leq y \leq 1$, $0<x+y \leq 1$ films is an $Al_xIn_yGa_{1-x-y}N$: $0 \leq x \leq 1, 0 \leq y \leq 1, 0<x+y \leq 1$ substrate having the same values of x and y as the epitaxial films. If an $Al_xIn_yGa_{1-x-y}N$ ($0 \leq x \leq 1$, $0 \leq y \leq 1$, $0<x+y \leq 1>$ were obtainable, $Al_xIn_yGa_{1-x-y}N$ films would be grown homoepitaxially on the $Al_xIn_yGa_{1-x-y}N$ substrate.

The purpose of the present invention is to provide an $Al_xIn_yGa_{1-x-y}N$: $0 \leq x \leq 1$, $0 \leq y \leq 1$, $0<x+y \leq 1$ mixture crystal substrates and a method of producing $Al_xIn_yGa_{1-x-y}N$: $0 \leq x \leq 1$, $0 \leq y \leq 1$, $0<x+y \leq 1$ mixture crystal substrates.

DESCRIPTION OF RELATED ART

No prior art of $Al_xIn_yGa_{1-x-y}N$: $0 \leq x \leq 1$, $0 \leq y \leq 1$, $0<x+y \leq 1$ mixture crystal substrates has been found. There are several references about the method of making GaN substrates contrived by the inventors of the present invention. Although $Al_xIn_yGa_{1-x-y}N$: $0 \leq x \leq 1, 0 \leq y \leq 1, 0<x+y \leq 1$ does not include GaN, some GaN-related documents are now described instead of $Al_xIn_yGa_{1-x-y}N$ substrates.

The inventors of the present invention contrived a GaAs-based epitaxial lateral overgrowth method (ELO) for making low-dislocation GaN crystals by preparing a GaAs substrate, making an ELO mask having many small regularly-populated windows on the GaAs substrate, and growing GaN films by a vapor phase growing method on the ELO-masked GaAs substrate. The inventors had filed a series of patent applications based on the GaAs-based ELO methods for making GaN crystal bulks.

① Japanese Patent Application No. 9-298300
② Japanese Patent Application No. 10-9008
③ Japanese Patent Application No. 10-102546
(①, ② and ③ have been combined into a PCT application of WO 99/23693.)
④ Japanese Patent Application No. 10-171276
⑤ Japanese Patent Application No. 10-183446

The ELO method makes a thin GaN film on an undersubstrate by forming a mask layer (SiN or SiO2) on the undersubstrate, etching small dots aligning in a small regular pattern of an order of micrometers on the mask, forming regularly aligning small windows, growing a GaN layer on exposed undersubstrate in the windows in vapor phase, making dislocations running upward in a vertical direction at an early stage, turning the dislocations in horizonal directions, inducing collisions of dislocations and reducing dislocations by the collision. The ELO method has an advantage of reducing dislocations by the twice changes of the extending direction of the dislocations. The ELO method enabled the inventors to make a thick (about 100 μm) GaN single crystal.

⑥ Japanese Patent Laying Open No. 2001-102307 (Japanese Patent Application No. 11 -273882)

GaN facet growth was proposed in the document ⑥ by the same inventors as the present invention. All the known GaN growing methods had been C-plane growth which maintained a smooth, flat C-plane as a surface of c-axis growing GaN. ⑥ denied the conventional C-plane growth and advocated a new idea of facet growth which grows GaN, makes facets on a growing GaN, forms pits of the facets, maintains the facets and pits without burying pits, pulling dislocations into the facets, attracts the dislocations into-the pits, reduces dislocations outside of the pit bottoms and obatains low dislocation density GaN crystals.

FIG. 1 to FIG. 3 show our previous facet growth of GaN. FIG. 1 is an enlarged view of a facet pit on a surface of a GaN crystal during the facet growth. In FIGS. 1($a$) and ($b$), a GaN crystal 2 is growing in a c-axis direction in average. The GaN crystal 2 has a C-plane top surface 7. Crystallographical planes inclining to the C-plane are called facets 6. The facet growth forms facets 6 and maintains the facets 6 without burying facets. In the example of FIG. 1, six facets 6 appear and form a polygonal reverse cone pit 4 dug on the C-plane surface 7. The pits 4 built by the facets 6 are hexagonal cones or dodecagonal cones. Hexagonal pits 4 are formed by six-fold rotation symmetric facets 6 of either $\{11-2m\}$ or $\{1-10m\}$ (m: integer). Dodecagonal pits are composed of $\{11-2m\}$ and $\{1-10m\}$ (m: integer). Although FIGS. 1($a$) and ($b$) show the hexagonal pit, dodecagonal pits appear prevalently.

To form facet pits, to maintain pits and not to bury pits are the gist of the facet growth. A facet 6 moves in a direction normal to the facet 6. A dislocation extends along a growing direction. A dislocation extending along a c-axis and attaining the facet turns an extending direction in a horizontal direction parallel to the facet and reaches a crossing line 8. The crossing lines 8 include many dislocations. As the top surface 7 moves upward, the dislocations gathering on the crossing lines 8 make defect gathering planes which meet with each other at 60 degrees. Planar defect assemblies 10 are formed below the crossing lines 8 ((FIG. 1($b$)). The planar defect assemblies 10 are a stable state. Some dislocations attaining to the crossing lines 8 turn an extending direction again inward, move inward along the rising slanting crossing lines 8 and fall into a multiple point D (FIG. 2) at a pit bottom. Dislocations substantially run inward in the horizontal directions. A linear defect assembly 11 is formed along the multiple point D at the bottom of the pit. The linear defect assembly 11 is less stable than the planar defect assemblies 10. FIG. 3 (1) demonstrates the function of the facet pit gathering dislocations. A C-plane surface 17 has a facet pit 14 composed of facets 16. When the C-plane surface 17 and the facets 16 rise, dislocations are attracted into the facet pit 14, pulled into the bottom of the pit 14 and captivated into a bundle 15 of dislocations at the bottom of the pit 14. But the bundle 15 of dislocations is not everlasting. The dislocations once gathering to the bottom again disperse outward. Then dislocations are released. FIG. 3 (2) demonstrates dispersion of dislocations 15 in radial directions into the surrounding portions 12. The dislocation density rises again in the surroundings of the pits. ⑥ was still incopentent to make thick low dislocation AlInGaN crystals.

SUMMARY OF THE INVENTION

This invention proposes a method of making $Al_xIn_yGa_{1-x-y}N$ ($0 \leq x \leq 1, 0 \leq y \leq 1, 0 < x+y \leq 1$) mixture crystal substrates of low dislocation density for the first time. The expression of $Al_xIn_yGa_{1-x-y}N$ includes InN (x=0), AlN (y=0) but excludes GaN (x+y=0). An $Al_xIn_yGa_{1-x-y}N$ having a high x and high bandgap energy has a probability for a starting substrate of making ultraviolet ray LEDs or LDs. Another $Al_xIn_yGa_{1-x-y}N$ having a high y has low bandgap energy has another probability for a substrate of making new infrared LEDs or LDs in stead of prevalent InGaAsP type LEDs or LDs. There are no prior art for making thick $Al_xIn_yGa_{1-x-y}N$ mixture crystal substrates as explained before.

This invention produces low dislocation density $Al_xIn_yGa_{1-x-y}N$ mixture crystal substrate by preparing an undersubstrate, forming regularly allotted dotted masks on the undersubstrate, growing $Al_xIn_yGa_{1-x-y}N$ mixture crystal, forming facet pits and closed defect accumulating regions above the dotted masks, attracting dislocations via the facets into the defect accumulating regions, arresting the dislocations in the defect accumulating regions (H) and reducing dislocation density in other regions except the defect accumulating regions (H). The present invention succeeds in making the best use of the seeds pre-formed on a substrate, the closed defect accumulating regions (H) followed by the seeds and the facet growth induced by the seeds. The facet growth minimizes dislocation density of the regions in growing $Al_xIn_yGa_{1-x-y}N$ crystal except the closed defect accumulating regions (H) by sweeping many dislocations into the bottoms of facet pits. The closed defect accumulating regions (H) hold many dislocations captive. The seed-defined closed defect accumulating regions (H) and the facet growth enable us to make low dislocation density $Al_xIn_yGa_{1-x-y}N$ mixture crystals.

The size of a mask dot ranges from 1 μm to 200 μm. Diameters of 20 μm to 70 μm are more suitable for the masks. The spatial period of mask dots should be 50 μm to 2000 μm. The material of the dotted masks is SiN, SiO2, W or Pt. SiN and SiO2 are preferable. The undersubstrate is a single crystal plate of GaAs, sapphire, SiC or Si. The mask dot patterns should be three-fold rotation symmetric, four-fold rotation symmetric or six-fold symmetric patterns.

The present invention succeeds in producing a low-dislocation $Al_xIn_yGa_{1-x-y}N$ mixture crystal substrate by controlling the positions of the closed defect accumulating regions (H) which gather the dislocations from other regions by implanting seeds on a starting substrate in accordance with designed patterns having some regularity. The $Al_xIn_yGa_{1-x-y}N$ substrate crystal made by the present invention is a low-dislocation single crystal in Z and Y except the definite small regions (closed defect accumulating regions (H)). The present invention can supply low-defect density $Al_xIn_yGa_{1-x-y}N$ mixture crystal substrates. $Al_xIn_yGa_{1-x-y}N$ mixture crystal substrate wafers are best for making light emitting diodes (LEDs) or laser diodes (LDs) having wavelengths between 200 nm and 1300 nm.

Vapor phase growing methods for growing aluminum indium gallium nitride ($Al_xIn_yGa_{1-x-y}N$) applicable for the present invention include an HVPE method, an MOCVD method and an MOC method. These methods are all inherently used for making very thin films of $Al_xIn_yGa_{1-x-y}N$ of about 0.1 μm to 1 μm. The present invention applies these methods to making a very thick bulk crystal of $Al_xIn_yGa_{1-x-y}N$ of an order of a 1000 μm thickness. Such a thick crystal should be called an $Al_xIn_yGa_{1-x-y}N$ "substrate" for discriminating it from a thin film of an order of 1 μm. For avoiding confusion, a starting plate for growth is often called an "undersubstrate" till now.

1. HVPE (Hydride Vapor Phase Epitaxy) Method

Aluminum source is metal aluminum which is stored in an Al-boat. Indium source is metal indium which is contained in an In-boat. Gallium source is metal gallium (Ga) which is included in a Ga-boat. HCl gas converts Al into AlCl3 gas. HCl gas makes GaCl as from metal Ga. HCl gas produces InCl gas from metal In. Instead of metallic aluminum, $AlCl_3$ gas can be used. Nitrogen source is ammonia ($NH_3$). An HVPE apparatus has a hot-wall furnace, heaters enclosing the furnace, $H_2$—, HCl—, $NH_3$— gas inlets formed at the top, In—, Al—, and Ga-boats positioned at higher spots in the furnace, a susceptor installed at a lower level in the furnace, a vacuum pump and material gas ($H_2$, $NH_3$, HCl) supplying tubes. An undersubstrate is put on the susceptor. Metal Ga, metal Al and metal In are supplied into the Ga-boat, Al-boat and In-boat. The heater heats the Al, Ga, In metals in the boats and the undersubstrate on the susceptor. A mixture gas of hydrogen ($H_2$) and hydrochloric acid (HCl) is supplied to the heated Al—, In—, Ga-boats for synthesizing AlCl3, InCl and GaCl. AlCl3, InCl, and GaCl gases are conveyed downward to the undersubstrate on the heated susceptor. Another mixture of hydrogen ($H_2$) and ammonia ($NH_3$) is supplied to the heated undersubstrate for making aluminum indium gallium nitride (AlInGaN) by a set of reactions of $InCl+NH_3 \rightarrow InN+3HCl$, $GaCl+NH_3 \rightarrow InN+HCl+H_2$ and $GaCl+NH_3 \rightarrow GaN+HCl+H_2$. Synthesized AlInGaN is piled upon the undersubstrate for producing a thick AlInGaN film. The HVPE has an advantage of being immune from carbon contamination, since the Al—, In—, Ga-sources are Ga—, In—, and Ga-metals which include no carbon and make $AlCl_3$, InCl, and GaCl as intermediate compounds.

2. MOCVD (Metallorganic Chemical Vapor Deposition) Method

Materials of Al, In and Ga and dopants are organic metal gases including carbon. For example, materials are trimethylaluminum (TMA), trimethylindium (TMI) trimethylgallium (TMG), triethylindium (TEI), triethylgallium (TEG) and so on. Thus, this method is called "metallorganic". Material of nitrogen is ammonia gas (NH3). The MOCVD method uses a cold-wall furnace having gas inlets, a susceptor for holding an undersubstrate and a heater for heating the susceptor.

3. MOC (Metallorganic Chloride) Method

The MOC method employs Al—, In— Ga-including metallorganic compounds (e.g., trimethylaluminum, trimethylindium, trimethylgallium) as Al, In, Ga materials like the MOCVD. The nitrogen material is ammonia ($NH_3$) gas. Unlike the MOCVD, TMA, TMI and TMG do not react with ammonia ($NH_3$). In a hot wall type furnace, TMA, TMI and TMG react with HCl gas for synthesizing $AlCl_3$, InCl, GaCl. Vapors $AlCl_3$, InCl and GaCl fall toward a heated substrate on a susceptor. The substrate is supplied with ammonia gas. $AlCl_3$, InCl and GaCl react with ammonia for making AlInGaN. $Al_xIn_yGa_{1-x-y}N$ piles upon the substrate and makes a thick $Al_xIn_yGa_{1-x-y}N$ film. The use of the metallorganic compounds s(TMA, TMI, TMG) may induce contamination by carbon. However, this method can absorb material gasses higher efficiently than the MOCVD method.

BRIEF DESCRIPTION OF THE DRAWINGS

FIG. 1(a) is a partial perspective view of a facet pit occurring on a GaN surface in the facet growth proposed by previous Japanese Patent Laying Open No. 2001-102307 for showing that facets growing inward sweep dislocations to crossing lines, the rising crossing lines convey inward the dislocations and dislocations are converged at the bottom of the pit.

FIG. 1(b) is a partial perspective view of a facet pit on the GaN surface after continual facet growth proposed by previous Japanese Patent Laying Open No. 2001-102307 for showing that strong repulsion among the dislocations releases dislocations and forms hexagonal symmetric radial planar defects dangling from the pit.

FIG. 3(1) is a sectional view of a facet pit occurring on a GaN surface in the facet growth proposed by previous Japanese Patent Laying Open No. 2001-102307 for showing that facets grow in inward directions different from an average growing direction (c-axis), the inward growing facets sweep dislocations to crossing lines, the rising crossing lines carry the dislocations inward in parallel with a C-plane, the converged dislocations form a bundle of dislocations at a multiple point at the pit bottom.

FIG. 3(2) is a sectional view of a facet pit occurring on an GaN surface in the facet growth proposed by previous Japanese Patent Laying Open No. 2001-102307 for showing that the bottom dislocation bundles are not closed and the once converged dislocations diffuse outward from the pit bottom by repulsion acting among dislocations during the growth.

FIG. 4(1) is a sectional view of a facet pit occurring on an $Al_xIn_yGa_{1-x-y}N$: ($0 \leq x \leq 1, 0 \leq y \leq 1, 0 < x+y \leq 1$) surface in the facet growth proposed by the present invention for showing that facets grow in inward directions different from an average growing direction (c-axis), the inward growing facets sweep dislocations to crossing lines, the rising crossing lines carry the dislocations inward in parallel with a C-plane, the facet pit makes a closed defect accumulating region (H) at the bottom and the converged dislocations are accumulated in the closed defect accumulating region (H).

FIG. 4(2) is a sectional view of a facet pit occurring on an $Al_xIn_yGa_{1-x-y}N$ surface after the facet growth proposed by the present invention for showing that dislocations once accumulated in the closed defect accumulating region (H) do not escape from the closed defect accumulating region (H).

FIG. 5(a) is a series of sectional figures showing a method of growing an $Al_xIn_yGa_{1-x-y}N$ mixture crystal of the present invention by implanting a seed on an undersubstrate (1), growing an $Al_xIn_yGa_{1-x-y}N$ crystal on the seeded undersubstrate on the condition of facet growth, making a simpler one-step pit composed of facets (2), inducing a closed defect accumulating region (H) between the seed and a pit bottom, forming an accompanying low dislocation single crystal region (Z) surrounding the closed defect accumulating region (H) under the facets, and producing an extra low dislocation single crystal region (Y) under a C-plane top surface (3).

FIG. 5(b) is a series of sectional figures showing a method of growing an $Al_xIn_yGa_{1-x-y}N$ mixture crystal of the present invention by implanting a seed on an undersubstrate (1), growing an $Al_xIn_yGa_{1-x-y}N$ mixture crystal on the seeded undersubstrate on the condition of facet growth, making a two-step pit composed of facets (2), inducing a closed defect accumulating region (H) between the seed and a pit bottom, forming an accompanying low dislocation single crystal region (Z) surrounding the closed defect accumulating region (H) under the facets, and producing an extra low dislocation single crystal region (Y) under a C-plane top surface (3).

FIG. 11(b) is a plan CL (cathode luminescence) view of an $Al_xIn_yGa_{1-x-y}N$ mixture crystal substrate composed of fundamental units having H, Z and Y aligning in the two-fold rotation symmetry pattern with the shortest pitch direction parallel to a <1-100> direction.

FIG. 11(1) is a section of the prepared undersubstrate. FIG. 11(2) is a section of the undersubstrate coated with the $Al_{0.8}Ga_{0.2}N$ epi-layer. FIG. 11(3) is a section of the seed implanted $Al_{0.8}Ga_{0.2}N$ epi-layer on the undersubstrate. FIG. 11(4) is a CL-observed section of a thick $Al0.8Ga_{0.2}N$ mixture crystal substrate with H, Z and Y grown on the seed implanted $Al_{0.8}Ga_{0.2}N$ epi-layer. FIG. 11(5) is a CL-observed section of the polished $Al_{0.8}Ga_{0.2}N$ mixture crystal.

FIG. 12(1) is a section of the prepared undersubstrate. FIG. 12(2) is a section of the undersubstrate coated with the $In_{0.9}Ga_{0.1}N$ epi-layer. FIG. 12(3) is a section of the seed implanted $In_{0.9}Ga_{0.1}N$ epi-layer on the undersubstrate. FIG. 12(4) is a CL-observed section of a thick $In_{0.9}Ga_{0.1}N$ mixture crystal substrate with H, Z and Y grown on the seed implanted $In_{0.9}Ga_{0.1}N$ epi-layer. FIG. 12(5) is a CL-observed section of the polished $In_{0.9}Ga_{0.1}N$ mixture crystal.

FIG. 13(1) is a section of the undersubstrate implanted by the seeds. FIG. 13(2) is a CL-observed section of a thick $Al_{0.3}In_{0.3}Ga_{0.4}N$ mixture crystal substrate with H, Z and Y grown on the seed implanted undersubstrate. FIG. 13(3) is a CL-observed section of the polished $Al_{0.3}In0.3Ga_{0.4}N$ mixture crystal.

DETAILED DESCRIPTION OF THE PREFERRED EMBODIMENTS

Figure 2:
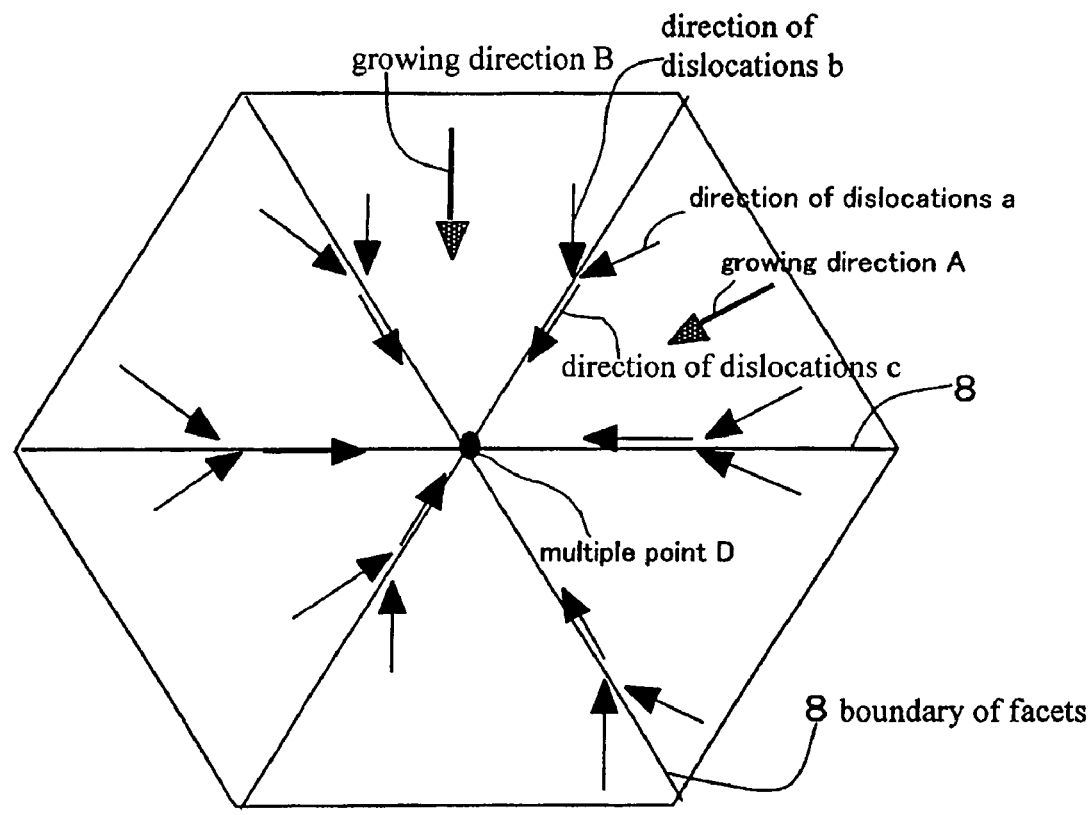
FIG. 2 is a plan view of a facet pit occurring on a GaN surface in the facet growth proposed by previous Japanese Patent Laying Open No. 2001-102307 for showing that facets grow in inward directions (B) different from an average growing direction (c-axis), the inward growing facets sweep dislocations to crossing lines and a multiple point D at the pit bottom accumulates high density dislocations.

The present invention makes a low dislocation density $Al_xIn_yGa_{1-x-y}N$ ($0 \leq x \leq 1$, $0 \leq y \leq 1$, $0 < x+y \leq 1$, abbr. "AlInGaN") mixture crystal substrate by preparing an undersubstrate, depositing dotted masks on the undersubstrate, growing an $Al_xIn_yGa_{1-x-y}N$ mixture crystal, making facets following the dotted masks, maintaining facets and facet pits on a surface, making closed defect accumulating regions (H) following pit bottoms, accumulating/annihilating dislocations at boundaries (K) of the closed defect accumulating regions (H) and decreasing dislocations in the surrounding single crystal regions.

Otherwise, the present invention makes a low dislocation density $Al_xIn_yGa_{1-x-y}N$ GaN mixture crystal substrate by preparing an undersubstrate, depositing dotted masks on the undersubstrate, growing an $Al_xIn_yGa_{1-x-y}N$ mixture crystal, making facets following the dotted masks, maintaining facets and facet pits on a surface, making closed defect accumulating regions (H) following pit bottoms, accumulating/annihilating dislocations at boundaries (K) and cores (S) on the closed defect accumulating regions (H) and decreasing dislocations in the surrounding single crystal regions.

A practical method contains the steps of preparing an undersubstrate, depositing dotted masks on the undersubstrate, growing an $Al_xIn_yGa_{1-x-y}N$ mixture crystal, making pits composed of facets, growing an $Al_xIn_yGa_{1-x-y}N$ crystal on a condition of keeping facet growth, maintaining a surface covered with facet pits, keeping closed defect accumulating regions (H) at bottoms of the facet pits, assembling dislocations into the closed defect accumulating regions (H) and reducing dislocations in the surrounding single crystal parts (accompanying low dislocation single crystal regions (Z) and extra low dislocation single crystal regions (Y)).

This is the gist of the present invention. Accidental formation of the facet pits is still insufficient for the present invention. What is essential in the present invention is the formation of the closed defect accumulating regions (H) following the bottoms of the pits and following the dotted masks precoated on the undersubstrate. Namely a set of a pit bottom, a closed defect accumulating region (H) and a mask dot align on a vertical line. The positions of the closed defect accumulating regions (H) are predetermined by the pattern of the dotted masks. A closed defect accumulating region (H) consists of an inner part (core (S)) and a surface (crystal boundary (K)) which is assemblies of defects (dislocations). The region (H) is closed by the boundary (K). The closed state is an important attribute of the closed defect accumulating regions (H). The boundary (K) or both the boundary(K) and the core (S) have the function of reducing dislocation density of the other parts by attracting, absorbing, annihilating and accumulating dislocations. The closed defect accumulating regions (H) are yielded at the bottoms of the pits in the present invention. The facet pit bottoms follow the dotted masks on the undersubstrate. Thus the closed defect accumulating region (H) extends from the mask dots on the undersubstrate. The pits make the closed defect accumulating regions (H). Pits are indispensable. Without pits, no closed defect accumulating region (H) happens. The reverse is not necessarily true. There are some pits without carrying closed defect accumulating regions (H). Such a pit called here a vacant pit. The vacant pits are useless.

Strictly speaking, the "surrounding other portion" outside of (H) can be classified into two portions. One is an inner portion which has been made by the facet growth and exists just beneath the facet pits. The other is an outer portion which has been made by the C-plane growth and exists under the C-plane surface out of the facet pits. The former inner portion accompanies the closed defect accumulating regions (H) in contact. The inner portion is a single crystal with low dislocation density. The inner portion has lower electric resistivity. Then, the inner portion covered with the pits is here named an "accompanying low dislocation single crystal region (Z)". The latter outer flat portion is an extra region outside of Z and H. The outer portion is a single crystal with low dislocation density. The outer portion has higher electric resistivity. Thus, the outer portion is here named an "extra low dislocation single crystal region (Y)".

The most important region is the closed defect accumulating regions (H). The closed defect accumulating regions (H) play a useful role of converting the accompanying low dislocation single crystal regions (Z) and the extra low dislocation single crystal regions (Y) into single crystals of low dislocation density. The closed defect accumulating regions (H) consist of a boundary (K) and a core (S) (H=K+S). The boundary (K) and the core (S) deprive Z and Y of dislocations. The boundary (K) and the core (S) annihilate a part of the dislocations and store another part of the dislocations in them.

The boundary (K) and the core (S) do not release the once-arrested dislocations. Thus, the closed defect accumulating regions (H) are the most significant, fundamental matter in the present invention.

Why are the facet pits necessary? What is the function of the pits? The next problem is the function of the pits. The pits have two functions. One function is to hold a closed defect accumulating region (H) below the bottom. The closed defect accumulating region (H) follows the pit. The pit bottom leads the closed defect accumulating region (H). The pit makes the closed defect accumulating region (H). Without pit, no closed defect accumulating region (H) would occur. The pit gives life to the closed defect accumulating region (H). The pits are indispensable for the existence of the closed defect accumulating regions (H). However, the reverse is not always true. It is possible for a pit to have no closed defect accumulating region (H). The pit without the closed defect accumulating region (H) is called a "vacant pit" here. The vacant pit is useless. The vacant pit cannot hold the once-arrested dislocations but releases the dislocations, because the vacant pit has no closed defect accumulating region (H) below.

On the contrary, the present invention succeeds in allocating closed defect accumulating regions (H) for all the facet pits by depositing masks on the undersubstrate at the first step. A mask makes a closed defect accumulating region (H) and a facet pit. A mask, a closed defect accumulating region (H) and a pit make a set. The set of a pit bottom, a closed defect accumulating regions (H) and a mask align in the vertical direction. The pits carrying the closed defect accumulating regions (H) are called substantial pits. The present invention makes the substantial pits, induces the closed defect accumulating regions (H) by the substantial pits, and annihilates/accumulates dislocations in the closed defect accumulating regions (H) by the preformed masks.

The pits have another significant function of attracting and sweeping dislocations from the surrounding regions into the bottom closed defect accumulating regions (H). Without slanting planes of the facets, dislocations would extend upward and would not be converged to the pit bottoms. Thus, a pit has a role of maintaining a closed defect accumulating region (H) and another role of gathering and guiding dislocations to the closed defect accumulating region (H).

The rest problem is how to make closed defect accumulating regions (H) at predetermined positions. The key for the problem is a seed. Seed-implantation is an answer for the problem. Seeds are implanted at desired positions on an undersubstrate at an initial step. The seeds implanted on an undersubstrate bear pits and closed defect accumulating regions (H). Thus, the positions of the pits and the closed defect accumulating regions (H) can be exactly determined by the seeds. The most significant idea of the present invention is the implantation of the seeds. Geometrically, regular, periodic seed implantation enables $Al_xIn_yGa_{1-x-y}N$ growth to arrange closed defect accumulating regions (H) regularly, periodically on a growing $Al_xIn_yGa_{1-x-y}N$ surface.

The closed defect accumulating regions (H) in a finished $Al_xIn_yGa_{1-x-y}N$ wafer may not be utilized as an important part of a device chip because of concentrated defects. The rest portions (the accompanying low dislocation single crystal regions (Z) and the extra low dislocation single crystal regions (Y)) are available for important parts (for example, an emission stripe of an LD). If the closed defect accumulating regions (H) dispersed at random on an $Al_xIn_yGa_{1-x-y}N$ wafer, the design of device chips on the $Al_xIn_yGa_{1-x-y}N$ wafer would be very difficult for avoiding the random-distributing closed defect accumulating regions (H).

The seed implantation enables the present invention to predetermine the positions of the accompanying low dislocation single crystal regions (Z) and the extra low dislocation single crystal regions (Y) by making the closed defect accumulating regions (H) at seed implanted positions. Spatial controllability originates from the seed implantation. The present invention features high controllability of the accompanying low dislocation single crystal regions (Z) and the extra low dislocation single crystal regions (Y).

The closed defect accumulating regions (H) is the most significant concept in the present invention. The closed defect accumulating regions (H) require preliminary detailed description. The closed defect accumulating regions (H) do not take a single definite structure but take a variety of crystal structures, that is, polycrystalline ones or single crystalline ones of different orientations. Any closed defect accumulating regions (H) have a function of decreasing dislocations. The present invention relies upon the excellent function of the closed defect accumulating regions (H).

[1. Polycrystalline Closed Defect Accumulating Regions (H)]

A closed defect accumulating region (H) is a polycrystal which contains variously-oriented $Al_xIn_yGa_{1-x-y}N$ grains. In this case, only the closed defect accumulating regions (H) are polycrystalline. Other portions; the accompanying low dislocation single crystal regions (Z) and the extra low dislocation single crystal regions (Y); are all single crystals. The boundary (K) is a poly/single interface.

[2. Single Crystal Closed Defect Accumulating Regions (H)]

A closed defect accumulating region (H) is one or more than one single crystal which has a definite orientation different from the orientation of the surrounding single crystal portions Z and Y. When an $Al_xIn_yGa_{1-x-y}N$ film is grown on average along the c-axis, the surrounding accompanying low dislocation single crystal regions (Z) and extra low dislocation single crystal regions (Y) have a (0001) surface. The closed defect accumulating region (H) has different a-axis, b-axis, d-axis and c-axis.

[3. <0001> Common Single Crystal Closed Defect Accumulating Regions (H)]

A closed defect accumulating region (H) is a single crystal having only a <0001> axis common with the surrounding single crystal regions. When an $Al_xIn_yGa_{1-x-y}N$ grows in a c-axis direction, the surrounding single crystal parts (accompanying low dislocation single crystal regions (Z) and the extra low dislocation single crystal regions (Y)) are single crystals having C-planes (0001) parallel with the surfaces. The closed defect accumulating regions (H) have a c-axis parallel to the c-axis of the other parts Z and Y. The closed defect accumulating regions (H) rotate by a certain angle around the c-axis. The closed defect accumulating region (H) has unique a-, b- and d-axes different from the other single crystal parts Z and Y. Rotation of the closed defect accumulating regions (H) around a c-axis in the reverse direction by the same angle can equalize the closed defect accumulating regions (H) to the other regions in orientation.

[4. Reverse Polarity Single Crystal Closed Defect Accumulating Regions (H)]

A closed defect accumulating region (H) is a single crystal having a <0001> axis antiparallel to the <0001> axis of the surrounding single crystal regions. The polarity is reversed in the closed defect accumulating regions (H). The closed defect accumulating region (H) can be equalized by rotating the c-axis around a horizontal axis at 180°. An $Al_xIn_yGa_{1-x-y}N$ crystal has a polarity due to the lack of inversion symmetry. A (0001) plane surface is a surface having Al, Ga, In atoms. A (000-1) plane surface is a surface having N atoms allover. When the single crystal (H) has a reversed <0001> axis parallel to the <000-1> of the other portions, a boundary is born between the inner single crystal (H) and the surrounding regions (Y, Z). In this case, the closed defect accumulating region (H) can be either a single crystal having a reversed <0001> axis or a polycrystal of grains having a reversed <0001> axis.

[5. Closed Defect Accumulating Regions (H) Shielded by Planar Defects]

Another closed defect accumulating region (H) consists of one or more than one crystal grain which is enclosed and shielded by planar defects from the surrounding single crystal regions Z and Y.

[6. Closed Defect Accumulating Regions (H) Shielded by Linear Defects]

Another closed defect accumulating region (H) consists of one or more than one crystal grain which is enclosed and shielded by linear defects from the surrounding single crystal regions Z and Y.

[7. Same Oriented Closed Defect Accumulating Regions (H) Shielded by Planar Defects]

Another closed defect accumulating region (H) consists of one or more than one crystal grain which has the same orientation as the surrounding single crystal regions Z and Y and is enclosed and shielded by planar defects from the surrounding single crystal regions Z and Y.

[8. Same Oriented Closed Defect Accumulating Regions (H) Shielded by Linear Defects]

Another closed defect accumulating region (H) consists of one or more than one crystal grain which has the same orientation as the surrounding single crystal regions Z and Y and is enclosed and shielded by linear defects from the surrounding single crystal regions Z and Y.

[9. Slightly Slanting Closed Defect Accumulating Regions (H)]

Some of the closed defect accumulating regions (H) are single crystals having an orientation nearly equal but slightly inclining to the orientation of the neighboring single crystal portions Z and Y.

The above are the variations of the orientation of the closed defect accumulating regions (H). Following the description of the orientation, crystallographical defects of the closed defect accumulating regions (H) are described. Closed defect accumulating regions (H) contain, in particular, high density of defects. The closed defect accumulating regions (H) are sometimes polycrystals and sometimes single crystals. Surrounding portions are single crystals. If a closed defect accumulating region (H) is a polycrystal, it is a matter of course that a boundary (K) is formed between the closed defect accumulating region (H) and the surrounding portions. Even if a closed defect accumulating region (H) is a single crystal, many defects are induced around the single crystal closed defect accumulating region (H). Dislocations are conveyed by the facets to the closed defect accumulating regions (H). Linear defect assemblies or planar defect assemblies are made around the closed defect accumulating regions (H). Thus, a single crystal closed defect accumulating region (H) is encapsulated by planar defects assemblies.

[10. Closed Defect Accumulating Regions (H) Encapsulated by Planar Defect Assemblies]

A single crystal closed defect accumulating region (H) contains defects and is encapsulated by planar defects assemblies. The planar defects assemblies shield the closed defect accumulating regions (H) from the surrounding single crystal portions.

[11. Closed Defect Accumulating Regions (H) Encapsulated by Linear Defect Assemblies]

Another single crystal closed defect accumulating region (H) contains defects and is encapsulated by linear defects assemblies. The linear defects assemblies shield the closed defect accumulating regions (H) from the surrounding single crystal portions.

[12. Closed Defect Accumulating Regions (H) Containing Linear Defect Assemblies or Planar Defect Assemblies]

Another single crystal closed defect accumulating region (H) contains plenty of crystalline defects. The defects are mainly linear defect assemblies or planar defect assemblies.

Variations of closed defect accumulating regions (H) have been described. Next problem is the orientations of the crystal growth. An ordinary crystal growth direction is the c-axis direction. Since an $Al_xIn_yGa_{1-x-y}N$ crystal is grown on a foreign material substrate, a three-fold rotation symmetric substrate of a foreign material enables a c-axis growing $Al_xIn_yGa_{1-x-y}N$ crystal to equalize the symmetry with the substrate symmetry. If an $Al_xIn_yGa_{1-x-y}N$ crystal were utilized as a substrate, non-c-axis $Al_xIn_yGa_{1-x-y}N$ growth would be possible. But, no $Al_xIn_yGa_{1-x-y}N$ crystal substrate is available at present. Then, the present invention is applied mainly to the $Al_xIn_yGa_{1-x-y}N$ c-axis growth.

The c-axis facet growth which maintains facets makes facet pits of reverse dodecagonal cones or reverse hexagonal cones. Hexagonally symmetric $Al_xIn_yGa_{1-x-y}N$ has six nearly-equivalent slanting planes around the c-axis. Commutating h, k and m of (hkmn) plane produces six nearly equivalent planes. The equivalent six planes (facets) form a hexagonal cone pit. FIG. 1 shows a hexagonal conical pit born by the facet growth on a top surface (C-plane) 7.

An average growing direction is the c-axis direction. But on the facets 6, an $Al_xIn_yGa_{1-x-y}N$ crystal 2 grows inward as indicated by inward slanting arrows 9. If two sets of equivalent six slanting planes (facets) 6 cooperate, a reverse dodecagonal conical pit 4 appears.

Most of the facets 6 appearing on the surface 7 can be designated by {kk-2kn} planes (k, n; integer) or {k-k0n} planes (k, n; integer). One set of six planes of facets meets with each other at 60 degrees. The other set of six planes of facets meets with each other at 60 degrees. One set differs from the other set by 30 degrees. Twelve planes of facets form a dodecagon having a thirty degree outer crossing angle, if two sets have an equivalent power. When one set is influential, a hexagonal pit is formed.

{11-22} and {1-101} are the most prevailing facets appearing on the surface. Sometimes hexagonal reverse cone pits of {11-22} or {1-101} appear. Sometimes reverse dodecagonal cone pits of {11-22} and {1-101} are formed.

The facet pits are sometimes double-stepped pits which are constructed by a first reverse hexagon or dodecagon and a second reverse hexagon or dodecagon which incline at different angles to the vertical direction. For example, {11-22} planes and {11-21} planes which have different slanting angles are contained in a facet pit. Otherwise, {1-101} planes and {1-102} planes which have different slanting angles coexist in a facet pit. Steeper facets which have smaller n (c-index) build a higher bigger pit. Milder slanting facets which have bigger n (c-index) construct a lower smaller pit. The upper bigger facets are followed by the accompanying low dislocation single crystal regions (Z). The lower smaller facets are followed by the closed defect accumulating regions (H).

The relation between the closed defect accumulating regions (H) and the facets is described here. The inventors found a definite relation between the Miller indices of the facets and the closed defect accumulating regions (H). The closed defect accumulating regions (H) follow the bottoms of the facet pits. The tops of the closed defect accumulating regions (H) have planes of different indices from the indices of the upper facets. As mentioned earlier, almost all of the facets in the pits have Miller indices of {11-22} or {1-101}.

However, the tops of the closed defect accumulating regions (H) which are identical to the pit bottoms have inclinations slightly smaller, shallower than the facets. FIG. 5(b) (3) shows double-inclination pits. A smaller inclination means a bigger n (c-axis index). Namely for example, {11-24}, {11-25}, {11-26}, {1-102} or {1-104} planes appear on the bottom of the pits. When the pit bottoms are buried with $Al_xIn_yGa_{1-x-y}N$, the bottoms are included into the closed defect accumulating regions (H). An interface between the closed defect accumulating regions (H) has slanting planes of slanting angles smaller than the higher facets. A reverse polarity closed defect accumulating region (H) which has a <0001> axis reverse to the <0001> axis of the other single crystal regions (Z) and (Y) grows with a smaller inclination facets. In this case of the reverse polarity closed defect accumulating region (H), the smaller inclination facets are composed of {11-2-4}, {11-2-5}, {11-2-6}, {1-10-2}, {1-10-3}, and {1-10-4}. The smaller inclination facets are buried and affiliated into the closed defect accumulating region (H) with the proceeding growth. Then, the closed defect accumulating region (H) has planes of a larger fourth index n. The boundary (K) of the closed defect accumulating region (H) at the bottom of the facet pit has a top edge which coincides with a border between the pit facets and the smaller inclination facets. The coincidence frequently appears for the reverse polarity closed defect accumulating regions (H) which have a <0001> axis antiparallel to the <0001> axis of the neighboring single crystal regions. It is an important discovery that inclinations of lower parts of the pit facets are milder than the pit facets.

The closed defect accumulating region (H) following the facet pit exists as a dot. The dotted H means that the closed defect accumulating region (H) is assembled neither into a line nor into a donut but into an isolated dot. For example, black spots at the centers of the concentric circles in FIG. 7 indicate the closed defect accumulating regions (H). The closed defect accumulating region (H) is converged into a small dot. The converged, dotted closed defect accumulating regions (H) give the present invention an advantage of reducing the probability of occurrence of collision of cleavage planes with the closed defect accumulating regions (H) when an $Al_xIn_yGa_{1-x-y}N$ wafer is cleaved.

The converged closed defect accumulating regions (H) facilitate the cleavage of the $Al_xIn_yGa_{1-x-y}N$ wafer of the present invention and allow this invention to make the best use of the cleavage planes for slicing individual devices and for forming resonators of laser diodes.

Facet growth should maintain the diameter of the closed defect accumulating regions (H) following the pit bottoms within a range from 1 μm to 200 μm.

When the facet pit have a smaller diameter, a smaller diameter is preferable for the closed defect accumulating region (H) following the pit.

When the facet pit have a larger diameter, a larger diameter is preferable for the closed defect accumulating region (H) following the pit. Practically, at the lowest limit, a 1 μm diameter closed defect accumulating region (H) has an effect for suppressing dislocations. At the highest limit, economical consideration allows 200 μm diameter closed defect accumulating regions (H).

A horizontal sectional shape of the closed defect accumulating regions (H) following the facet pits is sometimes amorphous. Energetic instability due to the defects distorts the closed defect accumulating regions (H).

A horizontal sectional shape of the closed defect accumulating regions (H) is sometimes circular. Circular sectioned closed defect accumulating regions (H) frequently appear in the case of a polycrystal H containing many grains or a single crystal H of a large diameter.

Another horizontal sectional shape of the closed defect accumulating regions (H) is sometimes polygonal. Polygonal sectioned closed defect accumulating regions (H) frequently appear in the case of a polycrystal H containing few grains or a single crystal H of a small diameter.

When an average growing direction is a c-axis direction, polycrystal regions are formed at bottoms of facet pits on a growing surface. The polycrystal regions are columns extending in parallel to the c-axis.

The polycrystalline region (a closed defect accumulating region (H)) has a dynamics of gathering dislocations centripetally extending in horizontal directions from the surrounding single crystal portions (Z+Y), annihilating a part of the gathered dislocations, accumulating the other part of the gathered dislocations into a boundary (K) between the closed defect accumulating region (H) and the surrounding single crystal portions (Z+Y), and reducing the dislocations of the surrounding single crystal portions (Z+Y) effectively.

The power of converging the dislocations to the closed defect accumulating regions (H) originates from the inclining facets of sweeping the dislocations to the center of the facet pits in the centripetal directions in parallel with the C-plane.

Namely, the dislocations run in the horizontal direction parallel with the surface (C-plane). Convergence of dislocations into the closed defect accumulating regions (H) reduces thread dislocations in the single crystal regions (Z) and (Y). For example, facets grow inward along centripetal arrows and dislocations similarly extend inward along the centripetal arrows in FIG. 1 and FIG. 2. In FIG. 2, centripetally moving dislocations collide with a facet boundary 8 of a hexagonal pit, turn in the boundary 8, proceed along the boundary 8, and converge to a central manifold point D.

FIG. 3 (1) and (2) show a pit 14 of facets 10 proposed by our preceding invention ⑥. The pit bottom has no closed defect accumulating region (H). The pit bottom is open. Number of dislocations 15 which are gathered to the pit bottom is small. Dislocation density is low at the bottom of the pit. Dislocations 15 once converged to the pit bottom will be released outward again, since the bottom is not closed but open.

In the present invention, the closed defect accumulating region (H) at the bottom 29 of a pit 24 of facets 26 attracts and absorbs dislocations in other parts 22 (FIG. 4). A part of the absorbed dislocations vanishes and another part of the dislocations is stored in the closed defect accumulating region (H) 25 which consists of the core (S) and the boundary (K). The dislocation vanishing/storing part is the boundary (K) or the core (S). In a case, only the boundary K is the dislocation vanishing/storing part. In another case, the core (S) is the dislocation vanishing/storing part. In another case, both the core (S) and the boundary (K) are the dislocation vanishing/storing part. In any cases, the closed defect accumulating region (H) 25 is entirely encapsulated and sealed by the boundary (K). In an ideal case, once a dislocation is absorbed in the closed defect accumulating region (H) 25, the same dislocation never emerges from the closed defect accumulating region (H) to outer regions. Thus, the closed defect accumulating region (H) realizes a permanent reduction of dislocations in the outer single crystal regions (Y) and (Z). FIG. 3 and FIG. 4 clearly contrast the present invention with our preceding ⑥.

Detail techniques for applying the present invention for making $Al_xIn_yGa_{1-x-y}N$ substrates are described. A substrate of a foreign material is employed as a starting substrate (undersubstrate). Thus, a three-fold rotationally symmetric plane should be assigned to a surface orientation of the undersubstrate. $Al_xIn_yGa_{1-x-y}N$ films should be grown along the c-axis on the three-fold rotation symmetric substrate.

$Al_xIn_yGa_{1-x-y}N$ crystals are grown by a facet growth which forms facets and pits built by the facets on a surface and grows $Al_xIn_yGa_{1-x-y}N$ without burying the facet pits. Besides the facet growth, the present invention forms the facet pits at the points in a predetermined regular pattern, makes the closed defect accumulating regions (H) following the regularly aligning facet pit bottoms and maintains the facet pits and the closed defect accumulating regions (H) throughout the crystal growth.

Figure 6:
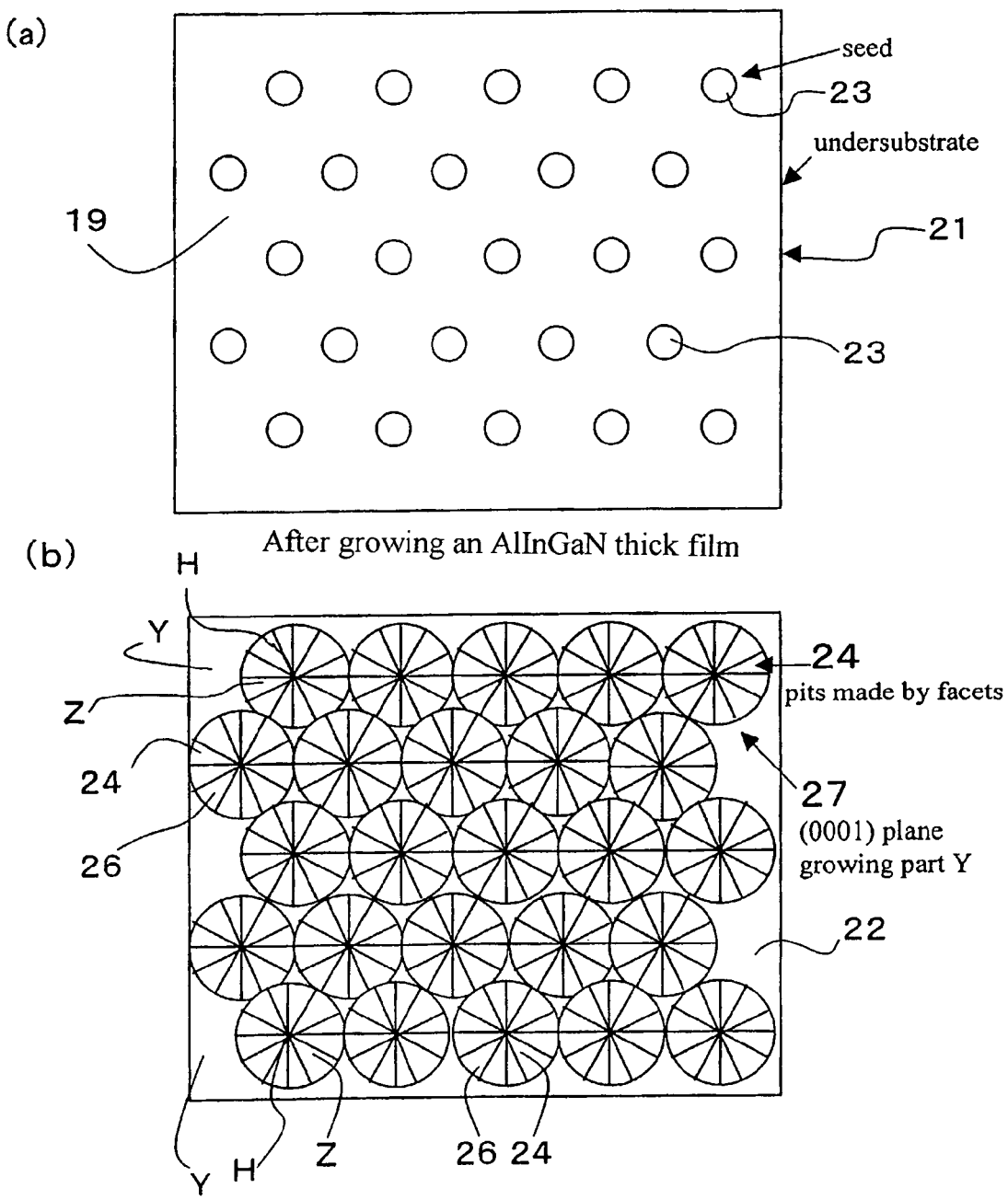
FIG. 6(a) is a plan view of seeds implanted upon an undersubstrate regularly and periodically at corner points of series of equivalent triangles aligning in a six-fold rotation symmetry pattern having equivalent 60 degree rotation directions.
FIG. 6(b) is a plan view of an $Al_xIn_yGa_{1-x-y}N$ mixture crystal grown with a (0001) surface on the seed-implanted undersubstrate. Dodecagonal pits built by facets appear just upon the seeds in the same six-fold rotation symmetry pattern. Centers of the pits are closed defect accumulating regions (H) on the seeds. Accompanying low dislocation single crystal regions (Z) are grown under the facets surrounding the closed defect accumulating regions (H). Extra low dislocation single crystal regions (Y) are formed under C-plane growing tops.
Figure 7:
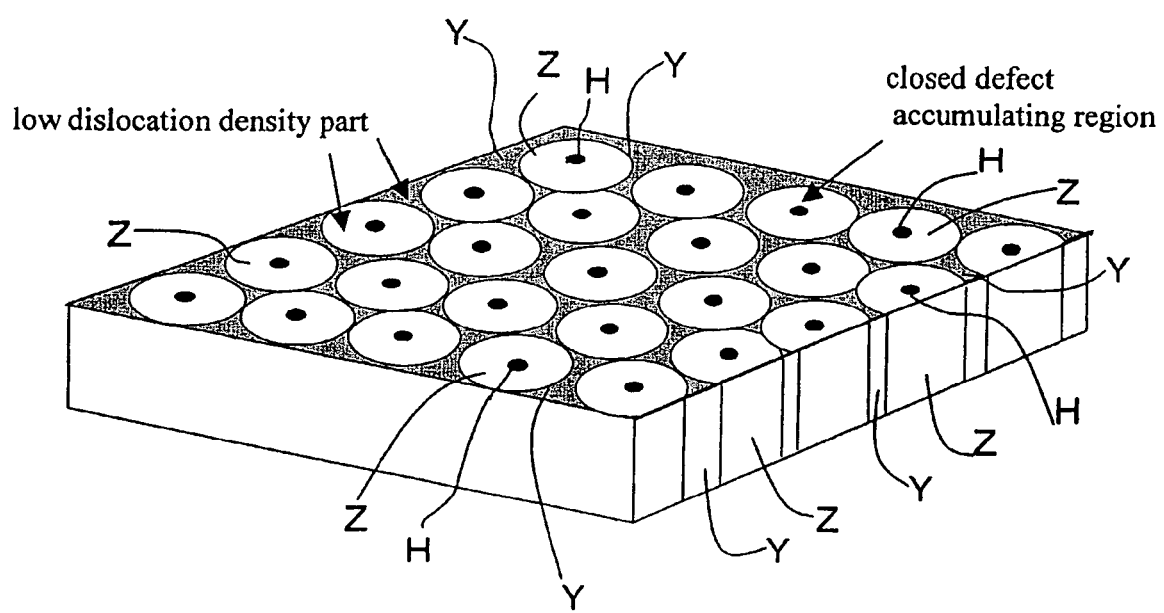
FIG. 7 is a perspective CL (cathode luminescence) view of an $Al_xIn_yGa_{1-x-y}N$ mixture crystal substrate made by implanting seeds upon an undersubstrate in a hexagonal symmetric pattern of FIG. 6, growing a thick $Al_xIn_yGa_{1-x-y}N$ crystal on the condition of facet growing, forming facets and facet pits at the position of the seeds, producing closed defect accumulating regions (H) following the bottoms of the pits, forming accompanying low dislocation single crystal regions (Z) surrounding the closed defect accumulating regions (H) just under the facets, forming extra low dislocation single crystal regions (Y) under C-plane growing tops, and eliminating the facets and the undersubstrate by mechanical processing.

It is important for the present invention to array the facet pits and the closed defect accumulating regions (H) in a periodic pattern by keeping a rule. FIG. 6(b), FIG. 7 and FIGS. 8(a) and (b) show periodical arrangements of the closed defect accumulating regions (H). The whole surface should be covered with repetitions of a basic unit without extra margins. The number of probable patterns is restricted by the symmetry of the patterns. Geometric consideration clarifies the variance of allowable patterns.

Two-dimensionally periodic, regular arrangements of similar pits and closed defect accumulating regions (H) without margins are realized only by three kinds of symmetry groups; six-fold rotation symmetry, four-fold rotation symmetry, and two-hold rotation symmetry. The six-fold rotation symmetric pattern arranges plenty of equilateral triangles without margin for harmonizing the corners of six neighboring triangles at a point (FIGS. 6(a), (b), FIGS. 8(a), (b)). The four-fold rotation symmetric pattern arranges plenty of squares without margin for harmonizing the corners of four neighboring squares at a point (FIG. 7, FIGS. 9(a), (b)). The two-fold rotation symmetric pattern arranges plenty of rectangles without margin for harmonizing the corners of four neighboring rectangles at a point (FIGS. 10(a), (b)).

[1. Six-fold Rotation Symmetry Pattern (FIGS. 8(a), (b)]

FIGS. 8(a) and (b) show a 6-fold rotation symmetry pattern of H, Y and Z. Facet pits are hexagonal or dodecagonal polygons which are briefly denoted by rounds in the FIGS. 8(a) and 8(b). The pits are arranged in the most closest packed patterns in which neighboring pits are in contact with each other at six points. Every set of three centers of the neighboring three pits forms an equilateral triangle. A length of the unit equilateral triangle is called a pitch "p" here. The pitch "p" is a period of repetition of pits in the closest packed pattern. Six equilateral triangles form an equilateral hexagon. This pattern is named a two-dimensional hexagonal closest packed pattern. In the pattern, the pit diameter d is nearly equal to the pitch p (d=p). In FIG. 8(a), the pitch direction is parallel to a <11-20> direction of an $Al_xIn_yGa_{1-x-y}N$ crystal. In FIG. 8(b), the pitch direction is parallel to a <1-100> direction of the $Al_xIn_yGa_{1-x-y}N$ crystal.

In FIG. 8(a) and FIG. 8(b), smaller, inner rounds of concentric circles are the closed defect accumulating regions (H). Larger outer rounds denote facet pits 24 on the surface. The larger outer rounds indicate areas of the accompanying low dislocation single crystal regions (Z) at the same time. The pits coincide with Z in the plan views. Narrow triangles remaining among three neighboring pits are the extra low dislocation single crystal regions (Y). These triangle areas are extra parts. Thus, Y is defined by an adjective "extra". The closest packed pattern means that the rate of the accompanying low dislocation single crystal regions (Z) to the whole area takes a maximum value. Similarly, the closed defect accumulating regions (H) take a maximum area. The extra low dislocation single crystal regions (Y) take a minimum area to the contrary. C-plane growing regions (the extra low dislocation single crystal regions (Y)) have a tendency of obtaining high electric resistivity. The six-fold rotation symmetry pattern is preferable for producing conductive $Al_xIn_yGa_{1-x-y}N$ substrates, since the six-fold symmetry pattern can reduce the ratio of the extra low dislocation single crystal regions (Y).

[2. Four-fold Rotation Symmetry Pattern (FIGS. 9(a), (b))]

FIGS. 9(a) and (b) show a 4-fold rotation symmetry pattern of H, Y and Z. Facet pits are hexagonal or dodecagonal polygons which are briefly denoted by rounds in the FIGS. 9(a) and 9(b). The pits are arranged in medium close packed patterns in which neighboring pits are in contact with each other at four points. Every set of four centers of the neighboring four pits forms a square. A length of the unit square is called a pitch "p" here. The pitch "p" is a period of repetition of pits in the medium close packed pattern. Four neighboring pits form a square. In the pattern, the pit diameter d is nearly equal to the pitch p (d=p). In FIG. 9(a), the pitch direction is parallel to a <11-20> direction and a <1-100> direction of the $Al_xIn_yGa_{1-x-y}N$ crystal. In FIG. 9(b), *the pitch direction inclines at 45 degrees to the <1-100> direction and to the <1-100> direction* of the $Al_xIn_yGa_{1-x-y}N$ crystal. The pitch direction cannot be represented by a low plane index.

In FIG. 9(a) and FIG. 9(b), smaller, inner rounds of concentric circles are the closed defect accumulating regions (H). Larger outer rounds denote facet pits on the surface. The larger outer rounds indicate areas of the accompanying low dislocation single crystal regions (Z) at the same time. The pits coincide with Z in the plan views. Asterisk regions remaining among four neighboring pits are the extra low dislocation single crystal regions (Y). These asterisks are extra parts. Thus, Y is defined by an adjective "extra". The medium packed pattern means that the rate of the accompanying low dislocation single crystal regions (Z) to the whole area takes a medium value. The closed defect accumulating regions (H) take a medium area. The extra low dislocation single crystal regions (Y) take a medium area. C-plane growing regions (the extra low dislocation single crystal regions (Y)) have a tendency of showing high electric resistivity. The four-fold symmetric substrate is favorable for making square chip devices. Effective regions for chip substrates are the accompanying low dislocation single crystal regions (Z) and the extra low dislocation single crystal regions (Y). The wide, parallel single crystal regions (Z and Y) endow the four-fold symmetric $Al_xIn_yGa_{1-x-y}N$ substrates with extra margins, simplified cleavage and high freedom of design. Equalizing the device pitch to the pit pitch enables makers to produce all the devices on the same condition and to divide a device-made $Al_xIn_yGa_{1-x-y}N$ wafer into individual device chips by the simplified cleavage.

[3. Two-fold Rotation Symmetry Pattern (FIGS. 10(a), (b)]

FIGS. 10(a) and (b) show a 2-fold rotation symmetry pattern of H, Y and Z. Facet pits are hexagonal or dodecagonal polygons which are briefly denoted by rounds in the FIGS. 10(a) and 10(b). The pits are arranged in half-close packed patterns in which neighboring pits are in contact with each other at two points. A basic shape is a rectangle. Every set of four centers of the neighboring four pits forms a rectangle. The rectangle introduces anisotropy for the pattern. A length of the shorter side of a unit rectangle is called a pitch "p" here. The shorter pitch "p" is defined as a period of repetition of pits along the shorter sides in the half-close packed pattern. A longer pitch "q" is defined as a period of repetition of pits along longer sides in the pattern. In the pattern, the pit diameter d is nearly equal to the pitch p (d=p). In FIG. 10(a), the shorter pitch direction is parallel to a <11-20> direction of the $Al_xIn_yGa_{1-x-y}N$ crystal. In FIG. 10(b), the shorter pitch direction is parallel to a <1-100> direction of the $Al_xIn_yGa_{1-x-y}N$ crystal.

In FIG. 10(a) and FIG. 10(b), smaller, inner rounds of concentric circles are the closed defect accumulating regions (H). Larger outer rounds denote facet pits on the surface. The larger outer rounds indicate areas of the accompanying low dislocation single crystal regions (Z) at the same time. The pits coincide with Z in the plan views. Corrugated tape regions remaining between a series of contacting pits and another series of contacting pits are the extra low dislocation single crystal regions (Y). Effective regions for chip substrates are the accompanying low dislocation single crystal regions (Z) and the extra low dislocation single crystal regions (Y). The wide, parallel single crystal regions (Z and Y) endow the two-fold symmetric $Al_xIn_yGa_{1-x-y}N$ substrates with extra margins, simplified cleavage and high freedom of design. Equalizing the device pitch to the shorter pit pitch p enables makers to produce all the devices on the same condition and to divide a device-made $Al_xIn_yGa_{1-x-y}N$ wafer into individual device chips by the simplified cleavage.

This invention allocates plenty of pits built by facets having the closed defect accumulating regions (H) in a regular pattern on a surface of a growing $Al_xIn_yGa_{1-x-y}N$ crystal. An optimum range of the minimum of the distances between neighboring pits is 50 μm to 2000 μm.

A desirable size of pits of an $Al_xIn_yGa_{1-x-y}N$ substrate depends upon the size of devices which are made on the substrate. A pit pitch smaller than the device size degrades the $Al_xIn_yGa_{1-x-y}N$ wafer as a substrate for making the devices. The minimum size of the devices which will be made on the $Al_xIn_yGa_{1-x-y}N$ wafer is 50 μm. Thus, the size of pits should be larger than 50 μm in diameter. Then, the minimum of the pit pitch is 50 μm.

The upper limit of the pit pitch is 2000 μm. A wider pit pitch is more convenient for making devices on only the accompanying low dislocation single crystal regions (Z) or the extra low dislocation single crystal regions (Y). However, the depths of the pits increase in proportion to the pit diameter. The pits are later eliminated by grinding and polishing. The grinding depth should be larger than the pit depth. A bigger pit diameter requires a thicker margin of grinding. Too thick grinding margin is undesirable. Economical reason restricts the maximum of the pit pitch to 2000 μm. Then, the optimum range of the pit pitch is between 50 μm and 2000 μm.

[Formation of Closed Defect Accumulating Regions (H)]

The closed defect accumulating region (H) is the most significant concept in the present invention. The method of producing the closed defect accumulating regions (H) is now described. FIGS. 5(a) and (b) show steps of growing a pit. FIG. 6(a) shows a plan view of a substrate having a seed pattern. FIG. 6(b) shows a plan view of an $Al_xIn_yGa_{1-x-y}N$ crystal having a pit pattern similar to the seed pattern.

Crystal growth of the present invention uses an undersubstrate 21. Of course, an $Al_xIn_yGa_{1-x-y}N$ single crystal plate can be an undersubstrate. But, it is still very difficult to produce a large $Al_xIn_yGa_{1-x-y}N$ single crystal. It is more practical to make use of foreign material undersubstrates. At first, a plurality of seeds 23 are allocated at the predetermined spots which are assigned to the closed defect accumulating regions (H) on the undersubstrate 21 (FIG. 5(a)(1), FIG. 5(b)(1), FIG. 6(a)).

The seeds 23 should be arranged in a geometrically-regular pattern on the starting substrate (undersubstrate) 21. FIG. 6(a) denotes a plan view of an example of the seed pattern of the present invention. The seeded undersubstrate 21 shows a seed pattern having six-fold rotation symmetry which allocates seeds 23 at corner points of identical equilateral triangles which cover the surface of the substrate without extra space. Extra portions of the undersubstrate 21 are exposed. An $Al_xIn_yGa_{1-x-y}N$ crystal 22 is grown on the undersubstrate 21 with the seeds 23. $Al_xIn_yGa_{1-x-y}N$ growth has selectivity for the undersubstrate 21 and the seeds 23. The undersubstrate 21 facilitates the $Al_xIn_yGa_{1-x-y}N$ growth thereon. The seeds 23 suppress $Al_xIn_yGa_{1-x-y}N$ growth. The $Al_xIn_yGa_{1-x-y}N$ growing speed on the seeds 23 is slower than the growing speed on the undersubstrate 21. The difference of the difficulty of growing $Al_xIn_yGa_{1-x-y}N$ enables the seeded undersubstrate 21 to produce facets and facet pits following the seeds 23. It is a quite sophisticated method. FIG. 5(a), (2) and FIG. 5(b), (2) show the substrate 21, the seed 23 and the $Al_xIn_yGa_{1-x-y}N$ film 22 selectively growing upon the substrate 21. The top of the $Al_xIn_yGa_{1-x-y}N$ film 22 is a flat plane 27 (C-plane). Since $Al_xIn_yGa_{1-x-y}N$ is not easily deposited upon the seed 23, a gap remains among six or twelve slanting, facing facets 26 and 26 on the seed 23. Then, a pit 24 is produced just upon the seed 23. The pit 24 consists of the six or twelve facets 26. The facets have low Miller indices. A significant fact is that the pit 24 is formed just above the seed 23. The pit formation is exactly controlled by designing the seed pattern.

When the $Al_xIn_yGa_{1-x-y}N$ film grows further from FIG. 5(a)(2) or FIG. 5(b)(2), the six or twelve facing facets 26 meet, collide and form a polygonal pit 24 on the seed 23. The whole of the seed is covered with a rugged $Al_xIn_yGa_{1-x-y}N$ film. Then, the polygonal pit 24 is formed on the seed 23. The $Al_xIn_yGa_{1-x-y}N$ film grows further upward. The pit 24 should not be buried but be maintained. The new mode of growth of maintaining facets is called "facet growth" here. The normal, ordinary mode of growth of maintaining smooth flat C-plane surface is called "C-plane growth" in contrast to the novel facet growth. The facet growth realized by raising the growth speed, enhancing the HCl partial pressure, raising the $NH_3$ partial pressure or lowering the growth temperature. The facets 26 are maintained by the facet growth. As the growth proceeds, the facets and the facet pits move upward, keeping the same shapes. A bottom 29 of the pit 24 corresponds to the seed 23. FIG. 5(a)(3) and FIG. 5(b)(3) indicate an intermediate state of the facet growth.

A crystal 25 growing from the bottom 29 of the pit 24 is entirely different from the surrounding crystal 22. The crystal 25 is closed. The bottom-following crystal 25 originates from the seed 23. Thus, the closed crystal 25 growing between the pit bottom 29 and the seed 23 is named a "closed defect accumulating region (H)". An interface 30 between the closed defect accumulating region (H) and the surrounding crystal 22 is named a "grain boundary (K)". An inner part is called a "core(S)". The pit bottom 29, the closed defect accumulating region (H) and the seed 23 align in series in the vertical direction. Namely, a pit bottom 29 is formed just above a seed 23 and a closed defect accumulating region (H) is formed between the bottom 29 and the seed 23.

Other crystal parts just under the facets 26 are accompanying low dislocation single crystal regions (Z). Further extra parts just below the flat top C-plane 27 are extra low dislocation single crystal regions (Y). The pit bottom takes two different shapes as shown in FIGS. 5(a) and (b). FIG. 5(a) shows a simpler facet pit in which the pit bottom has the same facets as the upper part of the pit. This is a single-step facet pit. FIG. 5(b) shows a more complex facet pit in which the pit bottom has less steeper facets different from the upper part of the pit. This is a two-step facet pit. The lower, less steeper facets have higher c-axis index n. If an upper, steeper facet is a (11-22) plane, the lower, less steep facet is a (11-24) plane.

[Wide Variations of Seeds]

The formation of the closed defect accumulating regions (H) is the most significant contrivance in the present invention. Seeds prepared on a starting substrate (undersubstrate) determine the properties of the closed defect accumulating regions (H), since the seeds initiate the formation of the closed defect accumulating regions (H). The seeds 23 which produce the closed defect accumulating regions (H) can be made either directly on the undersubstrate or indirectly on the undersubstrate by covering the undersubstrate with a thin $Al_xIn_yGa_{1-x-y}N$ buffer layer and making the seeds on the $Al_xIn_yGa_{1-x-y}N$ buffer layer.

The seeds should be allocated periodically in a regular pattern for making regularly aligning closed defect accumulating regions (H). Periodic patterns having six-fold rotation symmetry, four-fold rotation symmetry and two-fold rotation symmetry have been described enough.

Shapes of the seeds are films, particles and partial substrate surfaces. The films and particles have a function of reducing $Al_xIn_yGa_{1-x-y}N$ growth and making pits. In the case of a film seed, both amorphous films and polycrystal films are available.

[Seeding method 1 (seed=film; film seed method)]

Film seeds are formed at spots at which a closed defect accumulating region (H) should be allocated. A film having a two dimensional extension can be freely patterned into arbitrary shapes and distributions on an undersubstrate. Seed patterning is done by photolithography, selective mask evaporation, or stencil printing. The positioning accuracy of the closed defect accumulating regions (H) is enhanced by precise patterning of seeds.

A shape of an individual seed can be a circle or a polygon. The polygon seed means a triangle seed, a square seed, a hexagon seed, an octagon seed and so on. A sectional shape of a closed defect accumulating region (H) depends upon the shape of the seed. A desirable diameter of the amorphous or polycrystalline film seeds patterned into circles or polygons ranges from 1 μm to 300 μm. The size of the closed defect accumulating region (H) is contingent on the size of the seeds. An optimum diameter of the closed defect accumulating region (H) is 1 μm to 300 μm. Experiments show the fact that the diameter of the closed defect accumulating region (H) is slightly smaller than the diameter of the seed.

[Materials of Film Seeds]

An attribute required for the seeds is to have an $Al_xIn_yGa_{1-x-y}N$ growing speed slower than $Al_xIn_yGa_{1-x-y}N$ itself. Polycrystal films and amorphous films can be the seeds for making the closed defect accumulating regions (H). Metallic films, ceramic films and oxide films are available for the seed.

Promising seed candidates, in particular, are;

| | |
|---|---|
| α. silicon dioxide ($SiO_2$) film | (polycrystalline or amorphous) |
| β. silicon nitride ($Si_3N_4$) film | (polycrystalline or amorphous) |
| γ. platinum (Pt) film | (polycrystalline) |
| δ. tungsten (W) film | (polycrystalline) |

[Seeding method 2 (seed=particles: particle seed method)]

Seeds are not necessarily restricted to thin films. Regularly dispersed particles can be the seeds which induce the formation of the closed defect accumulating regions (H). For example, a set of seeds is made of $Al_xIn_yGa_{1-x-y}N$ polycrystal particles arrayed in a regular pattern on an undersubstrate. Similarly, another set of seeds is made of $Al_xIn_yGa_{1-x-y}N$ single crystal particles arrayed in a regular pattern on an undersubstrate. The dispersed $Al_xIn_yGa_{1-x-y}N$ particles make $Al_xIn_yGa_{1-x-y}N$ polycrystal parts with crystal orientations different from the neighboring $Al_xIn_yGa_{1-x-y}N$ single crystal parts.

It sounds strange that the $Al_xIn_yGa_{1-x-y}N$ particles act as seeds for delaying $Al_xIn_yGa_{1-x-y}N$ growth and form facet pits. The $Al_xIn_yGa_{1-x-y}N$ particles have random orientations different from growing $Al_xIn_yGa_{1-x-y}N$, which suppresses the $Al_xIn_yGa_{1-x-y}N$ growth in the definite orientation. Besides $Al_xIn_yGa_{1-x-y}N$ particles, poly- and single crystal particles of foreign materials are candidates of the seeds. $Al_xIn_yGa_{1-x-y}N$ particles are the best candidate of the seeds, because the $Al_xIn_yGa_{1-x-y}N$ particles do not induce contamination by impurity diffusion.

Particles have a three dimensional structure unlike films. However, the particles have the function of the seed for producing the closed defect accumulating regions (H). Individual particles made of metals, ceramics or other oxides can be randomly placed on a starting, foreign material substrate (undersubstrate). Particle seeds are suitable for preparing random seed patterns.

[Seeding method 3 (seed=partially masked foreign material substrate: negative mask method)]

Superficial parts of a foreign material undersubstrate can be the seeds for producing the closed defect accumulating regions (H). An undersubstrate made of a foreign material has weaker function of making $Al_xIn_yGa_{1-x-y}N$ layers than an $Al_xIn_yGa_{1-x-y}N$ crystal. Difference of growing speeds on the undersubstrate and an $Al_xIn_yGa_{1-x-y}N$ mask enables $Al_xIn_yGa_{1-x-y}N$ growth to maintain the facet growth and to produce the closed defect accumulating regions (H) upon exposed parts of the undersubstrate. This is a sophisticated seeding method.

The seeds can be made by exposing periodically partial surfaces of a foreign material undersubstrate from an overcoating $Al_xIn_yGa_{1-x-y}N$ thin film. The partial undersubstrate surfaces emerging from the $Al_xIn_yGa_{1-x-y}N$ films act as seeds for preparing the closed defect accumulating regions (H). A negative $Al_xIn_yGa_{1-x-y}N$ film mask is formed by piling an $Al_xIn_yGa_{1-x-y}N$ thin film (as an $Al_xIn_yGa_{1-x-y}N$ buffer layer) on a foreign material undersubstrate, etching away parts of the $Al_xIn_yGa_{1-x-y}N$ film at the spots on which the closed defect accumulating regions (H) should be made, exposing the partial surfaces of the undersubstrate via mask holes, and growing an $Al_xIn_yGa_{1-x-y}N$ crystal on the masked undersubstrate. The exposed undersubstrate parts produce pits by delaying the $Al_xIn_yGa_{1-x-y}N$ growth thereupon and act as seeds for making the closed defect accumulating regions (H).

This negative mask method makes use of the difference of the growing speeds between the on- $Al_xIn_yGa_{1-x-y}N$ growth and the on-non- $Al_xIn_yGa_{1-x-y}N$ growth. The $Al_xIn_yGa_{1-x-y}N$ buffer layer of the mask facilitates the $Al_xIn_yGa_{1-x-y}N$ growth. The exposed undersubstrate in the holes of the mask suppresses the $Al_xIn_yGa_{1-x-y}N$ growth, which makes the facet pits and the closed defect accumulating regions (H). The $Al_xIn_yGa_{1-x-y}N$ negative mask can be made by photolithography like the aforementioned positive mask. But, the positive-, negative-parts are reciprocal to the positive mask method and this negative mask method. A sapphire substrate, a spinel substrate, a silicon carbide substrate and gallium arsenide (GaAs) substrate are promising candidates for the undersubstrate.

[Seeding method 4 (seed=partially-formed mask on $Al_xIn_yGa_{1-x-y}N$ film: on $Al_xIn_yGa_{1-x-y}N$ dotted film method)]

Seeds are produced by growing an $Al_xIn_yGa_{1-x-y}N$ buffer layer upon an undersubstrate, piling a foreign material polycrystal or amorphous film mask on an undersubstrate, eliminating selectively unnecessary parts of the foreign material mask by photolithography and utilizing remaining film parts on the $Al_xIn_yGa_{1-x-y}N$ buffer layer as seeds for initiating the closed defect accumulating regions (H). The DIS (defect inducing seed) mask of the on- $Al_xIn_yGa_{1-x-y}N$ dotted film method takes a seed/ $Al_xIn_yGa_{1-x-y}N$/ undersubstrate structure. The seeds enable the facet growth to originate facet pits and closed defect accumulating regions (H) in series from the seeds.

[Seeding method 5 (seed=partially-formed mask on undersubstrate: on-substrate dotted film method)]

Seeds are produced by piling a foreign material polycrystal or amorphous film mask on an undersubstrate, eliminating selectively unnecessary parts of the foreign material mask by photolithography, and utilizing remaining film parts as seeds for initiating the closed defect accumulating regions (H). The DIS mask of the on-substrate dotted film method takes a seed/undersubstrate structure.

[Function of Seeds (FIG. 5)]

This invention implants seeds on an undersubstrate. The seed implanted substrate is divided into seeded parts and non-seeded parts. The non-seeded parts of the undersubstrate have a strong tendency of inducing crystallization of $Al_xIn_yGa_{1-x-y}N$ heteroepitaxially. The seeded parts have a tendency of suppressing $Al_xIn_yGa_{1-x-y}N$ growth. The seeds delay the $Al_xIn_yGa_{1-x-y}N$ growth. When $Al_xIn_yGa_{1-x-y}N$ epitaxial layers grow on neighboring non-seeded parts higher than a seed height, the layers override on the seeds and make $Al_xIn_yGa_{1-x-y}N$ pits on the seeds. $Al_xIn_yGa_{1-x-y}N$ films grown on the seeds make pits due to the delay of growth by the seed. The $Al_xIn_yGa_{1-x-y}N$ grown on the seeds are simply designated by "an on-seed $Al_xIn_yGa_{1-x-y}N$ crystal" or "on-seed crystal". The on-seed $Al_xIn_yGa_{1-x-y}N$ crystal has wide a scope of variations for the sake of the difference of growth condition. The on-seed $Al_xIn_yGa_{1-x-y}N$ crystals are sometimes polycrystal (A).

Sometimes on-seed $Al_xIn_yGa_{1-x-y}N$ crystals are single crystal. Even if the $Al_xIn_yGa_{1-x-y}N$ is identified as a single crystal, there are still variations of $Al_xIn_yGa_{1-x-y}N$ single crystals with different orientations. An on-seed crystal (B) is a single crystal having a different, unique orientation which is antiparallel to the orientation of neighboring regions grown on the non-seeded parts. Another on-seed crystal (C) is a single crystal having a unique orientation of a common <0001> axis but a different orientation rotating around the <0001> axis from that of neighboring regions grown on the non-seeded parts. A further on-seed crystal (D) is a single crystal having a unique orientation slightly slanting from that of neighboring regions grown on the non-seeded parts. The on-seed crystals are the closed defect accumulating regions (H). Thus, the closed defect accumulating regions (H) have the same variations as the on-seed crystals.

[Collaboration of the ELO Mask and the Defect Inducing Seed (DIS) Mask 1 (Simultaneous)]

The dislocation density can be further reduced by collaboration of the ELO mask and the DIS mask of the present invention, since both masks have the function of reducing dislocations. The epitaxial lateral overgrowth (ELO) method had been contrived for making a low dislocation density $Al_xIn_yGa_{1-x-y}N$ thin film on a sapphire substrate as mentioned before. The ELO method is a sophisticated method for lowering dislocations in an $Al_xIn_yGa_{1-x-y}N$ film on an undersubstrate at an early stage of the growth by forming the ELO mask with regularly distributing small windows on the undersubstrate, growing epitaxially tiny isolated $Al_xIn_yGa_{1-x-y}N$ films in the vertical direction on the exposed undersubstrate within the windows, turning growing directions of the $Al_xIn_yGa_{1-x-y}N$ films from vertical to horizontal for overriding on the mask, guiding the $Al_xIn_yGa_{1-x-y}N$ films to collide along bisectors between neighboring windows and reducing dislocations by the turn and the collision. Improved ELO methods of GaN on a GaAs substrate have been fully described in aforecited ①Japanese Patent Application No.9-298300 and ②Japanese Patent Application No.10-9008. Since GaN films override upon the mask and extend in lateral direction on the mask, the method was called a "lateral" "overgrowth".

Many small windows are perforated in a regular pattern on an ELO mask. The ELO mask has a wider shielding area and a narrower open area. The rate of the shielding area is more than 50% at which the DIS mask is entirely different. A prevalent ELO pattern is a hexagonally symmetric pattern aligning many small equilateral triangles in six 60 degree rotating directions without margin and perforating small windows at corner points of the triangles. The DIS mask should not be confused with the ELO mask.

The ELO mask is clearly discernible from the DIS mask. One distinction is a difference of sizes. Another distinction is a ratio of the shielding area to the open area. The ELO mask has small windows (open area) and a small period of spacing. A window diameter and a spacing are several microns (μm). The shielding parts are wide and the open parts are narrow. The ELO mask is a negative type mask. The rate of the shielding area to the whole area is more than 50% (shielding rate>50%).

The DIS mask has wide seeds (shielding parts) of a 1 μm to 300 μm diameter and a large period of spacing of 50 μm to 2000 μm. A seed diameter and a spacing are far larger than the window size and spacing of the ELO mask. The shielding parts are narrow and the open parts are wide. The DIS mask is a positive type mask. The rate of the shielding area to the whole area is less than 50% (shielding rate<50%).

The functions are also different. The ELO mask has a function of killing dislocations at an early step of the growth. The DIS mask has a purpose of making closed defect accumulating regions (H).

The DIS mask has wider blank (exposed) parts. A complex DIS/ELO mask would be more effective than a single DIS mask or a single ELO mask. Thus, a complex DIS/ELO mask is fabricated. The DIS/ELO mask is produced by forming ELO masks only on the blank parts of the DIS mask. An undersubstrate is covered with two different masks (DIS-shield-parts and ELO). For example, in FIG. 6(a) the DIS mask is allotted to an undersubstrate with seeds at hexagonally symmetric spots, leaving continual wide blank parts 19. ELO masks are formed on the blank parts 19. The materials of the ELO mask and the DIS mask can be identical and be made of $SiO_2$, SiN, or metal. When both masks are made of the same materials, the masks can be formed at a stroke by evaporation, photolithography, or printing.

The functions of the individual masks in a complex mask are different. An ELO mask with tiny windows has a function of reducing dislocations at an early stage of growth by decreasing inner stress via isolated window-in growth and by changing twice the direction of extension of dislocations from vertical to horizontal and from horizontal to vertical. A defect inducing seed mask (DIS) positively makes facet pits and closed defect accumulating regions (H) at predetermined positions. During a middle stage and a final stage of the growth, the closed defect accumulating regions (H) absorb, arrest, annihilate and accumulate the dislocations which have been once decreased by the action of the ELO mask at the early stage. Dislocation density is greatly reduced in the accompanying low dislocation single crystal regions (Z) and the extra low dislocation single crystal regions (Y).

[Collaboration of ELO Mask and Defect Inducing Seed (DIS) Mask 2 (Sequential)]

The former simultaneous collaboration of the epitaxial lateral overgrowth (ELO) mask and the defect inducing seed (DIS) mask which allocate the ELO mask to the vacant portion 19 on the undersubstrate without seeds as shown in FIG. 6(a) has advantages of using a single mask unified the ELO mask with the DIS mask and of growing an $Al_xIn_yGa_{1-x-y}N$ crystal at a stroke. However, the simultaneous collaboration method has a drawback of inducing different growing conditions to the seed regions and the non-seed (ELO) region. When the different condition is unfavorable, the simultaneous combined use of the ELO mask and the DIS mask should be avoided. An $Al_xIn_yGa_{1-x-y}N$ crystal should be made by sequential double step growth of preparing an ELO mask on an undersubstrate, growing an $Al_xIn_yGa_{1-x-y}N$ thin buffer layer on the ELO-masked undersubstrate, piling a defect inducing seed (DIS) mask on the $Al_xIn_yGa_{1-x-y}N$ buffer layer, and growing another $Al_xIn_yGa_{1-x-y}N$ film on the DIS-masked $Al_xIn_yGa_{1-x-y}N$ buffer layer. This is a sequential collaboration of the ELO method and the present invention method.

The above-mentioned ELO method forms an ELO mask on an undersubstrate or on an $Al_xIn_yGa_{1-x-y}N$ buffer layer prepared on an undersubstrate. The ELO mask is made by piling an $SiO_2$ film or an SiN film (100 nm to 200 nm thickness) on an undersubstrate or a buffer layer and etching away (round, polygonal or striped) parts at corner points of equilateral triangles (of a side of several microns) aligning periodically in a hexagonal symmetric pattern layer. An $Al_xIn_yGa_{1-x-y}N$ buffer layer of a thickness of 80 nm to 130 nm at a low temperature in vapor phase. The buffer layer conciliates lattice misfit by alleviating inner stress. A thin $Al_xIn_yGa_{1-x-y}N$ layer is epitaxially grown on the $Al_xIn_yGa_{1-x-y}N$ buffer layer at a high temperature. The ELO reduces dislocation density in the $Al_xIn_yGa_{1-x-y}N$ epi-layer.

For sequential collaboration of ELO/DIS, seeds are implanted upon the $Al_xIn_yGa_{1-x-y}N$ epi-layer piled on the ELO-masked undersubstrate. The seeds can be films or particles. Since the seed size and spacing are far larger than that of the ELO mask, the seeds in the DIS mask can be clearly discriminated from the ELO windows and shielding portions. When $Al_xIn_yGa_{1-x-y}N$ is epitaxially grown on the ELO/DIS masked undersubstrate (or buffer layer), the seeds produce facet pits thereabove and the pits produce closed defect accumulating regions (H) thereunder. Accompanying low dislocation single crystal regions (Z) are produced under the facets around the closed defect accumulating regions (H). Extra low dislocation single crystal regions (Y) are made under flat top C-planes among the pits. Sequential collaboration of the ELO mask which reduces dislocations and the DIS mask which makes closed defect accumulating regions (H) for annihilating and accumulating dislocations can make further low dislocation density $Al_xIn_yGa_{1-x-y}N$ crystals.

[Control of Positions of Facet Pits]

When an $Al_xIn_yGa_{1-x-y}N$ crystal is grown on a seed-implanted undersubstrate (or a seed-implanted $Al_xIn_yGa_{1-x-y}N$ buffer layer grown on an undersubstrate) by a facet growth method, a pit originates from every seed one to one. A seed makes a pit. The positions of pits coincide with the positions of the seeds. The positions of pits are controlled by seed implantation. This is the gist of the present invention. Comparison of FIG. 6($a$) with FIG. 6($b$) clarifies exact correspondence between the implanted seed positions and the pit positions.

The present invention implants seeds at predetermined positions on an undersubstrate, grows an $Al_xIn_yGa_{1-x-y}N$ crystal and produces pits on the growing $Al_xIn_yGa_{1-x-y}N$ crystal exclusively at the positions of the implanted seeds.

In the concrete, the present invention piles an amorphous film or polycrystalline film on an undersubstrate, patterns the film into discretely and periodically distributing film seeds, grows an $Al_xIn_yGa_{1-x-y}N$ film and produces pits on the growing $Al_xIn_yGa_{1-x-y}N$ film exclusively at the positions of the implanted film seeds. When an $Al_xIn_yGa_{1-x-y}N$ crystal is grown on the undersubstrate patterned with amorphous or polycrystalline film seeds, growing conditions are different between seed parts and exposed undersubstrate parts. A pit is formed at the seed as a bottom, since $Al_xIn_yGa_{1-x-y}N$ growth is delayed at the seed parts.

The seeds are films or particles made of metals, oxides or nitrides. The seeds can be prepared by a set of an undersubstrate and an $Al_xIn_yGa_{1-x-y}N$ buffer layer patterned on the undersubstrate, which has been described already. Suitable amorphous film seeds are made of $SiO_2$ films and SiN films. Besides film seeds, particles are a good candidate for seeds. Particles can play a role of seeds. A particle seed method arranges particles at predetermined spots of a regular pattern on an undersubstrate or on an $Al_xIn_yGa_{1-x-y}N$ buffer layer on an undersubstrate, grows an $Al_xIn_yGa_{1-x-y}N$ crystal on the particle-arranged undersubstrate or $Al_xIn_yGa_{1-x-y}N$ buffer layer, and makes facet pits at the particles as seeds on the growing $Al_xIn_yGa_{1-x-y}N$ crystal. The positions of the pits can be predetermined by the seed particles.

Metallic fine particles and oxide fine particles can be seed particles. $Al_xIn_yGa_{1-x-y}N$ polycrystal particles and $Al_xIn_yGa_{1-x-y}N$ single crystal particles are also employed as seed particles. Pits are formed just above seeds by arranging particles periodically and regularly on an undersubstrate, growing an $Al_xIn_yGa_{1-x-y}N$ crystal on the particle-allotted undersubstrate and making facet pits. A closed defect accumulating region (H) accompanies a pit bottom. An accompanying low dislocation single crystal region (Z) is produced just below a facet. An extra low dislocation single crystal region (Y) follows the top C-plane outside of the pits. Seed particles can give an $Al_xIn_yGa_{1-x-y}N$ crystal three different regions H, Y and Z as clearly as the film seeds.

[Production of a Flat $Al_xIn_yGa_{1-x-y}N$ Substrate]

For initiating and maintaining the facet growth, the present invention proposes creation of "closed defect accumulating regions" (H) by implanting seeds. The concept of the closed defect accumulating region (H) is novel. The "implantation of the seeds" is also new. The implantation of the seeds causes the closed defect accumulating regions (H). The positions and size of the closed defect accumulating regions (H) are determined by the positions and sizes of the seeds. The closed defect accumulating regions (H) can be controlled by the seed implantation. The present invention employs the facet growth which grows an $Al_xIn_yGa_{1-x-y}N$ crystal on a rugged surface with many facet pits. $Al_xIn_yGa_{1-x-y}N$ crystals produced by the method of the present invention have a rugged top surface with plenty of facet pits and a bottom surface of a foreign material undersubstrate.

Thus, the $Al_xIn_yGa_{1-x-y}N$ crystals made by the present invention must be mechanically processed and polished. Mechanical processing and polishing give a smooth, flat top surface to the $Al_xIn_yGa_{1-x-y}N$ wafer. The mechanical processing includes slicing process, grinding process, or lapping process. The undersubstrate adhering to the bottom of the $Al_xIn_yGa_{1-x-y}N$ crystal should be eliminated by etching, polishing or mechanical grinding. The undersubstrate-separated bottom should be further polished. Thus, the $Al_xIn_yGa_{1-x-y}N$ wafer has smooth, flat top and bottom surfaces. LED devices and LD devices can be fabricated upon the finished $Al_xIn_yGa_{1-x-y}N$ wafers.

This invention produces a flat, smooth $Al_xIn_yGa_{1-x-y}N$ substrate by preparing an undersubstrate, forming dotted masks on the undersubstrate, growing an $Al_xIn_yGa_{1-x-y}N$ crystal, forming dotted masks on the undersubstrate, inducing facets following the masks, maintaining facet growth, making closed defect accumulating regions (H), maintaining closed defect accumulating regions (H), making the best use of cores (S) and boundaries (K) of the closed defect accumulating regions (H) as dislocation annihilating/accumulating regions, reducing dislocations in surrounding accompanying low dislocation single crystal regions (Z) and extra low dislocation single crystal regions (Y), processing the grown $Al_xIn_yGa_{1-x-y}N$ crystals mechanically for eliminating the facets, eliminating the undersubstrate from the bottom and polishing the surfaces of the $Al_xIn_yGa_{1-x-y}N$ crystals into flat, smooth surfaces.

This invention produces a flat, smooth $Al_xIn_yGa_{1-x-y}N$ substrate by preparing an undersubstrated, forming dotted masks on the undersubstrate, growing an $Al_xIn_yGa_{1-x-y}N$ crystal on the masked undersubstrate, inducing facets following the masks, maintaining facet growth, forming pits composed of facets on a surface of the growing $Al_xIn_yGa_{1-x-y}N$ crystal, making closed defect accumulating regions (H) following bottoms of the pits, maintaining closed defect accumulating regions (H), making the best use of cores (S) and boundaries (K) of the closed defect accumulating regions (H) as dislocation annihilating/accumulating regions, reducing dislocations in surrounding accompanying low dislocation single crystal regions (Z) and extra low dislocation single crystal regions (Y), processing the grown $Al_xIn_yGa_{1-x-y}N$ crystals mechanically for eliminating the facets, eliminating the undersubstrate from the bottom and polishing the surfaces of the $Al_xIn_yGa_{1-x-y}N$ crystals into flat, smooth surfaces.

The mechanical processing is one, two or three of the slicing process, grinding process and lapping process.

The undersubstrate of the present invention is an aluminum indium gallium nitride ($Al_xIn_yGa_{1-x-y}N$), sapphire($\alpha$—$Al_2O_3$), silicon carbide (SiC), spinel, gallium arsenide (GaAs) or silicon (Si).

By the above-mentioned method, a plurality of $Al_xIn_yGa_{1-x-y}N$ wafers can be obtained. The method is growing a thick low dislocation $Al_xIn_yGa_{1-x-y}N$ crystal on an undersubstrate and slicing the thick $Al_xIn_yGal$ x yN crystal into a plurality of low dislocation $Al_xIn_yGa_{1-x-y}N$ wafers.

Further, the $Al_xIn_yGa_{1-x-y}N$ substrate which has been produced by the present invention method and already has closed defect accumulating regions (H), low dislocation single crystal regions (Y), (Z), can be used as a seed for making another thick $Al_xIn_yGa_{1-x-y}N$ crystal. It is a new important discovery to a closed defect accumulating region (H) is correspondingly grown on a closed defect accumulating region (H) of the undersubstrate and an accompanying low dislocation single crystal region (Z) or an extra low dislocation single crystal region (Y) is broadly correspondingly grown on low dislocation single crystal regions (Y) and (Z). In other words, a pit bottom composed of facets is formed above the closed defect accumulating region (H) of the $Al_xIn_yGa_{1-x-y}N$ undersubstrate and another closed defect accumulating region (H) is produced between the pit bottom and the closed defect accumulating region (H) of the undersubstrate. And slanting facets composing a pit and horizontal facets (C-planes) are formed above the single crystal regions (Y) and (Z) and another single crystal regions (Y) and (Z) are produced between the facet having horizontal surfaces and (Y), (Z) of the undersubstrate. Then, a low dislocation thick $Al_xIn_yGa_{1-x-y}N$ ingot can be obtained by using the $Al_xIn_yGa_{1-x-y}N$ undersubstrate as a seed. A plurality of $Al_xIn_yGa_{1-x-y}N$ wafers can be produced by slicing the $Al_xIn_yGa_{1-x-y}N$ ingot made on the $Al_xIn_yGa_{1-x-y}N$ undersubstrate.

[$Al_xIn_yGa_{1-x-y}N$ Mixture Crystal Substrate]

The $Al_xIn_yGa_{1-x-y}N$ mixture crystal substrate made by the teaching of the present invention is described. The substrate has experienced etching, mechanical processing and polishing. The $Al_xIn_yGa_{1-x-y}N$ substrate is a smooth, flat wafer without an undersubstrate. The $Al_xIn_yGa_{1-x-y}N$ substrate is transparent for human eyesight like glass. FIG. 7 shows an image of the $Al_xIn_yGa_{1-x-y}N$ substrate crystal observed by the cathode luminescence (CL) method.

Concentric circles regularly align crosswise and lengthwise. The central smaller circles are the closed defect accumulating regions (H) which derive from the bottoms of the pits. The closed defect accumulating region (H) includes a core (S) and a grain boundary (K) encapsulating the core (S). A set of the boundary (K) and the core (S) or the single boundary (K) acts as a dislocation-annihilating/accumulating place. The seeds produce facet pits. The pit bottoms make the closed defect accumulating regions (H). The seeds have been regularly arranged lengthwise and crosswise in a definite pattern on the undersubstrate. The closed defect accumulating regions (H) are also regularly arranged lengthwise and crosswise in the same definite pattern as the seeds.

The flat, smooth $Al_xIn_yGa_{1-x-y}N$ substrate of FIG. 7 has neither pits nor seeds, because the $Al_xIn_yGa_{1-x-y}N$ substrate has been etched, ground and polished. Closed defect accumulating regions (H) exist in the substrate. A blank round concentrically encircling the closed defect accumulating region (H) is an accompanying low dislocation single crystal region (Z) which has grown as slanting facets. The pits and facets have been eliminated by mechanical grinding. Loci or vestiges of the facets growing upward are the accompanying low dislocation single crystal regions (Z).

The accompanying low dislocation single crystal regions (Z) are circles (exactly speaking, dodecagons or hexagons). Almost all of the accompanying low dislocation single crystal regions (Z) have a common diameter. The neighboring accompanying low dislocation single crystal regions (Z) are in contact with each other. Extra portions held among the neighboring accompanying low dislocation single crystal regions (Z) are extra low dislocation single crystal regions (Y) which have grown with a C-plane top surface. The CL image can clearly discern the accompanying low dislocation single crystal regions (Z) from the extra low dislocation single crystal regions (Y) by the difference of brightness.

An $Al_xIn_yGa_{1-x-y}N$ substrate of the present invention is a substrate having a closed defect accumulating region (H) and single crystal regions (Y and Z) enclosing the closed defect accumulating region (H).

It is a fundamental unit composed of H+Y+Z. When an $Al_xIn_yGa_{1-x-y}N$ substrate having M units is divided into M small equivalent chips, a divided $Al_xIn_yGa_{1-x-y}N$ chip contains only a single fundamental unit of H+Y+Z. Otherwise, when a vast pit is formed on a single $Al_xIn_yGa_{1-x-y}N$ substrate, the $Al_xIn_yGa_{1-x-y}N$ substrate contains only a single fundamental unit of H+Y+Z.

Alternatively, another $Al_xIn_yGa_{1-x-y}N$ mixture crystal substrate of the present invention is a substrate having a plurality of fundamental units composed of a closed defect accumulating region (H) and single crystal regions (Y and Z) enclosing the closed defect accumulating region (H). The above description gives two basic gallium nitride substrates of the present invention.

[Variations of the Closed Defect Accumulating Regions (H)]

As already described till now, the closed defect accumulating regions (H) have variations.

A closed defect accumulating region (H) is sometimes a polycrystal. A polycrystal includes a plurality of grains having various orientations different from that of the surrounding single crystal portions.

Another closed defect accumulating region (H) is a single crystal having an orientation different from the surrounding single crystal portions.

Single crystal closed defect accumulating regions (H) have further versions.

One is a single crystal having a common <0001> axis but unique a-, b- and d- axes different from the surrounding single crystal portions.

Another closed defect accumulating region (H) is a single crystal having a reverse <0001> axis antiparallel to the <0001> axis of the surrounding single crystal portions.

A further closed defect accumulating region (H) is a single crystal having an orientation slightly different from the surrounding single crystal portions.

A. Polycrystalline closed defect accumulating region (H)

A closed defect accumulating region (H) is a polycrystal in this case. Surrounding portions (Z and Y) are low dislocation density single crystals.

B. Single crystal closed defect accumulating region (H) having different orientation Another closed defect accumulating region (H) is more than one single crystal having an orientation slightly different from the surrounding portions. The surrounding portions (Z and Y) are low dislocation density single crystals.

A further closed defect accumulating region (H) is more than one single crystal having a <0001> axis common to but three axes different from that of the surrounding portions.

A further closed defect accumulating region (H) sometimes consists of more than one crystal grain having a <0001> axis which is antiparallel to a <0001> axis of the neighboring single crystal regions Z and Y.

In this case, (0001) AlInGa planes and (000-1) N planes are reverse outside or inside of the closed defect accumulating regions (H). The interface (K) is a grain boundary. Since the $Al_xIn_yGa_{1-x-y}N$ crystal lacks inversion symmetry, the (0001) plane is not identical to the (000-1) plane.

Another closed defect accumulating region (H) sometimes consists of more than one crystal grain having orientations slightly slanting to the orientation of the neighboring single crystal regions Z and Y.

A closed defect accumulating region (H) is sometimes separated by planar defect assemblies from the neighboring single crystal regions Z and Y.

Another closed defect accumulating region (H) is separated by linear defect assemblies from the neighboring single crystal regions Z and Y. (Case C; H has the same crystal orientations as Z and Y) A closed defect accumulating region (H) has the same crystal orientations as the neighboring accompanying low dislocation single crystal regions (Z) and extra low dislocation single crystal regions (Y). And, the closed defect accumulating region (H) is separated by planar defect assemblies.

Another closed defect accumulating region (H) has the same crystal orientations as the neighboring accompanying low dislocation single crystal regions (Z) and extra low dislocation single crystal regions (Y). But the closed defect accumulating region (H) is separated by linear defect assemblies.

[Inner structure of Closed Defect Accumulating Region (H)]

Closed defect accumulating regions (H) contain crystalline defects (dislocations, planar defect assemblies, liner defect assemblies). A closed defect accumulating region (H) has a boundary K and an inner core S. Sometimes the boundary (K) consists of linear defect assemblies or planar defect assemblies. The core (S) is sometimes accumulation of dislocations, linear defect assemblies or planar defect assemblies.

A closed defect accumulating region (H) containing many defects is separated by planar defect assemblies at an interface (K) from the neighboring single crystal regions (Y) and (Z).

Another closed defect accumulating region (H) containing many defects is separated by linear defect assemblies at an interface (K) from the neighboring single crystal regions (Y) and (Z).

Most of defects included in a core (S) of a closed defect accumulating region (H) are linear defect assemblies or planar defect assemblies.

[Formation of Closed Defect Accumulating Region (H)]

Seeds marked or implanted on a substrate decide positions of closed defect accumulating regions (H). The closed defect accumulating regions (H) grow from the seeds in the vertical direction. The positions and the sizes of the closed defect accumulating regions (H) can be easily controlled by the implanted seeds. A small seed makes a small H. A big seed produces a big H. The diameter of the closed defect accumulating regions (H) ranges from 1 μm to 200 μm. The diameter of the seeds determines the diameter of the closed defect accumulating regions (H).

The positions of Hs can be freely determined by the population of the seeds. Sometimes plenty of isolated closed defect accumulating regions (H) are populated on a substrate (dot-like Hs). The shape of the closed defect accumulating regions (H) is determined by the shape of the seeds to some extent. The dotted closed defect accumulating regions (H) have various shapes.

A shape of a closed defect accumulating region (H) is amorphous on the surface.

Another shape of another closed defect accumulating region (H) is circular on the surface.

A further shape of another closed defect accumulating region (H) is polygonal on the surface.

Shapes of closed defect accumulating regions (H) depend upon shapes, seeds, crystal growth condition, and growth controlling condition.

[Population of Dislocation Density]

Dislocation density is not uniform in the $Al_xIn_yGa_{1-x-y}N$ crystal substrate produced by the teaching of the present invention. The dislocation density is measured at various spots in the grown $Al_xIn_yGa_{1-x-y}N$ crystal. An average of the dislocation density is less than $5 \times 10^6$ cm$^{-2}$ in the accompanying low dislocation single crystal regions (Z) and the extra low dislocation single crystal regions (Y).

The change of the dislocation density is examined more in detail.

Higher dislocation density of $1 \times 10^7$ cm$^{-2}$ to $3 \times 10^7$ cm$^{-2}$ is observed in the single crystal regions (Z) and (Y) at narrow parts which are quite close to the closed defect accumulating regions (H). Extremely low dislocation density of $5 \times 10^4$ cm$^{-2}$ is also observed in the single crystal regions (Z) and (Y) at the parts distanced far from the closed defect accumulating regions (H).

Average dislocation density gradually decreases in the regions (Z) and (Y) in proportion to the distance from the closed defect accumulating regions (H). The fact means that the captivity of the dislocations by the closed defect accumulating regions (H) is not perfect. Some dislocations leak and escape from the closed defect accumulating regions (H) toward the accompanying low dislocation single crystal regions (Z).

Transmission electron microscope (TEM) observation, cathode luminescence (CL) measurement and etch pit density (EPD) measurement enable us to estimate the dislocation density.

[Orientation of $Al_xIn_yGa_{1-x-y}N$ Substrate Crystal]

The effect of reducing the dislocation density depends upon the orientation of the $Al_xIn_yGa_{1-x-y}N$ crystal. The dislocation reduction of the present invention is most effective to an $Al_xIn_yGa_{1-x-y}N$ crystal having an average <0001> growing direction (c-axis growth). Dislocations are most conspicuously deduced when an average of the growing surfaces is a (0001) plane and the crystal is sliced to a C-plane crystal having a (0001) surface. The final surface of the sliced $Al_xIn_yGa_{1-x-y}N$ substrate crystal is a C-plane (0001).

[Direction of Dislocations]

The present invention makes an $Al_xIn_yGa_{1-x-y}N$ mixture crystal by maintaining facets and facet pits on the surface and growing $Al_xIn_yGa_{1-x-y}N$ along the c-axis. The bottoms of the facet pits are followed by the closed defect accumulating regions (H). The facets grow in the directions perpendicular to the facets. Dislocations on a facet are divided by half and pushed in the horizontal directions to two side boundaries of the facet. Horizontal arrows 98 and 99 in FIG. 4 (1) show the directions of the extensions of dislocations on the facets. The dislocations on the boundaries are gathered along the boundaries to the center of the pit. Namely, the dislocations on the facets are swept toward the centers of the facet pits. Thus, the facet pits have a centripetal function acting upon the dislocations. The centripetal function gathers the dislocations to the bottom of the pits. The gathered dislocations form the closed defect accumulating regions (H) accompanying the pit bottoms. Almost all of the dislocations in the accompanying low dislocation single crystal regions (Z) are centripetally and horizontally directed in parallel with the C-plane toward the closed defect accumulating regions (H).

[Direction of Closed Defect Accumulating Region (H)]

In the case of the average c-axis growth, the closed defect accumulating regions (H) extend along the c-axis which is perpendicular to the C-plane. The closed defect accumulating regions (H) span the thickness of the $Al_xIn_yGa_{1-x-y}N$ crystal. The closed defect accumulating regions (H) extend in parallel with the average direction of the growth. When the flat tops of the $Al_xIn_yGa_{1-x-y}N$ grown substrate are (0001) planes (C-planes), the closed defect accumulating regions (H) extend in the direction vertical to the surface.

The $Al_xIn_yGa_{1-x-y}N$ crystals grown by the present invention have rugged surfaces, since many facets and pits are positively produced for reducing dislocations. The rugged surfaces require mechanical grinding and polishing for making flat, smooth $Al_xIn_yGa_{1-x-y}N$ single crystal substrate wafers. In the case of the c-axis average growing direction, flat $Al_xIn_yGa_{1-x-y}N$ wafers of a (0001) surface are obtained. When the closed defect accumulating regions (H) are polycrystals and orientations of (H) are reversed by 180° in the c-axis from the surrounding (Z) (Y), obtained $Al_xIn_yGa_{1-x-y}N$ wafers have (000-1) surfaces (N surface) of (H) and (0001) surfaces (AlInGa surface) of (Y)(Z). In this case, after grinding, the (000-1) surface is a little lower than the surroundings, since the nitrogen surface is easier to be ground than the aluminum/indium/gallium surface.

[Patterns of Closed Defect Accumulating Regions (H)]

Periodically distributing patterns of closed defect accumulating regions (H) are again described more in detail.

An $Al_xIn_yGa_{1-x-y}N$ crystal of the present invention contains one fundamental unit (Q) or a plurality of fundamental units (Q). In the plural case, the $Al_xIn_yGa_{1-x-y}N$ crystal favorably contains regularly aligning repetitions of fundamental units (Q). A single fundamental unit (Q) consists of a closed defect accumulating region (H) extending in a direction vertical to the surface, an accompanying low dislocation single crystal region (Z) enclosing the closed defect accumulating region (H) and an extra low dislocation single crystal region (Y) lying around the accompanying low dislocation single crystal region (Z).

[Symmetry of Mask Patterns]

There are four allowable symmetric patterns in two dimensions.

α. six-fold rotation symmetry pattern (FIG. 8)
β. four-fold rotation symmetry pattern (FIG. 9)
γ. two-fold rotation symmetry pattern (FIG. 10)
δ. three-fold rotation symmetry pattern Seeds patterns α, β and γ have been repeatedly described. All the allowable patterns including δ are clarified here.

[α. Six-fold Rotation Symmetry Pattern (FIG. 8)]

Fundamental units (Q) consisting of a closed defect accumulating region (H), an accompanying low dislocation single crystal region (Z) and an extra low dislocation single crystal region (Y) are allocated at six-fold rotation symmetric spots, that is, at corner points of many equivalent equilateral triangles aligning hexagonally without extra margin. The alignment is a closest packed arrangement in two dimensions. Pits are not circles but dodecagons. But the following description deems the pit as a circle for simplicity. Neighboring pits are in outer contact to each other.

Figure 8:
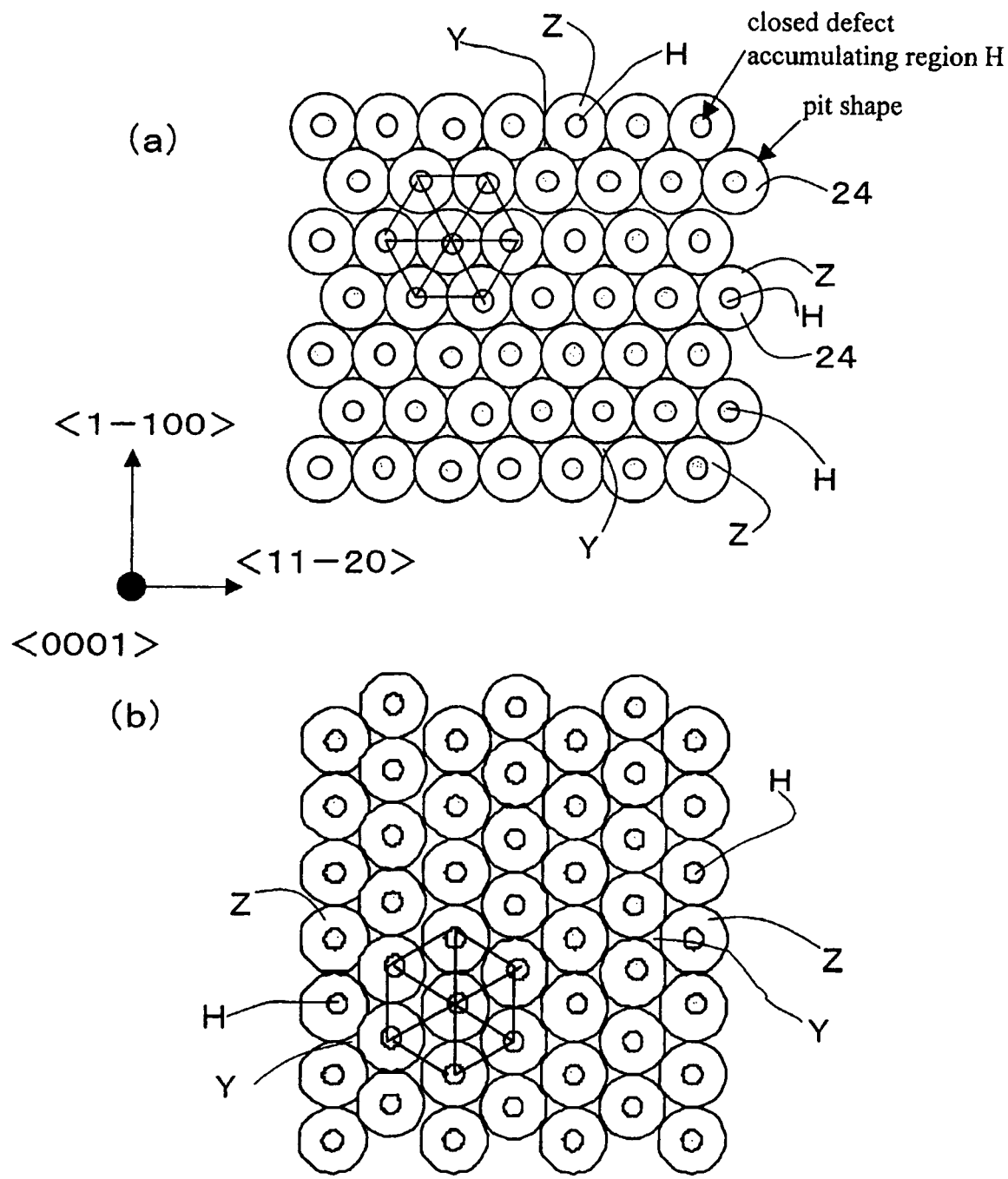
FIG. 8(a) is a plan CL (cathode luminescence) view of an $Al_xIn_yGa_{1-x-y}N$ mixture crystal substrate composed of fundamental units having H, Z and Y aligning in the six-fold rotation symmetry pattern with the shortest pitch direction parallel to a <11-20> direction.
FIG. 8(b) is a plan CL (cathode luminescence) view of an $Al_xIn_yGa_{1-x-y}N$ mixture crystal substrate composed of fundamental units having H, Z and Y aligning in the six-fold rotation symmetry pattern with the shortest pitch direction parallel to a <1-100> direction.

The pattern orientation can be determined by equalizing the direction of a side of the equilateral triangle or the direction of pitch p to a <1-100> direction of $Al_xIn_yGa_{1-x-y}N$ as shown in FIG. 8(*b*). The diameter of a pit is denoted by "d". Pitch of the seeds is denoted by "p". A "pitch direction" is defined as a direction parallel with a side of the fundamental triangle. The pattern gives p=d for the pit diameter d and pitch p. M-planes {1-00} are cleavage planes. The cleavage direction is a <11-20> direction.

The orientation of the seed pattern can be determined, for example, by equalizing the pitch direction "p"to a <11-20> direction of $Al_xIn_yGa_{1-x-y}N$. Pitch p is equal to the pit diameter d (p=d). The spacing h between parallel neighboring arrays of the closed defect accumulating regions (H) is short ($3^{1/2}$ d/2), when a grown, finished $Al_xIn_yGa_{1-x-y}N$ wafer is cleaved along a <11-20> direction (namely, along a (1-100) plane). In an array, a spacing between neighboring closed defect accumulating regions (H) is h=p. A period q perpendicular to the cleavage line is long (q=$3^{1/2}$ d).

Sectional areas of H, Z and Y are compared. A ratio of Z to Y is solely determined by the pit pattern. But, anther ratio between Z and H which are concentric with each other is not determined by the pattern. A radius ratio of Z to H is denoted by ξ(ξ>1).

$Z:H=\xi^2-1:1$ $Y:(H+Z)=2\times3^{1/2}-\pi:\pi=1:10$

The pattern minimizes the area of the extra low dislocation single crystal regions (Y) (about 9%). The extra low dislocation single crystal regions (Y) made by the C-plane growth have low electric conductivity. The pattern having the least ratio of Y is suitable for making conductive $Al_xIn_yGa_{1-x-y}N$ substrates.

[β. Four-fold Rotation Symmetry Pattern (FIG. 9)]

Fundamental units (Q) consisting of a closed defect accumulating region (H), an accompanying low dislocation single crystal region (Z) and an extra low dislocation single crystal region (Y) are allocated at four-fold rotation symmetric spots, that is, at corner points of many squares aligning lengthwise and crosswise without extra margin.

Figure 9:
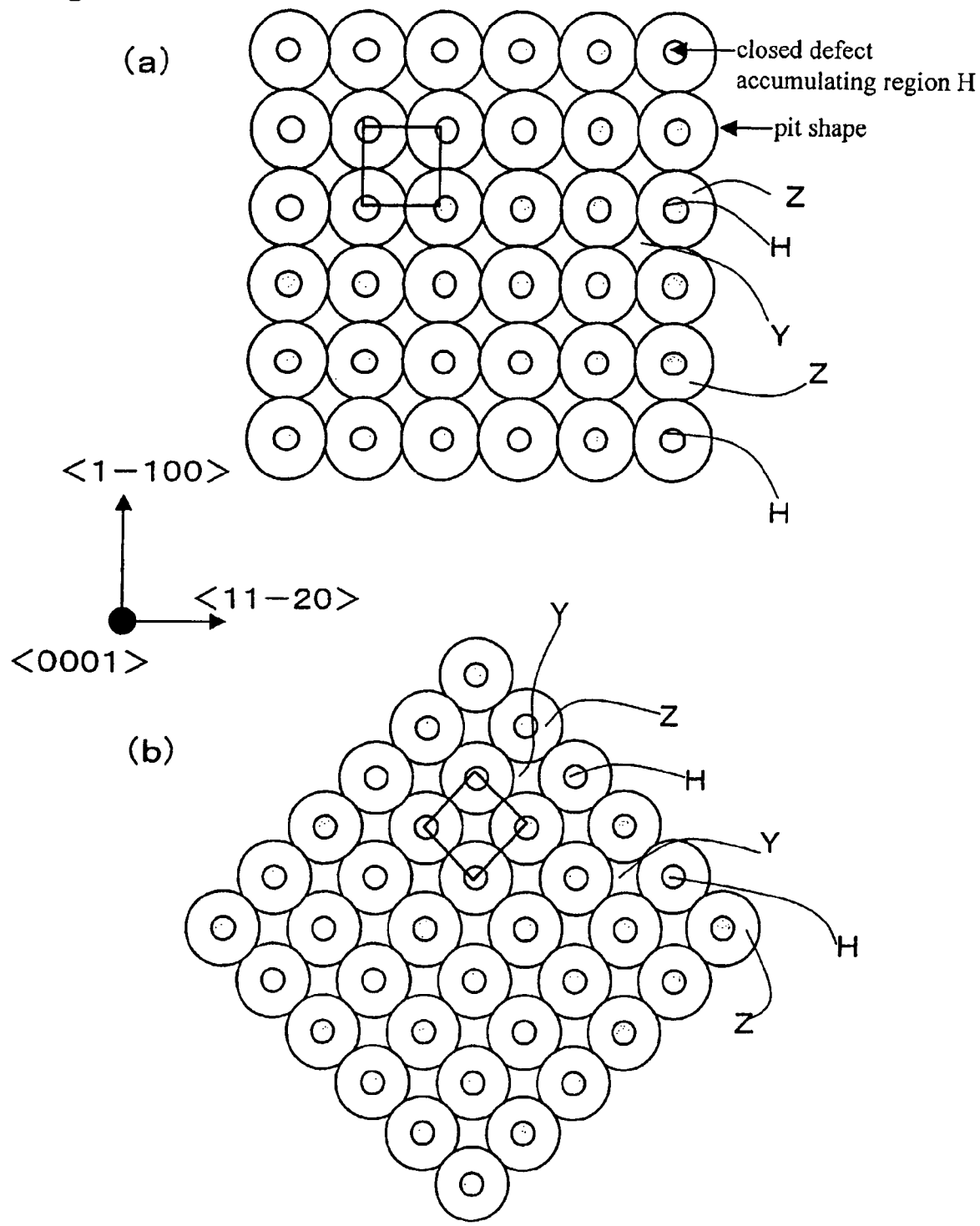
FIG. 9(a) is a plan CL (cathode luminescence) view of an $Al_xIn_yGa_{1-x-y}N$ mixture crystal substrate composed of fundamental units having H, Z and Y aligning in the four-fold rotation symmetry pattern with the shortest pitch direction parallel to a <1- 100> direction or a <11-20> direction.
FIG. 9(b) is a plan CL (cathode luminescence) view of an $Al_xIn_yGa_{1-x-y}N$ mixture crystal substrate composed of fundamental units having H, Z and Y aligning in the four-fold rotation symmetry pattern with an orthogonal lines parallel to a <1-100> direction or a <11-20> direction.

The pattern orientation can be determined by equalizing the direction of a side of the square to a <1-100> direction of $Al_xIn_yGa_{1-x-y}N$ as shown in FIG. 9(*a*). The pattern gives p=d for the pit diameter d and pitch p. M-planes {1-100} are cleavage planes. The cleavage direction is a <11-20> direction. When the $Al_xIn_yGa_{1-x-y}N$ crystal is cleaved in a <11-20> direction, a spacing h between serially neighboring closed defect accumulating regions (H) is smaller (h=d). Another spacing q between parallel neighboring closed defect accumulating regions (H) is also smaller (q=d).

Alternatively, the pattern orientation can be otherwise determined by inclining the direction of a side of the square at 45 degrees to a <1-100> direction of $Al_xIn_yGa_{1-x-y}N$ as shown in FIG. 9(*b*). The pattern gives p=d for the pit diameter d and pitch p. M-planes {1-100} are cleavage planes. The cleavage direction is a <11-20> direction. When the $Al_xIn_yGa_{1-x-y}N$ crystal is cleaved in a <11-20> direction, a spacing h between serially neighboring closed defect accumulating regions (H) is longer (h=$2^{1/2}$d). Another spacing q between parallel neighboring closed defect accumulating regions (H) is also small (q=$2^{1/2}$d).

Sectional areas of H, Z and Y are compared.

$$Z:H=\xi^2-1:1$$

$$Y:(H+Z)=4-\pi:\pi=1:3.66$$

Here, ξ is a rate of a radius of Z to a radius of H. The extra low dislocation single crystal regions (Y) are wider than the former pattern. The spacing between the neighboring closed defect accumulating regions (H) is also increased. The four-fold rotational symmetric pattern is optimum for producing square-shaped devices.

[γ. Two-fold Rotation Symmetry Pattern (FIG. 10)]

Fundamental units (Q) having a closed defect accumulating region (H), an accompanying low dislocation single crystal region (Z) and an extra low dislocation single crystal region (Y) are allocated at corners of basic rectangles which are disposed in a two-fold rotation symmetry pattern on an undersubstrate without extra space. ζ denotes a ratio of the longer side to the shorter side of the basic rectangles(ζ>1).

The pattern orientation can be specified by the direction of the shorter or longer side of the basic rectangles. An orientation of the pattern can be determined by equalizing a direction of a shorter side to a <11-20> direction of $Al_xIn_yGa_{1-x-y}N$ (FIG. 10(*a*)). A shorter pitch p is equal to the pit diameter (p=d). A longer pitch is ζd. When an $Al_xIn_yGa_{1-x-y}N$ of the pattern is cleaved along a <11-20> direction, a serial pitch h of the serially aligning closed defect accumulating regions (H) is shorter (h=d) and a parallel pitch q of the parallel aligning H is longer (q=ζd).

Figure 10:
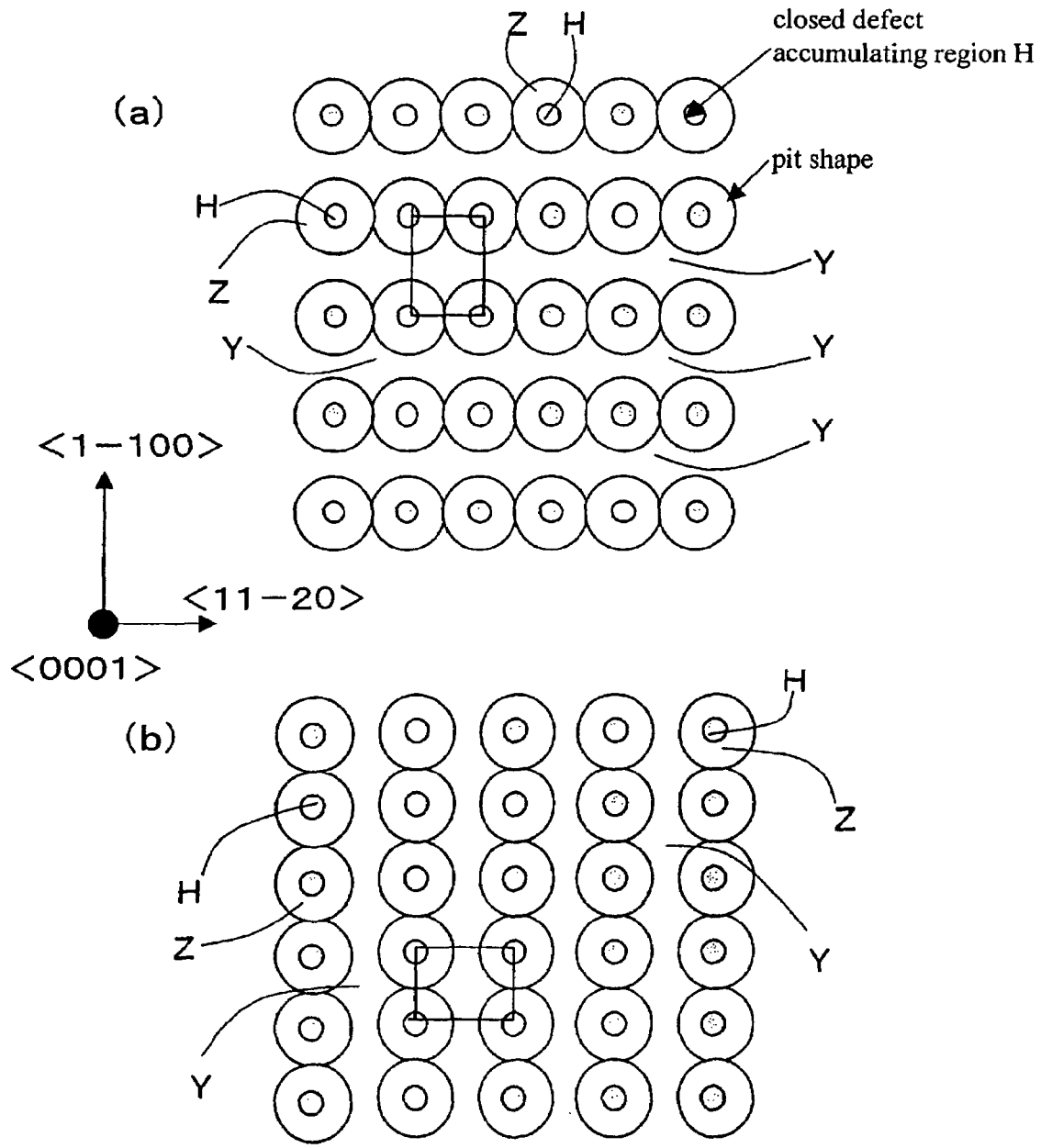
FIG. 10(a) is a plan CL (cathode luminescence) view of an $Al_xIn_yGa_{1-x-y}N$ mixture crystal substrate composed of fundamental units having H, Z and Y aligning in the two-fold rotation symmetry pattern with the shortest pitch direction parallel to a <11-20> direction.

Another orientation of the pattern can be determined by equalizing a direction of a shorter side to a <1-100> direction of $Al_xIn_yGa_{1-x-y}N$ (FIG. 10(*b*)). A shorter pitch p is equal to the pit diameter (p=d). A longer pitch is ζd. When an $Al_xIn_yGa_{1-x-y}N$ of the pattern is cleaved along a <11-20> direction, a serial pitch h of the serially aligning closed defect accumulating regions (H) is longer (h=ζd) and a parallel pitch q of the parallel aligning H is shorter (q=d).

Comparison of sectional areas of H, Z and Y are as follows, $$Z:H=\xi^2-1:1 \text{ (ξ is the ratio of the Z radius to the H radius.)}$$

$$Y:(H+Z)=4\zeta-\pi:\pi=1+4.66(\zeta-1):3.66$$

An area of the extra low dislocation single crystal regions (Y) is wide. The spacing between neighboring closed defect accumulating regions (H) is widened. This pattern is suitable for making square chip or rectangular chip devices.

[δ. Three-fold Rotation Symmetry Pattern]

Fundamental units (Q) consisting of a closed defect accumulating region (H), an accompanying low dislocation single crystal region (Z) and an extra low dislocation single crystal region (Y) are allocated at three-fold rotation symmetric spots, that is, at corner points of many equivalent equilateral hexagons aligning trigonally without extra margin. The pattern is not shown in a figure.

A pitch direction p is defined as a direction parallel to a side of the basic hexagon. An orientation of the three-fold pattern can be determined by equalizing the pitch direction "p" to a <1-100> direction of $Al_xIn_yGa_{1-x-y}N$. Another orientation of the three-fold pattern can be determined by equalizing the pitch direction "p" to a <11-20> direction of $Al_xIn_yGa_{1-x-y}N$.

Sectional areas of H, Z and Y are compared. A ratio of Z to Y is solely determined by the pit pattern. But, another ratio between Z and H which are concentric with each other is not determined by the pattern. A radius ratio of Z to H is denoted by ζ (ζ>1).

$$Z:H=\xi^2-1:1$$

$$Y:(H+Z)=3\times3^{1/2}-\pi:\pi=1:1.5$$

The pattern maximizes the area of the extra low dislocation single crystal regions (Y) (about 40%) which is about forth times as wide as the hexagonal pattern α. Wide extra low dislocation single crystal regions (Y) give high freedom of allocating chip areas on a $Al_xIn_yGa_{1-x-y}N$ wafer.

[Pitch of Closed Defect Accumulating Regions (H)]

A pitch which is a distance between central points of neighboring Hs is 50 μm to 2000 μm. The range originates from a restriction of making pits.

[Penetration of Closed Defect Accumulating Regions (H) into an $Al_xIn_yGa_{1-x-y}N$ Substrate]

An $Al_xIn_yGa_{1-x-y}N$ crystal made by the present invention has closed defect accumulating regions (H) extending long along a c-axis. Closed defect accumulating regions (H) penetrate the $Al_xIn_yGa_{1-x-y}N$ substrate along the c-axis.

An $Al_xIn_yGa_{1-x-y}N$ crystal made by growing in a c-axis direction has closed defect accumulating regions (H) extending long along the c-axis. The closed defect accumulating regions (H) penetrate the $Al_xIn_yGa_{1-x-y}N$ substrate in the direction of thickness from the top to the bottom.

Laser diode (LD) devices or light emitting diode (LED) devices can be made on an $Al_xIn_yGa_{1-x-y}N$ single crystal substrate prepared by the present invention. Since the $Al_xIn_yGa_{1-x-y}N$ single crystal substrate has low dislocation density and high conductivity, long lifetime and high quality laser diodes or light emitting diodes are obtained.

The present invention can be carried out by employing any one of an HVPE method, a CVD method, an MOC method and a sublimation method.

DETAILED DESCRIPTION OF THE PREFERRED EMBODIMENTS

Embodiment 1

Figure 11:
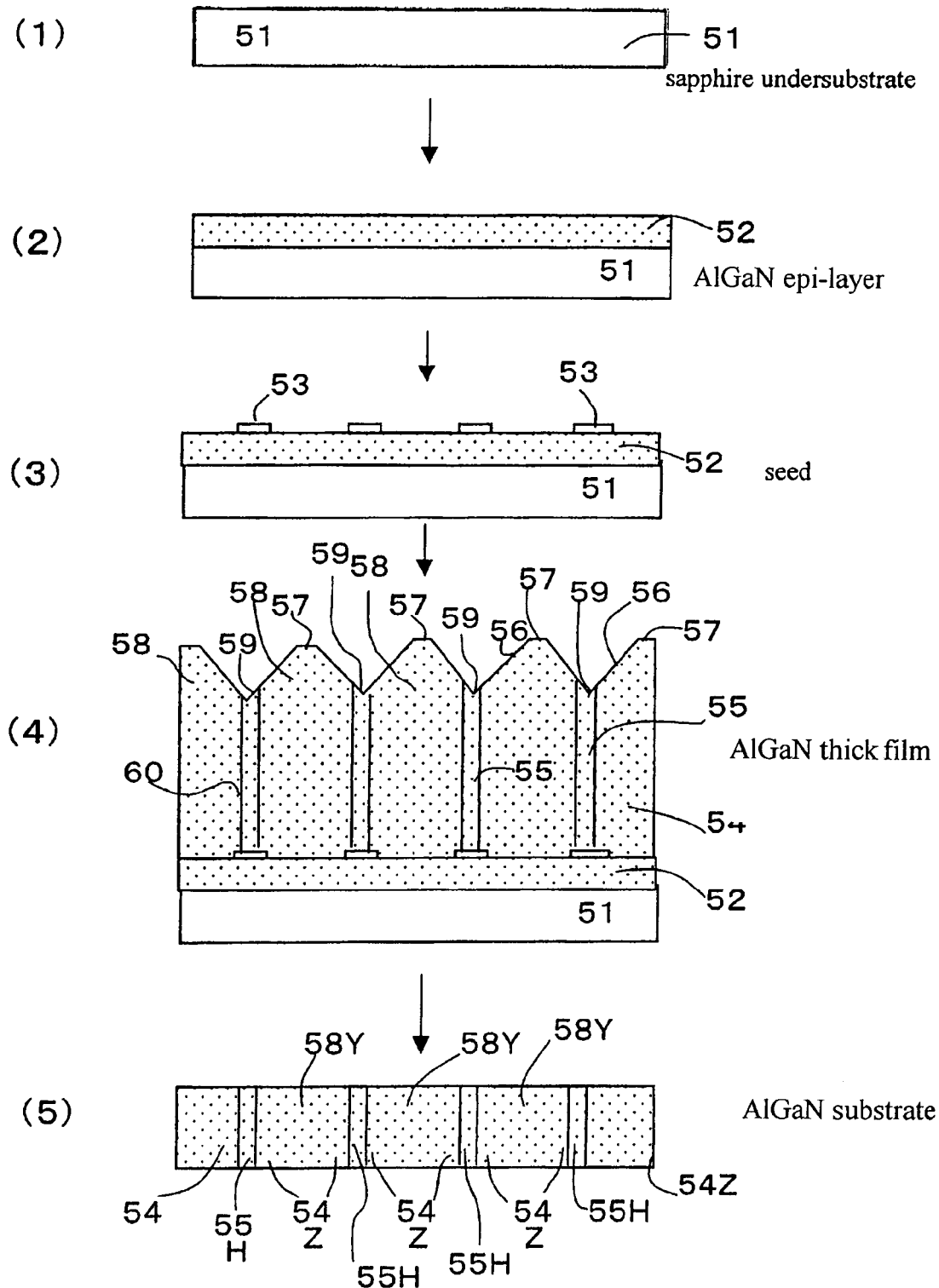
FIG. 11 is a series of sectional views of the steps of making an $Al_{0.8}Ga_{0.2}N$ mixture crystal substrate of Embodiment 1 of the present invention by preparing an undersubstrate, coating the undersubstrate with an $Al_{0.8}Ga_{0.2}N$ epi-layer, implanting seeds upon the epi-layer, growing a thick $Al_{0.8}Ga_{0.2}N$ mixture crystal on the condition of facet growing, forming facets and facet pits at the position of the seeds, producing closed defect accumulating regions (H) following bottoms of the pits, forming accompanying low dislocation single crystal regions (Z) surrounding the closed defect accumulating regions (H) just under the facets, forming extra low dislocation single crystal regions (Y) under C-plane growing tops, eliminating the facets and the undersubstrate by mechanical processing, and obtaining a flat, smooth $Al_{0.8}Ga_{0.2}N$ mixture crystal.

($Al_{0.8}Ga_{0.2}N$ made on Sapphire Undersubstrate, Samples A, B, C and D; FIG. 11)

FIG. 11 shows steps of making an $Al_{0.8}Ga_{0.2}N$ substrate as Embodiment 1. A starting undersubstrate is a sapphire C-plane wafer 51. FIG. 11(1) denotes the sapphire undersubstrate 51. Sapphire has trigonal symmetry. $Al_{0.8}Ga_{0.2}N$ has hexagonal symmetry. A "substrate" is different from an "undersubstrate", here. Don't confuse a "substrate" with an "undersubstrate". The undersubstrate is a starting plate. The substrate is a final product.

A 2 μm thick $Al_{0.8}Ga_{0.2}N$ epi-layer 52 is preliminarily made on the sapphire undersubstrate 51 by an MOCVD method. Samples have an $Al_{0.8}Ga_{0.2}N$ C-plane surface.

A 100 nm thick $SiO_2$ film is formed upon the $Al_{0.8}Ga_{0.2}N$ epi-layer 52 for distributing many seeds regularly and making a seed pattern on the epi-layer 52. The seed pattern 53 is a hexagonal pattern having many round dots 53 placed at corner points of equivalent equilateral triangles having a <11-20> side aligning in two dimensional directions without extra margin on the epi-layer. Seeds of $SiO_2$ in the predetermined pattern are formed by etching other parts of round dots allotted on the corner points of the basic triangles by photolithography. Remaining round dots are seeds 53. The seed pattern is called a DIS mask. The (DIS) seed pattern is hexagonal symmetry in accordance with hexagonal symmetry of $Al_{0.8}Ga_{0.2}N$.

Four different hexagonal symmetric seed patterns A, B, C and D with different diameters and pitches are made on the $Al_{0.8}Ga_{0.2}N$ layer. Diameters and pitches of the patterns are as follows. The pitch is a unit size of symmetry operation. Here, the pitch is a length of a side of basic equilateral triangles.

| Pattern A | dot diameter | 50 μm; | pitch | 400 μm |
| --- | --- | --- | --- | --- |
| Pattern B | dot diameter | 200 μm; | pitch | 400 μm |
| Pattern C | dot diameter | 2 μm; | pitch | 20 μm |
| Pattern D | dot diameter | 300 μm; | pitch | 2000 μm |

Undersubstrates having seed patterns A, B, C and D are named Undersubstrates A, B, C and D respectively.

(1) Growth of Sample A and Sample B ($Al_{0.8}Ga_{0.2}N$)

$Al_{0.8}Ga_{0.2}N$ crystals are grown on Undersubstrae A of Pattern A and on Undersubstrate B of Pattern B by an HVPE method. A vertically tall hot-wall furnace contains H2 gas, HCl gas and an $AlCl_3$ gas inlets at a top, a Ga-boat filled with metal Ga at an upper point and a susceptor at a lower spot for sustaining undersubstrates. Undersubstrate A or B is put upon the susceptor. $Al_{0.8}Ga_{0.2}N$ crystals are grown on the same condition on Undersubstrate A and Undersubstrate B.

The Ga-melt in the Ga-boat is supplied with hydrogen ($H_2$) gas and hydrochloride (HCl) gas through top gas inlets. The susceptor is supplied with hydrogen ($H_2$) gas, aluminum chloride gas ($AlCl_3$) and ammonia ($NH_3$) gas through other top gas inlets. Hydrogen ($H_2$) gas is a carrier gas.

In the furnace at atmospheric pressure, the Ga-boat is heated above 800° C. and the sapphire undersubstrate is heated and maintained at 1030° C. Molten Ga and HCl gas synthesizes gallium chloride (GaCl). Falling downward toward the sapphire undersubstrate, GaCl gas and $AlCl_3$ gas react with ammonia ($NH_3$) gas and synthesizes aluminum gallium nitride ($Al_{0.8}Ga_{0.2}N$; abbr. AlGaN). $Al_{0.8}Ga_{0.2}N$ is piled upon the $Al_{0.8}Ga_{0.2}N$ epi-layer 52 and the seed 53.

(Epitaxial Growth Condition)

| | |
| --- | --- |
| Growing temperature | 1030° C. |
| HCl partial pressure | 0.01 atm (1 kPa) |
| $NH_3$ partial pressure | 0.25 atm (25 kPa) |
| AlCl3 partial pressure | 0.04 atm (4 kPa) |
| Growth time | 18 hours |
| Layer thickness | 1000 μm |

The epitaxial growth makes Sample A having a 1000 μm thick $Al_{0.8}Ga_{0.2}N$ epi-layer on Pattern A and Sample B having a 1000 μm thick $Al_xIn_yGa_{1-x-y}N$ epi-layer on Pattern B. FIG. 11(4) shows sections of the samples.

[Observation of Sample A of $Al_{0.8}Ga_{0.2}N$ (SEM, TEM, CL)]

Samples A and B are examined by SEM (scanning electron microscope), TEM(transmission electron microscope) and CL (cathode luminescence). Sample A reveals reverse dodecagonal cone pits built by facets 56 prevalently distributing on the surface. The SEM confirms periodical, regular alignment of the pits on Sample A.

The alignment rule of the pits is equal to the rule of the seed pattern. The positions of the pit centers 59 exactly coincide with the initial positions of the seeds 53. There is a bottom (center) of a pit just above every seed. Pit centers align at corner points of many equilateral triangles repeatedly allotted on the sample. A side of the triangle is 400 μm. Namely, the pattern has a 400 μm pitch.

The diameter of a pit appearing on Sample A is about 400 μm. The diameter is equal to the pitch (d=p). The fact means that pits conically grow on the seeds and the pits are in contact with neighboring ones.

The observation means that the pits have grown on the ($SiO_2$) seeds 53 which were formed upon the corner points of basic equilateral triangles covering the undersubstrate without margin and aligning in hexagonal symmetry. FIG. 11(4) shows a reverse-conical pit, a closed defect accumulating region (H) 55 following a pit bottom 59 and a interface 60 enclosing the closed defect accumulating region (H) 55. Flat top parts 57 are formed between neighboring pits. C-plane grown flat tops 57 are asteroidal parts remaining among the pits.

Relations between grown $Al_{0.8}Ga_{0.2}N$ crystal parts and pits are described for promoting the understanding of the present invention. There are parts grown on seeded parts and other parts grown on non-seed parts. The parts grown on the seeded parts are closed defect accumulating regions (H) 55 and pit bottoms 59. The seed ($SiO_2$) retards $Al_{0.8}Ga_2N$ growth. The parts above the seeds grow at the slowest speed. The delay makes pits. Pits collect dislocations. Then, a closed defect accumulating region (H) is born at the seed following the pit bottom. While $Al_{0.8}Ga_{0.2}N$ grows, the closed defect accumulating region (H) extends upward, following the pit bottom. A pit bottom 59, a closed defect accumulating region (H) and a seed form a central unit vertically extending. A seed-guiding set of a pit, a closed defect accumulating region (H) and a seed is significant in the present invention.

Other regions grown under facets 56 are accompanying low dislocation single crystal regions (Z) 54. The regions are single crystals of low dislocation density. An accompanying low dislocation single crystal region (Z) concentrically encloses a closed defect accumulating region (H). A seed periphery, an accompanying low dislocation single crystal region (Z) and a facet form a tubular set of vertically stretching. Flat top parts 57 remain among pits. Regions grown under the flat top parts 57 are extra low dislocation single crystal regions (Y) 58. The regions are also single crystals with low dislocation density. A non-seeded part, an extra low dislocation single crystal region (Y) and a flat top form an extra set of vertically extending.

Electron microscope observations reveal that extra top parts 57 among dodecagonal pits are all mirror-flat (0001) planes. Facets in pits are assemblies of {11-22} planes and {1-101} planes. There are another sets of facets of milder slopes at the bottoms 59 of the pits.

Sample A is cleaved in a cleavage plane {1-100}. Sections of the pits appearing on the cleaved section are observed by the SEM and the CL.

The SEM and the CL observations confirm that unique parts discernible from other parts extend from the pit bottoms in a vertical direction. Vertically-extending parts (closed defect accumulating regions (H)) are 40 μm φ round dots. The closed defect accumulating regions (H) have a darker contrast than other parts in an CL image. Observation of cleaved sections shows the unique part (closed defect accumulating region (H)) extending in a vertical direction.

A columnar region just under a pit bottom is analyzed by the CL and the TEM. The under-bottom region is enclosed by a dark linear interface 60. The analysis reveals that the state of dislocations in the under-bottom region is entirely different from other parts. The under-bottom region is full of dislocations. Dislocation density is $10^8$ cm$^{-2}$ to $10^9$ cm$^{-2}$ in the under-bottom region. The dark linear boundary 60 which will be identified as a grain boundary (K) turns out to be an assembly of dislocations.

It is confirmed that the part 55 (core (S)) enclosed by the interface 60 (grain boundary (K)) is an assembly of crystal defects. This vertically extending part having three dimensional structure includes plenty of crystal defects and is enclosed by a clearly-observed interface (boundary (K)). Thus, the inner part is called a core (S). A sum of the core (S) and the boundary (K) is a closed defect accumulating region (H) (H=S+K). The closed defect accumulating region (H) has far more dislocations than other parts Z and Y. It is important to discriminate the closed defect accumulating region (H) from other parts Y and Z.

The closed defect accumulating region (H) is produced on the seed 53 in FIG. 11 (3). Thus, the positions of the closed defect accumulating regions (H) can be controlled by allocating the seeds at predetermined spots on a starting substrate. The present invention is endowed with a promising prospect and a wide utility by the controllability of the closed defect accumulating regions (H).

Attention is paid to other parts outside of the closed defect accumulating regions (H) which consists of an inner core (S) and a boundary (K). The dislocation density is very low outside of the boundary (K). The dislocation density drastically varies at the boundary (K). Outer parts quite close to the boundary (K) have medium high dislocation density of $10^6$ cm$^{-2}$ to $10^7$ cm$^{-2}$. The dislocation density rapidly decreases in proportion to the distance between H and a measuring spot. External parts outside of the boundary (K) have far lower dislocation density (e.g., $10^4$ cm$^{-2}$ to $10^5$ cm$^{-2}$) than the closed defect accumulating region (H). An average of the dislocation density is less than $5 \times 10^6$ cm$^{-2}$ in the outer single crystal regions (Z) and (Y). The dislocation density decreases in the outer single crystal regions (Z) and (Y) in proportion to the distance from the center 59 of the pits.

There is a small number of dislocations in the accompanying low dislocation single crystal regions (Z). Threading dislocations run in horizontal directions in parallel with C-plane. The dislocations centripetally converge to the closed defect accumulating region (H). The dislocation density in the accompanying low dislocation single crystal regions (Z) decreases along the direction of growth from the bottom to the top, since the dislocations are absorbed by the closed defect accumulating region (H).

The facts suggest that dislocations out of the closed defect accumulating region (H) are swept by the facets to the center of the pit and are accumulated at the interface. Thus, the dislocation density is low outside of the interface and high at the interface. Some of the gathered dislocations go into the core (S) and are arrested in the core (S).

Outer part of the closed defect accumulating regions (H) is divided into two different regions. One region 54 is made and qualified to low dislocation by a passage of facets 56. This region accompanies a closed defect accumulating region (H). The region 54 is an accompanying low dislocation single crystal region (Z).

The other region 58 is made by C-plane growth. This is a single crystal with low dislocation density. Although facets did not pass the region 58, the region is converted into low dislocation density by the influence of facets.

A plane cannot be fully covered with a set of equivalent circles or equivalent dodecagons without margin. Some portions remain uncovered with pits. The remainder is extra low dislocation single crystal regions (Y).

The whole surface (T) of the $Al_{0.8}Ga_{0.2}N$ crystal made by the present invention is a sum of closed defect accumulating regions (H), accompanying low dislocation single crystal regions (Z) and extra low dislocation single crystal regions (Y).

$T=H+Z+Y.$ $H=S+K.$

Definitions of significant parts promote the understanding of the structure of an $Al_{0.8}Ga_{0.2}N$ crystal of the present invention.

Attention is paid to a relation between the closed defect accumulating region (H) and the facets 56. Majority facets constructing pits are {11-22} planes and {1-101} planes Sometimes milder slanting facets appear at bottoms 59 of pits (FIG. 5($b$)(3)). What are the shallower, milder facets?

Analysis shows that the milder slanting facets are tops of a closed defect accumulating region (H). The milder facets are parts of a boundary (K). In Sample A, the milder facets lead the closed defect accumulating region (H).

The milder slanting lower facets 59 join lower end of the upper facets 56. The milder slanting lower facets 59 continue to the grain boundary (K) extending the c-axis direction at the periphery. The milder slanting lower facets 59 join the core extending in the c-axis direction at the center. The core (S) and the boundary (K) form a closed defect accumulating region (H). The core (S) has high dislocation density. {11-22} facets and {1-101} facets gather dislocations to the pit center bottom. The converged dislocations are partly annihilated and partly accumulated in the closed defect accumulating regions (H). Once accumulated dislocations cannot escape from the closed defect accumulating regions (H). Surrounding regions deprived of dislocations become accompanying low dislocation single crystal regions (Z) and extra low dislocation single crystal regions (Y).

Facet growth of the present invention makes facet pits at seeds on a GaN surface, produces closed defect accumulating regions (H) following pit bottoms, converges defects into the boundaries (K) or into the boundaries (K) and the core (S), and reduces dislocations in the surrounding regions around the closed defect accumulating regions (H).

[Observation of Sample B of $Al_{0.8}Ga_{0.2}N$ (SEM, TEM, CL)]

Sample B is examined by the SEM, TEM and CL. The result is similar to Sample A. But, closed defect accumulating regions (H) have about an 180 μm diameter which is far larger than Sample A (40 μm φ). The closed defect accumulating region (H) of Sample B is more than four times in diameter and 20 times in area as large as Sample A. The closed defect accumulating region (H) is columnar in three-dimensional shape but amorphous in two-dimensional shape.

Closed defect accumulating regions (H) of Sample B are examined. The closed defect accumulating region (H) turns out to be one or more than one single crystal grain of a slightly slanting orientation to the surrounding single crystals. A closed defect accumulating region (H) of Sample B includes dislocations, planar defects and slightly slanting grains.

[Processing of Sample A and Sample B]

$Al_{0.8}Ga_{0.2}N$ substrates of Sample A and Sample B should be mechanically processed. The bottom sapphire undersubstrate is ground away by mechanical grinding. The facetted rugged top surface is flattened by mechanical grinding. As-ground $Al_8Ga_{0.2}N$ wafers are further polished into flat, smooth transparent $Al_{0.8}Ga_{0.2}N$ substrates. 1 inch φ (2.5 cm φ) $Al_{0.8}Ga_{0.2}N$ substrate wafers are obtained. The $Al_{0.8}Ga_{0.2}N$ wafers are transparent for human eyesight like a glass plate. FIG. 11(5) shows a section of a CL(cathode luminescence) image of the $Al_{0.8}Ga_{0.2}N$ finished wafer. Closed defect accumulating regions (H) extend in the direction of thickness in the wafer and penetrate the wafer from the top to the bottom. The closed defect accumulating region (H) 55 regularly align with a certain pitch in two dimensional directions. The closed defect accumulating regions (H) are enclosed by the grain boundaries (K) 60. Accompanying low dislocation single crystal regions (Z) 54 encircle the closed defect accumulating regions (H) 55. Middle regions 58 between the neighboring closed defect accumulating regions (H) 55 are extra low dislocation single crystal regions (Y) 58.

Samples A and B are $Al_{0.8}Ga_{0.2}N$ substrates having C-plane surfaces. The wafers are flat and transparent. An optical microscope cannot discern inner structures. CL images show a history of growth by the variations of contrasts. A CL picture irradiated with 360 nm wavelength light which is nearly equal to the band gap of $Al_{0.8}Ga_{0.2}N$ indicates inner structures of the wafer. The CL picture shows that closed defect accumulating regions (H) align with a 400 μm pitch which is the same pitch as seeds 53.

In the CL picture, closed defect accumulating regions (H) take dark contrast in many cases. But, closed defect accumulating regions (H) take bright contrast in the CL image in some cases. The closed defect accumulating regions (H) can be determined as a dark contrast or a bright contrast in the CL image.

The CL image shows a closed defect accumulating region (H) made by the facets 56 as a dodecagonal bright contrast part.

The extra low dislocation single crystal regions (Y) under the flat tops are dark contrast parts in a CL picture. The region Y is formed by the C-plane growth. Namely, H is mainly dark and sometimes bright, Z is bright and Y is dark in the CL picture. The CL facilely discerns the closed defect accumulating regions (H), the accompanying low dislocation single crystal regions (Z) and the extra low dislocation single crystal regions (Y).

Extending along a c-axis, the closed defect accumulating regions (H) are perpendicular to the surfaces of the $Al_{0.8}Ga_{0.2}N$ substrate and penetrate the $Al_{0.8}Ga_{0.2}N$ substrate. Sometimes, surfaces of the (H)s have little hollows. It was found that Sample A had hollows of 0.3 μm depth at the (H)s. This seems to be caused from a little difference of a grinding speed in (H)s from other parts.

Since the finished $Al_{0.8}Ga_{0.2}N$ substrate wafers are flat and smooth, the measurement of threading dislocation density is easy. Dislocations can be observed by the CL, the etch pit measurement, and the TEM. The observation on a CL picture is the easiest.

In the CL image, thread dislocations appear as dark points. Samples A and B show convergence of thread dislocations in the cores (S) and linear aggregation of dislocations on the boundaries (K) of the closed defect accumulating regions (H). The linear aggregation on the boundary (K) corresponds to a planar defect in a three dimensional space. The closed defect accumulating regions (H) are discernible by dark closed encircling boundaries (K) in the CL image.

The closed defect accumulating regions (H) are 40 μm φ dots (seed is 50 μm φ) in Sample A. The shapes are rectangular or amorphous. The closed defect accumulating regions (H) are 180 μm φ dots (seed is 200 μm φ) in Sample B. The shapes are circularly amorphous. Only difference between Sample A and Sample B is diameters of the closed defect accumulating regions (H). The observation confirms that the sizes of the closed defect accumulating regions (H) are predetermined by sizes of seeds. A bigger seed creates a bigger closed defect accumulating region (H). A smaller closed defect accumulating region (H) originates from a smaller seed.

Both in Sample A and Sample B, closed defect accumulating regions (H) have high dislocation density. Outside of H, dislocation density rapidly decreases in proportion to the distance from the boundary (K). In some cases, dislocations suddenly reduce outside of the boundary (K). Average dislocation density is less than $5\times10^6$ cm$^{-2}$ in the accompanying low dislocation single crystal regions (Z) and the extra low dislocation single crystal regions (Y). Dislocations centripetally run in parallel to the C-plane in the accompanying low dislocation single crystal regions (Z) and the extra low dislocation single crystal regions (Y). Dislocations are gathered, absorbed, annihilated and arrested in K and H. Thus, the dislocations are reduced in the surrounding regions Z and Y.

Sample A and Sample B are heated and etched in a KOH solution. In Sample B, there are parts which are subject to be etched in the closed defect accumulating regions (H). The accompanying low dislocation single crystal regions (Z) and the extra low dislocation single crystal regions (Y) have high resistance against etching. The closed defect accumulating regions (H) have etchable parts and unetchable parts. (0001) AlGa planes which have only Ga and Al atoms exposed on the surface are unetchable. (000-1)N planes which have only N atoms exposed on the surface are etchable. The fact indicates that the accompanying low dislocation single crystal regions (Z) and the extra low dislocation single crystal regions (Y) have stronger (0001)AlGa planes on the surface. On the contrary, the closed defect accumulating regions (H) have partly (0001) AlGa surfaces and partly (000-1)N surfaces. The fact indicates that a part of the closed defect accumulating regions (H) has a reverse polarity <000-1> and the other part has a normal polarity <0001> common with the surrounding (Y) and (Z) in Sample B.

Further, observations on Sample A reveal that most of the closed defect accumulating region (H) surfaces become hollow by the KOH solution etching. And analyses by TEM observations showed that most of the closed defect accumulating regions (H) of Sample A are single crystals having the reversed orientation of 180° to a <0001> direction of the surrounding single crystal parts (Z), (Y). In other words, surfaces of the surrounding single crystal parts (Z), (Y) turn out to be unetchable AlGa planes (0001) and surfaces of (H) turn out to be etchable N planes (000-1) in Sample A. More detailed analyses clarified that many closed defect accumulating regions (H) in Sample A have a plurality of crystal particles of the reversed orientation to <0001>.

From the results, the inventors supposed that as growing the crystal of Sample A, shallower facets of pits in Sample A corresponding to the closed defect accumulating regions (H) have plane indices of {11-2-4}, {11-2-5}, {11-2-6}, {1-10-2}, {1-10-3}, and {1-10-4}.

Sample A $Al_{0.8}Ga_{0.2}N$ substrate (50 μm φ seeds) and Sample B $Al_{0.8}Ga_{0.2}N$ substrate (200 μm φ seeds) have a common property except the size of the closed defect accumulating regions (H). Sample A (50 μm φ seeds) has about 40 μm φ closed defect accumulating regions (H). Sample B (200 μm φ seeds) has about 180 μm φ closed defect accumulating regions (H). More effective exploitation requires narrower closed defect accumulating regions (H), wider accompanying low dislocation single crystal regions (Z) and wider extra low dislocation single crystal regions (Y).

Smaller seeds produce smaller closed defect accumulating regions (H). But, an excess small seed cannot make a closed defect accumulating region (H). Without the formation of the closed defect accumulating regions (H), dislocation density cannot be reduced in the single crystal portions (Z, Y). Thus, a seed should have a diameter larger than a definite lower limit. The lower limit should be determined for seeding.

[Growth of Sample C on Undersubstrate C(Sapphire Substrate, 2 μm φ seeds, 20 μm Pitch)]

Undersubstrate C employs a hexagonal symmetric seed pattern of FIG. 8(a) arranging many equilateral triangles of a 20 μm side and allotting 2 μm φ seeds ($SiO_2$) on corners of the equilateral triangles. Undersubstrate C is prepared by implanting $SiO_2$ seeds on a sapphire substrate. Undersubstrate C shows small seeds and small pitch repetitions for clarifying the lowest limit of seeds and pitch. Like Samples A and B, Sample C had at first been grown by an HVPE method by the same facet growth condition. But, the 2 μm φ ($SiO_2$) seeds fully were buried by $Al_{0.8}Ga_{0.2}N$ at an early stage. No closed defect accumulating region (H) was produced from the seed. Facet pits were made. The facet pits were vacant pits without closed defect accumulating regions (H). The seeds could not determine the positions of facet pits. Positions of pits were uncontrollable by the HVPE.

Then, an MOCVD method is employed instead of the HVPE method. The MOCVD has a slower growing speed than the HVPE method. A slow growth speed will enable facet pits to rise from the ($SiO_2$) seeds.

The MOCVD employs Ga-containing and Al-containing metallorganic materials as a Ga-source and an Al-source instead of Ga-metal and $AlCl_3$ gas. Material gases are trimethylgallium (TMG;$(CH_3)_3Ga$), trimethylaluminum (TMA; $(CH_3)_3Al$), ammonia ($NH_3$) and hydrogen ($H_2$) in the MOCVD.

An $Al_{0.8}Ga_{0.2}N$ crystal is made by setting the seed-implanted sapphire undersubstrate (Undersubstrate C) on a susceptor in a cold-wall furnace, heating the undersubstrate at 1030° C., supplying the material gases in a rate of TMG: TMA:$NH_3$=2:8:25000 at atmospheric pressure, and growing an $Al_{0.8}Ga_{0.2}N$ film on the seeded sapphire undersubstrate. The growing speed is 3 μm/h. The growing time is 30 hours. The thickness of the produced $Al_{0.8}Ga_{0.2}N$ film (Sample C) is about 90 μm.

The MOCVD enables the seeds to induce facet pits and the facet pits to make closed defect accumulating regions (H).

Sample C has small seeds of a 2 μm diameter which induces a 1 μm φ closed defect accumulating region (H) accompanying a pit bottom. In Sample C, the seeds can determine sizes and positions of the closed defect accumulating regions (H).

An accompanying low dislocation single crystal region (Z) grows under the facets 56. A small facet pit makes a small round accompanying low dislocation single crystal region (Z). TEM examination confirmed that a part Z is a single crystal with low dislocation density. The flat tops 57(C-plane) produced extra low dislocation single crystal regions (Y). TEM confirmed that a part Y is a single crystal with low dislocation density. Sample C has a feature of very small closed defect accumulating regions (H). Although the HVPE method is impossible, the MOCVD method can achieve the purpose of making a single crystal with low dislocation density through making regularly distributed closed defect accumulating regions (H) in accordance with the distribution of seeds.

[Growth of Sample D (300 μm φ Seeds, 2000 μm Pitch)]

Sample D employs a hexagonal symmetric seed pattern of FIG. 8(a) arranging large equilateral triangles of a 2000 μm side and allotting big 300 μm φ seeds ($SiO_2$) on corners of the equilateral triangles. Sample D is an example having the largest seeds and widest pitch. Sample D is made by the HVPE method like Samples A and B. The conditions of the HVPE are,

| | |
|---|---|
| Growing temperature | 1050° C. |
| $NH_3$ partial pressure | 0.3 atm (30 kPa) |
| HCl partial pressure | 0.01 atm (1 kPa) |
| $AlCl_3$ partial pressure | 0.04 atm (4 kPa) |
| Growing time | 40 hours. |

The growth gives Sample D a 3.5 mm thick $Al_{0.8}Ga_{0.2}N$ crystal on the sapphire undersubstrate. Sample D reveals many dodecagonal reverse-cone pits. Closed defect accumulating regions (H) are regularly distributed in coincidence with the positions of the ($SiO_2$) seeds 53 implanted on the sapphire undersubstrate.

Some pits are distorted. Extra small pits which do not correspond with the seeds appear. Sample D shows weak controllability of seed positions.

Almost all of the closed defect accumulating regions (H) align at the predetermined positions spaced by a 2000 μm pitch in the same pattern as the initial seed pattern. The regularly aligning pits have about a 2000 μm diameter which is nearly equal to the pitch. Some pits on the seeds are 2000 μm φ diameter regular dodecagonal cones. Other pits on the seeds are 200 μm φ small pits with distorted shapes. Dislocation density is high in the closed defect accumulating regions (H).

Some closed defect accumulating regions (H) are distorted. But, almost all of the closed defect accumulating regions (H)

are arranged at predetermined seeded spots in Sample D. Accompanying low dislocation single crystal regions (Z) and extra low dislocation single crystal regions (Y) made around the closed defect accumulating regions (H) at the regular seeded spots have low dislocation density of less than $5 \times 10^6$ cm$^{-2}$. Small number of closed defect accumulating regions (H) appear at unseeded spots. Narrow portions surrounding the unseeded closed defect accumulating regions (H) are not of low dislocation density.

Experiments of Samples A, B, C and D clarify optimum ranges of parameters;
Diameter of closed defect accumulating regions (H)=1 μm~200 μm
Diameter of seeds=2 μm~300 μm
Pitch of closed defect accumulating regions (H)=20 μm~2000 μm.

The above values of the parameters enable the present invention to make a low dislocation density $Al_{0.8}Ga_{0.2}N$ single crystal.

Embodiment 2

Figure 12:
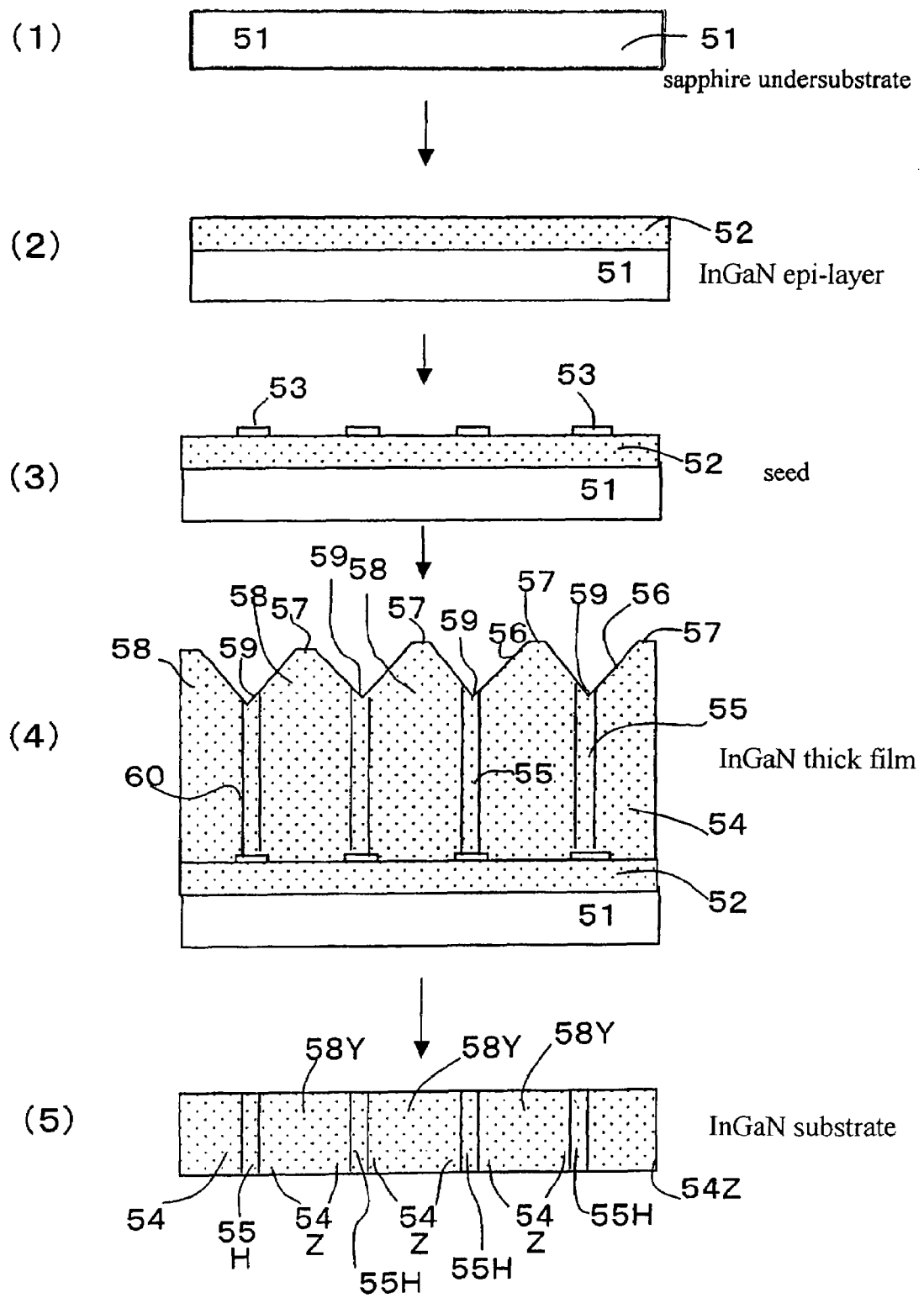
FIG. 12 is a series of sectional views of the steps of making an $In_{0.9}Ga_{0.1}N$ mixture crystal substrate of Embodiment 2 of the present invention by preparing an undersubstrate, coating the undersubstrate with an $In_{0.9}Ga_{0.1}N$ epi-layer, implanting seeds upon the epi-layer, growing a thick $In_{0.9}Ga_{0.1}N$ mixture crystal on the condition of facet growing, forming facets and facet pits at the position of the seeds, producing closed defect accumulating regions (H) following bottoms of the pits, forming accompanying low dislocation single crystal regions (Z) surrounding the closed defect accumulating regions (H) just under the facets, forming extra low dislocation single crystal regions (Y) under C-plane growing tops, eliminating the facets and the undersubstrate by mechanical processing, and obtaining a flat, smooth $In_{0.9}Ga_{0.1}N$ mixture crystal.

($In_{0.9}Ga_{0.1}N$ on Sapphire Undersubstrate, FIG. 12)

FIG. 12 shows steps of making an $In_{0.9}Ga_{0.1}N$ substrate as Embodiment 2. A starting undersubstrate is a sapphire C-plane wafer 51. FIG. 12(1) denotes the sapphire undersubstrate 51. Sapphire has trigonal symmetry. $In_{0.9}Ga_{0.1}N$ has hexagonal symmetry.

A 2 μm thick $In_{0.9}Ga_{0.1}N$ epi-layer 52 is preliminarily made on the sapphire undersubstrate 51 by an MOCVD method. Samples have an $In_{0.9}Ga_{0.1}N$ C-plane surface.

A 100 nm thick $SiO_2$ film is formed upon the $In_{0.9}Ga_{0.1}N$ epi-layer 52 for distributing many seeds regularly and making a seed pattern on the epi-layer 52. The seed pattern 53 is a hexagonal pattern having many round dots 53 placed at corner points of equivalent equilateral triangles having a <11-20> side aligning in two dimensional directions without extra margin on the epi-layer. Seeds of $SiO_2$ in the predetermined pattern are formed by etching other parts of round dots allotted on the corner points of the basic triangles by photolithography. Remaining round dots are seeds 53. The seed pattern is called a DIS mask. The (DIS) seed pattern is hexagonal symmetry in accordance with hexagonal symmetry of $In_{0.9}Ga_{0.1}N$.

Four different hexagonal symmetric seed patterns A, B, C and D with different diameters and pitches are made on the $In_{0.9}Ga_{0.1}N$ layer like Embodiment 1. Diameters and pitches of the patterns are as follows. The pitch is a unit size of symmetry operation. Here, the pitch is a length of a side of basic equilateral triangles.

(Seed Patterns)

| Pattern A | dot diameter | 50 μm; | pitch | 400 μm |
|---|---|---|---|---|
| Pattern B | dot diameter | 200 μm; | pitch | 400 μm |
| Pattern C | dot diameter | 2 μm; | pitch | 20 μm |
| Pattern D | dot diameter | 300 μm; | pitch | 2000 μm |

The above four seed patterns A to D are the same as the patterns defined in Embodiment 1. The sapphier undersubstrates coated with Patterns A, B, C and D are called Undersubstrates A, B, C and D. InGaN Specimens grown on Undersubstrates A, B, C and D are named Samples E, F, G and I respectively.

(1) Growth of Samples E and F ($In_{0.9}Ga_{0.1}N$; FIG. 12)

$In_{0.9}Ga_{0.1}N$ crystals are grown on Undersubstrate A of Pattern A and on Undersubstrate B of Pattern B by an HVPE method. A vertically tall hot-wall furnace contains H2-, HCl— NH3- gas inlets at the top, a partitioned boat having a Ga-boat filled with metal Ga and an In-boat filled with metal In at upper points and a susceptor at a lower spot for sustaining samples. Undersubstrate A or B is put upon the susceptor. $In_{0.9}Ga_{0.1}N$ crystals are grown on the same condition on Undersubstrate A and Undersubstrate B.

The Ga-melt in the Ga-boat and the In-metal in the In-boat are supplied with hydrogen ($H_2$) gas and hydrochloride (HCl) gas through a top gas inlet. The susceptor is supplied with hydrogen ($H_2$) gas and ammonia ($NH_3$) gas through another top gas inlet. Hydrogen ($H_2$) gas is a carrier gas.

In the furnace at atmospheric pressure, the partitioned boat with the In-boat and the Ga-boat is heated above 800° C. and the sapphire undersubstrate is heated and maintained at 680° C. Molten Ga and HCl gas synthesize gallium chloride (GaCl). Molten In and HCl gas synthesize indium chloride (InCl). Falling downward toward the sapphire undersubstrate, GaCl gas and InCl gas reacts with ammonia ($NH_3$) gas and synthesizes indium gallium nitride ($In_{0.9}Ga_{0.1}N$; abbr. InGaN). $In_{0.9}Ga_{0.1}N$ is piled upon the $In_{0.9}Ga_{0.1}N$ epi-layer 52 and the seed 53.

(Epitaxial Growth Condition)

| | |
|---|---|
| Growing temperature | 680° C. |
| HCl partial pressure(In-boat) | 0.02 atm (2 kPa) |
| HCl partial pressure(Ga-boat) | 0.002 atm (0.2 kPa) |
| $NH_3$ partial pressure | 0.25 atm (25 kPa) |
| Growth time | 35 hours |
| Layer thickness | 800 μm |

The epitaxial growth makes Sample E having an 800 μm thick $In_{0.9}Ga_{0.1}N$ epitaxial-layer on Undersubstrate A and Sample F having an 800 μm thick $In_{0.9}Ga_{0.1}N$ epitaxial-layer on Undersubstrate B. FIG. 12(4) shows sections of the samples.

[Observation of Sample E of $In_{0.9}Ga_{0.1}N$ (SEM, TEM, CL)]

Samples E and F are examined by SEM (scanning electron microscope), TEM(transmission electron microscope) and CL (cathode luminescence). Sample E reveals reverse dodecagonal cone pits built by facets 56 prevalently distributing on the surface. The SEM confirms periodical, regular alignment of the pits on Sample E.

The alignment rule of the pits is equal to the rule of the seed pattern. The positions of the pit centers 59 exactly coincide with the initial positions of the seeds 53. There is a bottom (center) of a pit just above every seed. Pit centers align at corner points of many equilateral triangles repeatedly allotted on the sample. A side of the triangle is 400 μm. Namely, the pattern has a 400 μm pitch.

The diameter of a pit appearing on Sample E is about 400 μm. The diameter is equal to the pitch (d=p). The fact means that pits conically grow on the seeds and the pits are in contact with neighboring ones.

The observation means that the pits have grown on the ($SiO_2$) seeds 53 which were formed upon the corner points of basic equilateral triangles covering the undersubstrate without margin and aligning in hexagonal symmetry. FIG. 12(4) shows a reverse-conical pit, a closed defect accumulating region (H) 55 following a pit bottom 59 and a interface 60 enclosing the closed defect accumulating region (H) 55. Flat top parts 57 are formed between neighboring pits. C-plane grown flat tops 57 are asteroidal parts remaining among the pits.

Relations between grown $In_{0.9}Ga_{0.1}N$ crystal parts and pits are described for promoting the understanding of the present invention. There are parts grown on seeded parts and other parts grown on non-seed parts. The parts grown on the seeded parts are closed defect accumulating regions (H) 55 and pit bottoms 59. The seed ($SiO_2$) retards $In_{0.9}Ga_{0.1}N$ growth. The parts above the seeds grow at the slowest speed. The delay makes pits. Pits collect dislocations. Then, a closed defect accumulating region (H) is born at the seed following the pit bottom. While $In_{0.9}Ga_{0.1}N$ grows, the closed defect accumulating region (H) extends upward, following the pit bottom. A pit bottom 59, a closed defect accumulating region (H) and a seed form a central unit vertically extending. A seed-guiding set of a pit, a closed defect accumulating region (H) and a seed is significant in the present invention.

Other regions grown under facets 56 are accompanying low dislocation single crystal regions (Z) 54. The regions are single crystals of low dislocation density. An accompanying low dislocation single crystal region (Z) concentrically encloses a closed defect accumulating region (H). A seed periphery, an accompanying low dislocation single crystal region (Z) and a facet form a tubular set of vertically stretching. Flat top parts 57 remain among pits. Regions grown under the flat top parts 57 are extra low dislocation single crystal regions (Y) 58. The regions are also single crystals with low dislocation density. A non-seeded part, an extra low dislocation single crystal region (Y) and a flat top form an extra set of vertically extending.

Electron microscope observations reveal that extra top parts 57 among dodecagonal pits are all mirror-flat (0001) planes. Facets in pits are assemblies of {11-22} planes and {1-101} planes. There are another sets of facets of milder slopes at the bottoms 59 of the pits.

Sample E is cleaved in a cleavage plane {1-100}. Sections of the pits appearing on the cleaved section are observed by the SEM and the CL.

The SEM and the CL observations confirm that unique parts discernible from other parts extend from the pit bottoms in a vertical direction. Vertically-extending parts (closed defect accumulating regions (H)) are 40 μm φ round dots. The closed defect accumulating regions (H) have a darker contrast than other parts in an CL image. Observation of cleaved sections shows the unique part (closed defect accumulating region (H)) extending in a vertical direction.

A columnar region just under a pit bottom is analyzed by the CL and the TEM. The under-bottom region is enclosed by a dark linear interface 60. The analysis reveals that the state of dislocations in the under-bottom region is entirely different from other parts. The under-bottom region is full of dislocations. Dislocation density is $10^8$ $cm^{-2}$ to $10^9$ $cm^{-2}$ in the under-bottom region. The dark linear boundary 60 which will be identified as a grain boundary (K) turns out to be an assembly of dislocations.

It is confirmed that the part 55 (core (S)) enclosed by the interface 60 (grain boundary (K)) is an assembly of crystal defects. This vertically extending part having three dimensional structure includes plenty of crystal defects and is enclosed by a clearly-observed interface (boundary (K)). Thus, the inner part is called a core (S). A sum of the core (S) and the boundary (K) is a closed defect accumulating region (H) (H=S+K). The closed defect accumulating region (H) has far more dislocations than other parts Z and Y. It is important to discriminate the closed defect accumulating region (H) from other parts Y and Z.

The closed defect accumulating region (H) is produced on the seed 53 in FIG. 11 (3). Thus, the positions of the closed defect accumulating regions (H) can be controlled by allocating the seeds at predetermined spots on a starting substrate. The present invention is endowed with a promising prospect and a wide utility by the controllability of the closed defect accumulating regions (H).

Attention should be paid to other parts outside of the closed defect accumulating regions (H) which consists of an inner core (S) and a boundary (K). The dislocation density is very low outside of the boundary (K). The dislocation density drastically varies at the boundary (K). Outer parts quite close to the boundary (K) have medium high dislocation density of $10^6$ $cm^{-2}$ to $10^7$ $cm^{-2}$. The dislocation density rapidly decreases in proportion to the distance between H and a measuring spot. External parts outside of the boundary (K) have far lower dislocation density (e.g., $10^4$ $cm^{-2}$ to $10^5$ $cm^{-2}$) than the closed defect accumulating region (H). An average of the dislocation density is less than $5\times10^6$ $cm^{-2}$ in the outer single crystal regions (Z) and (Y). The dislocation density decreases in the outer single crystal regions (Z) and (Y) in proportion to the distance from the center 59 of the pits.

There is a small number of dislocations in the accompanying low dislocation single crystal regions (Z). Threading dislocations run in horizontal directions in parallel with C-plane. The dislocations centripetally converge to the closed defect accumulating region (H). The dislocation density in the accompanying low dislocation single crystal regions (Z) decreases along the direction of growth from the bottom to the top, since the dislocations are absorbed by the closed defect accumulating region (H).

The facts suggest that dislocations out of the closed defect accumulating region (H) are swept by the facets to the center of the pit and are accumulated at the interface. Thus, the dislocation density is low outside of the interface and high at the interface. Some of the gathered dislocations go into the core (S) and are arrested in the core (S).

Outer part of the closed defect accumulating regions (H) is divided into two different regions. One region 54 is made and qualified to low dislocation by a passage of facets 56. This region accompanies a closed defect accumulating region (H). The region 54 is an accompanying low dislocation single crystal region (Z).

The other region 58 is made by C-plane growth. This is a single crystal with low dislocation density. Although facets did not pass the region 58, the region is converted into low dislocation density by the influence of facets.

A plane cannot be fully covered with a set of equivalent circles or equivalent dodecagons without margin. Some portions remain uncovered with pits. The remainder is extra low dislocation single crystal regions (Y).

The whole surface (T) of the $In_{0.9}Ga_{0.1}N$ crystal made by the present invention is a sum of closed defect accumulating regions (H), accompanying low dislocation single crystal regions (Z) and extra low dislocation single crystal regions (Y).

$$T=H+Z+Y.$$

$$H=S+K.$$

Definitions of significant parts promote the understanding of the structure of an InGaN crystal of the present invention.

Attention should be paid to a relation between the closed defect accumulating region (H) and the facets 56. Majority facets constructing pits are {11-22} planes and {1-101} planes. Sometimes milder slanting facets appear at bottoms 59 of pits (FIG. 5(b)(3)). What are the shallower, milder facets?

Analysis shows that the milder slanting facets are tops of a closed defect accumulating region (H). The milder facets are parts of a boundary (K). In Sample A, the milder facets lead the closed defect accumulating region (H).

The milder slanting lower facets 59 join lower end of the upper facets 56. The milder slanting lower facets 59 continue to the grain boundary (K) extending the c-axis direction at the periphery. The milder slanting lower facets 59 join the core extending in the c-axis direction at the center. The core (S) and the boundary (K) form a closed defect accumulating region (H). The core (S) has high dislocation density. {11-22} facets and {1-101} facets gather dislocations to the pit center bottom. The converged dislocations are partly annihilated and partly accumulated in the closed defect accumulating regions (H). Once accumulated dislocations cannot escape from the closed defect accumulating regions (H). Surrounding regions deprived of dislocations become accompanying low dislocation single crystal regions (Z) and extra low dislocation single crystal regions (Y).

Facet growth of the present invention makes facet pits at seeds on an $In_{0.9}Ga_{0.1}N$ surface, produces closed defect accumulating regions (H) following pit bottoms, converges defects into the boundaries (K) or into the boundaries (K) and the core (S), and reduces dislocations in the surrounding regions around the closed defect accumulating regions (H).

[Observation of Sample F of $In_{0.9}Ga_{0.1}N$ (SEM, TEM, CL)]

Sample F is examined by the SEM, TEM and CL. The result is similar to Sample E. But, closed defect accumulating regions (H) have about an 180 μm diameter which is far larger than Sample E (40 μm φ). The closed defect accumulating region (H) of Sample F is more than four times in diameter and 20 times in area as large as Sample E. The closed defect accumulating region (H) is columnar in three-dimensional shape but amorphous in two-dimensional shape.

Closed defect accumulating regions (H) of Sample F are examined. The closed defect accumulating region (H) turns out to be one or more than one single crystal grain of a slightly slanting orientation to the surrounding single crystals. The closed defect accumulating region (H) of Sample F includes dislocations, planar defects and slightly slanting grains.

[Processing of Sample E and Sample F]

$In_{0.9}Ga_{0.1}N$ substrates of Sample E and Sample F should be mechanically processed. The bottom sapphire undersubstrates are ground away by mechanical grinding. The facetted rugged top surfaces are flattened by mechanical grinding. As-ground $In_{0.9}Ga_{0.1}N$ wafers are further polished into flat, smooth transparent $In_{0.9}Ga_{0.1}N$ substrates. 1 inch φ (2.5 cm φ) $In_{0.9}Ga_{0.1}N$ substrate wafers are obtained. The $In_{0.9}Ga_{0.1}N$ wafers are transparent for human eyesight like a glass plate. FIG. 12(5) shows a section of a CL(cathode luminescence) image of an $In_{0.9}Ga_{0.1}N$ finished wafer. Closed defect accumulating regions (H) extend in the direction of thickness in the wafer and penetrate the wafer from the top to the bottom. The closed defect accumulating region (H) 55 regularly align with a certain pitch in two dimensional directions. The closed defect accumulating regions (H) are enclosed by the grain boundaries (K) 60. Accompanying low dislocation single crystal regions (Z) 54 encircle the closed defect accumulating regions (H) 55. Middle regions 58 between the neighboring closed defect accumulating regions (H) 55 are extra low dislocation single crystal regions (Y) 58.

Samples E and F are $In_{0.9}Ga_{0.1}N$ substrates having C-plane surfaces. The wafers are flat and transparent. An optical microscope cannot discern inner structures. CL images show a history of growth by the variations of contrasts. A CL picture irradiated with 360 nm wavelength light which is nearly equal to the band gap of $In_{0.9}Ga_{0.1}N$ indicates inner structures of the wafer. The CL picture shows that closed defect accumulating regions (H) align with a 400 μm pitch which is the same pitch as seeds 53.

In the CL picture, closed defect accumulating regions (H) take dark contrast in many cases. But, closed defect accumulating regions (H) take bright contrast in the CL image in some cases. The closed defect accumulating regions (H) can be determined as a dark contrast or a bright contrast in the CL image.

The CL image shows a closed defect accumulating region (H) made by the facets 56 as a dodecagonal bright contrast part.

The extra low dislocation single crystal regions (Y) under the flat tops are dark contrast parts in a CL picture. The region Y is formed by the C-plane growth. Namely, H is mainly dark and sometimes bright, Z is bright and Y is dark in the CL picture. The CL facilely discerns the closed defect accumulating regions (H), the accompanying low dislocation single crystal regions (Z) and the extra low dislocation single crystal regions (Y).

Extending along a c-axis, the closed defect accumulating regions (H) are perpendicular to the surfaces of the $In_{0.9}Ga_{0.1}N$ substrate and penetrate the $In_{0.9}Ga_{0.1}N$ substrate. Sometimes, surfaces of the (H)s have little hollows. It was found that Sample E had hollows of 0.3 μm depth at the (H)s. This seems to be caused from a little difference of a grinding speed in (H)s from other parts.

Since the finished $In_{0.9}Ga_{0.1}N$ substrate wafers are flat and smooth, the measurement of threading dislocation density is easy. Dislocations can be observed by the CL, the etch pit measurement, and the TEM. The observation on a CL picture is the easiest.

In the CL image, thread dislocations appear as dark points. Samples E and F show convergence of thread dislocations in the cores (S) and linear aggregation of dislocations on the boundaries (K) of the closed defect accumulating regions (H). The linear aggregation on the boundary (K) corresponds to a planar defect in a three dimensional space. The closed defect accumulating regions (H) are discernible by dark closed encircling boundaries (K) in the CL image.

The closed defect accumulating regions (H) are 40 μm φ dots (seed is 50 μm φ) in Sample E. The shapes are rectangular or amorphous. The closed defect accumulating regions (H) are 180 μm φ dots (seed is 200 μm φ) in Sample F. The shapes are circularly amorphous. Only a difference existing between Sample E and Sample F is diameters of the closed defect accumulating regions (H). The observation confirms that the sizes of the closed defect accumulating regions (H) are predetermined by the sizes of the seeds. A bigger seed creates a bigger closed defect accumulating region (H). A smaller closed defect accumulating region (H) originates from a smaller seed.

Both in Sample E and Sample F, closed defect accumulating regions (H) have high dislocation density. Outside of H, dislocation density rapidly decreases in proportion to the distance from the boundary (K). In some cases, dislocations suddenly reduces outside of the boundary (K). Average dislocation density is less than $5 \times 10^6$ $cm^{-2}$ in the accompanying low dislocation single crystal regions (Z) and the extra low dislocation single crystal regions (Y). Dislocations centripetally run in parallel to the C-plane in the accompanying low dislocation single crystal regions (Z) and the extra low dislocation single crystal regions (Y). Dislocations are gathered, absorbed, annihilated and arrested in (K) and (S) of (H). Thus, the dislocations are reduced in the surrounding regions (Z) and (Y).

Sample E and Sample F are heated and etched in a KOH solution. In Sample F, there are parts which are subject to be etched in the closed defect accumulating regions (H). The accompanying low dislocation single crystal regions (Z) and the extra low dislocation single crystal regions (Y) have high resistance against etching. The closed defect accumulating regions (H) have etchable parts and unetchable parts. (0001) InGa planes which have only Ga and In atoms exposed on the surface are unetchable. (000-1)N planes which have only N atoms exposed on the surface are etchable. The fact indicates that the accompanying low dislocation single crystal regions (Z) and the extra low dislocation single crystal regions (Y) have stronger (0001)InGa planes on the surface. On the contrary, the closed defect accumulating regions (H) have partly (0001)InGa surfaces and partly (000-1)N surfaces. The fact indicates that a part of the closed defect accumulating regions (H) has a reverse polarity <000-1> and the other part has a normal polarity <0001> common with the surrounding (Y) and (Z) in Sample B.

Further, observations on Sample E reveal that most of the closed defect accumulating region (H) surfaces become hollow by the KOH solution etching. And analyses by TEM observations showed that most of the closed defect accumulating regions (H) of Sample E are single crystals having the reversed orientation of 180° to a <0001> direction of the surrounding single crystal parts (Z), (Y). In other words, surfaces of the surrounding single crystal parts (Z), (Y) turn out to be unetchable InGa planes (0001) and surfaces of (H) turn out to be etchable N planes (000-1) in Sample E. More detailed analyses clarified that many closed defect accumulating regions (H) in Sample E have a plurality of crystal particles of the reversed orientation to <0001>.

From the results, the inventors supposed that shallower facets of pits in Sample E corresponds to the closed defect accumulating regions (H) having plane indices of {11-2-4}, {11-2-5}, {11-2-6}, {1-10-2}, {1-10-3}, and {1-10-4}.

Sample E $In_{0.9}Ga_{0.1}N$ substrate (50 μm φ seeds) and Sample F $In_{0.9}Ga_{0.1}N$ substrate (200 μm φ seeds) have a common property except the size of the closed defect accumulating regions (H). Sample E (50 μm φ seeds) has about 40 μm φ closed defect accumulating regions (H). Sample F (200 μm φ seeds) has about 180 μm φ closed defect accumulating regions (H). More effective exploitation requires narrower closed defect accumulating regions (H), wider accompanying low dislocation single crystal regions (Z) and wider extra low dislocation single crystal regions (Y).

Smaller seeds produce smaller closed defect accumulating regions (H). But, an excess small seed cannot make a closed defect accumulating region (H). Without the formation of the closed defect accumulating regions (H), dislocation density cannot be reduced in the single crystal portions (Z, Y). Thus, a seed should have a diameter larger than a definite lower limit. The lower limit should be determined for seeding.

[Growth of Sample G(Sapphire Substrate, 2 μm φ Seeds, 20 μm Pitch)]

Sample G employs a hexagonal symmetric seed pattern of FIG. 8(a) arranging many equilateral triangles of a 20 μm side and allotting 2 μm φ seeds ($SiO_2$) on corners of the equilateral triangles. Sample G is prepared by implanting $SiO_2$ seeds on a sapphire substrate. Sample G shows small seeds and small pitch repetitions for clarifying the lowest limit of seeds and pitch. Like Samples E and F, Sample G had at first been grown by an HVPE method by the same facet growth condition. But, the 2 μm φ ($SiO_2$) seeds fully were buried by $In_{0.9}Ga_{0.1}N$ at an early stage. No closed defect accumulating region (H) was produced from the seed. Facet pits were made. The facet pits, however, were vacant pits without closed defect accumulating regions (H). The seeds could not determine the positions of facet pits. Positions of pits were uncontrollable by the HVPE.

Then, an MOCVD method is employed instead of the HVPE method. The MOCVD has a slower growing speed than the HVPE method. A slow growth speed will enable facet pits to rise from the ($SiO_2$) seeds.

The MOCVD employs In-containing and Ga-containing metallorganic material gases as an In-source and a Ga-source instead of Ga-metal and In-metal. Material gases are trimethylindium (TMI;$(CH_3)_3In$), trimethylgallium (TMG;$(CH_3)_3Ga$), ammonia ($NH_3$) and hydrogen ($H_2$) in the MOCVD.

An $In_{0.9}Ga_{0.1}N$ crystal is made by setting a seed-implanted sapphire Undersubstrate C of Pattern C on a susceptor in a cold-wall furnace, heating the undersubstrate at 650° C., supplying the material gases in a rate of TMI:TMG:$NH_3$=9:1:30000 at atmospheric pressure, and growing an $In_{0.9}Ga_{0.1}N$ film on the seed sapphire undersubstrate. The growing speed is 1 μm/h. The growing time is 48 hours. The thickness of the produced $In_{0.9}Ga_{0.1}N$ film is about 50 μm.

The MOCVD enables the seeds to induce facet pits and the facet pits to make closed defect accumulating regions (H).

Sample G has small seeds of a 2 μm diameter which induces a 1 μm φ closed defect accumulating region (H) accompanying a pit bottom. In Sample G, the seeds can determine sizes and positions of the closed defect accumulating regions (H).

An accompanying low dislocation single crystal region (Z) grows under the facets 56. A small facet pit makes a small round accompanying low dislocation single crystal region (Z). TEM examination confirmed that a part Z is a single crystal with low dislocation density. The flat tops 57(C-plane) produced extra low dislocation single crystal regions (Y). TEM confirmed that a part Y is a single crystal with low dislocation density. Sample G has a feature of very small closed defect accumulating regions (H). Although the HVPE method is impossible, the MOCVD method can achieve the purpose of making a single crystal with low dislocation density through making regularly distributed closed defect accumulating regions (H) in accordance with the distribution of seeds.

[Growth of Sample I (300 μm φ Seeds, 2000 μm Pitch)]

Sample I employs a hexagonal symmetric seed pattern of FIG. 8(a) arranging large equilateral triangles of a 2000 μm side and allotting big 300 μm φ seeds ($SiO_2$) on corners of the equilateral triangles. Sample I is an example having the largest seeds and widest pitch. Sample I is made by the HVPE method like Samples E and F. The conditions of the HVPE are,

| | |
|---|---|
| Growing temperature | 650° C. |
| $NH_3$ partial pressure | 0.3 atm (30 kPa) |
| HCl partial pressure(In-boat) | 0.02 atm (2 kPa) |
| HCl partial pressure (Ga-boat) | 0.002 atm (0.2 kPa) |
| Growing time | 140 hours. |

The growth gives Sample I a 3.1 mm thick $In_{0.9}Ga_{0.1}N$ crystal on the sapphire undersubstrate. Sample I reveals many dodecagonal reverse-cone pits. Closed defect accumulating regions (H) are regularly distributed in coincidence with the positions of the (SiO$_2$) seeds 53 implanted on the sapphire undersubstrate.

Some pits are distorted. Extra small pits which do not correspond with the seeds appear. Sample I shows weak controllability of seed positions.

Almost all of the closed defect accumulating regions (H) align at the predetermined positions spaced by a 2000 μm pitch in the same pattern as the initial seed pattern. The regularly aligning pits have about a 2000 μm diameter which is nearly equal to the pitch. Some pits on the seeds are 2000 μm φ diameter regular dodecagonal cones. Other pits on the seeds are 200 μm φ small pits with distorted shapes. Dislocation density is high in the closed defect accumulating regions (H).

Some closed defect accumulating regions (H) are distorted. But, almost all of the closed defect accumulating regions (H) are arranged at predetermined seeded spots in Sample I. Accompanying low dislocation single crystal regions (Z) and extra low dislocation single crystal regions (Y) made around the closed defect accumulating regions (H) at the regular seeded spots have low dislocation density of less than $5 \times 10^6$ cm$^{-2}$. Small number of closed defect accumulating regions (H) appear at unseeded spots. Narrow portions surrounding the unseeded closed defect accumulating regions (H) are not of low dislocation density.

Experiments of Samples E, F, G and I clarify optimum ranges of parameters;

Diameter of closed defect accumulating regions (H)=1 μm~200 μm

Diameter of seeds=2 μm~300 μm

Pitch of closed defect accumulating regions (H)=20 μm~2000 μm.

The above values of the parameters enable the present invention to make a low dislocation density In$_{0.9}$Ga$_{0.1}$N single crystal.

Embodiment 3

Figure 13:
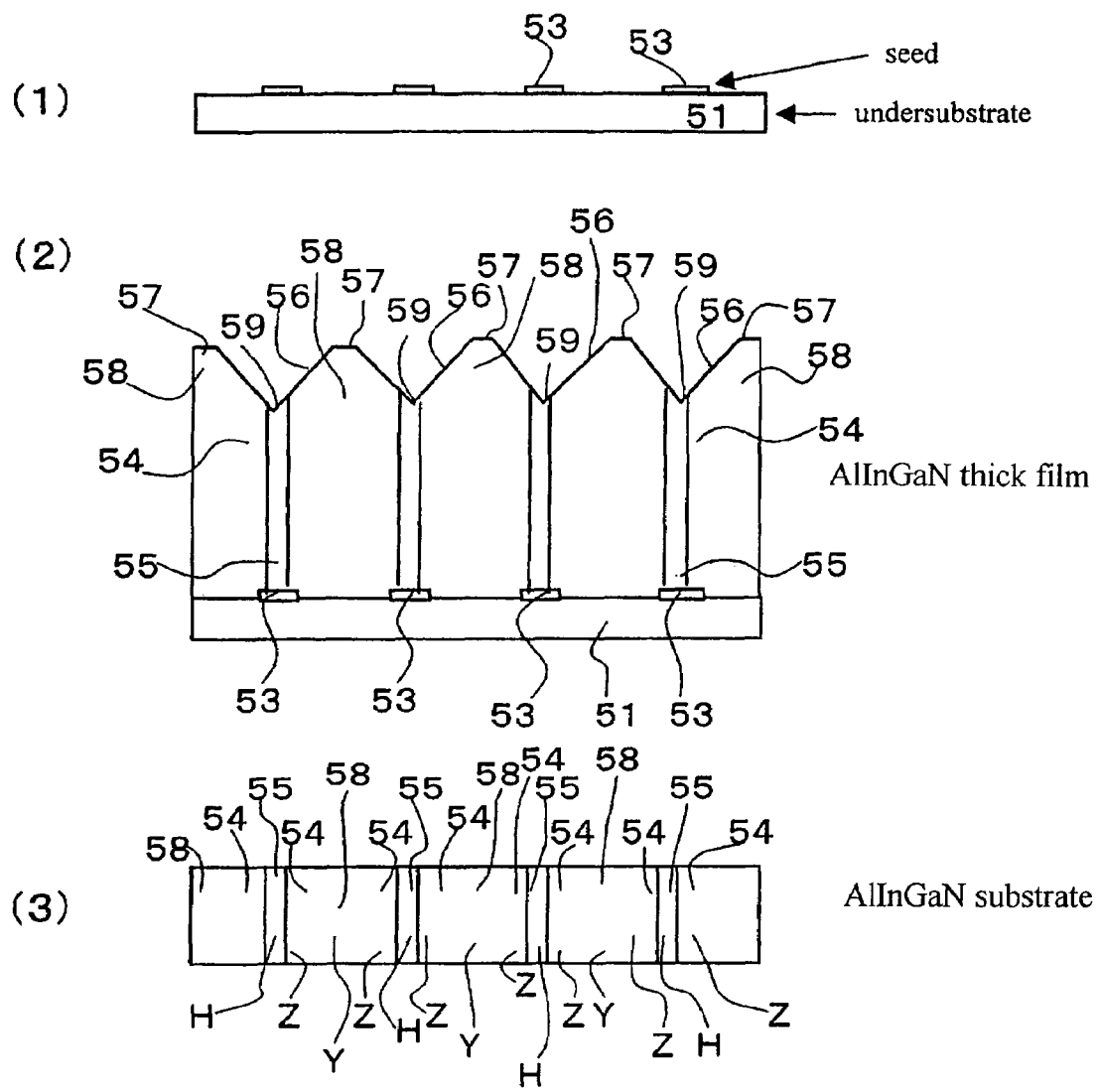
FIG. 13 is a series of sectional views of the steps of making an $Al_{0.3}In_{0.3}Ga_{0.4}N$ mixture crystal substrate of Embodiment 3 of the present invention by preparing an undersubstrate, implanting seeds upon the undersubstrate, growing a thick $Al_{0.3}In_{0.3}Ga_{0.4}N$ mixture crystal on the condition of facet growing, forming facets and facet pits at the position of the seeds, producing closed defect accumulating regions (H) following bottoms of the pits, forming accompanying low dislocation single crystal regions (Z) surrounding the closed defect accumulating regions (H) just under the facets, forming extra low dislocation single crystal regions (Y) under C-plane growing tops, eliminating the facets and the undersubstrate by mechanical processing, and obtaining a flat, smooth $Al_{0.3}In_{0.3}Ga_{0.4}N$ mixture crystal substrate.

(Al$_{0.3}$Ga$_{0.3}$In$_{0.4}$N: on GaAs, Si, Sapphire Substrate; Pattern A, H(=A+ELO); Samples J, K, L, M; FIG. 13)

Embodiment 3 prepared three kinds of foreign material undersubstrates for making Al$_{0.3}$Ga$_{0.3}$In$_{0.4}$N substrate crystals.

α. (111) GaAs undersubstrate

β. C-plane (0001) sapphire undersubstrate

γ. (111) Si undersubstrate

Silicon (Si) has the diamond structure of cubic symmetry group. Gallium arsenide (GaAs) has the zinc blend structure of cubic symmetry group. Al$_{0.3}$Ga$_{0.3}$In$_{0.4}$N has hexagonal symmetry. In cubic symmetry crystals, only a (111) plane has three-fold rotation symmetry. Thus, a (111) plane is employed for Si and GaAs. Sapphire has trigonal symmetry which lacks three-fold rotation symmetry. Thought the c-axis does not have three-fold rotation symmetry, a (0001)C-plane sapphire can be utilized as an undersubstrate of Al$_{0.3}$Ga$_{0.3}$In$_{0.4}$N growth.

FIG. 12(1), (2) and (3) show steps of the Al$_{0.3}$Ga$_{0.3}$In$_{0.4}$N growth. Unlike Embodiments 1 and 2 Samples A to D, Embodiment 3 (Samples J, K, L, M) implants seeds 53 directly on the foreign material layer without an intermediate buffer layer. Hexagonally symmetric seed patterns are made by coating the undersubstrates with a masking film of a 0.1 μm thick SiO$_2$ layer and etching away extra portions except the corner points of equilateral triangles regularly arranged on the seed masks.

Embodiment 3 provides Samples J, K, L with Pattern A (50 μm φ seed, 400 μm pitch) and Sample M with Pattern M (Pattern A+ELO mask) as mask patterns.

(Pattern A)

Pattern A is the same as Embodiment 1. Many equivalent equilateral triangles of a 400 μm side are aligned without margin. 50 μm φ (round seeds are put on the corners of the equilateral triangles (FIG. 6(*a*)). An extra part 19 except the seeds 23 is fully exposed without covering.

(Pattern H)

Pattern H is a complex pattern hybridized Pattern A with an ELO mask pattern (Pattern H=Pattern A+ELO). Pattern A has a wide extra part 19 as shown in FIG. 6(*a*). An ELO mask pattern is formed on the extra part 19. The ELO mask is a mask which is utilized in the ELO (epitaxial lateral overgrowth) which has been described as known technology. The ELO mask has many small (1~2 μm φ) windows perforated in a shielding film. Unlike the DIS mask, the ELO mask has a wider shielding part and narrower exposed parts (windows). For example, the ELO mask arranges many tiny equilateral triangles of a 4 μm side without margin and perforates 2 μm φ round windows at the corner points of the equilateral triangles. The basic triangle of a 4 μm side of the ELO mask is arranged in parallel with the fundamental triangle of a 400 μm side of Pattern A of the DIS mask.

In FIG. 12, the windows of the ELO mask are omitted, since the windows are too small to depict. The ELO mask part is formed on the extra part between neighboring seeds 53 on the undersubstrate 51.

The fundamental direction of Pattern A is defined as the direction of a side of a fundamental triangle. In the case of the GaAs(111) undersubstrate, a <1-10>GaAs direction is taken as the fundamental direction. In the case of the sapphire (0001) undersubstrate, a <1-100>sapphire direction is taken as the fundamental direction. In the case of the Si(111) undersubstrate, a <1-10> Si direction is taken as the fundamental direction. Embodiment 3 makes four samples J, K, L and M from four different masked undersubstrates which are defined as follows.

Undersubstrate J: Pattern A (50 μm φ seeds, 400 μm pitch) directly implanted on a (111) GaAs undersubstrate Undersubstrate K: Pattern A (50 μm φ seeds, 400 μm pitch) directly implanted on a (0001) sapphire undersubstrate Undersubstrate L: Pattern A (50 μm φ seeds, 400 μm pitch) directly implanted on a (111) silicon (Si) undersubstrate Undersubstrate M: Pattern H (Pattern A+ELO mask) directly implanted on a (111) GaAs undersubstrate FIG. 13(1) shows a seed implanted undersubstrate which signifies any one of the four masked undersubstrate. What is different from Embodiment 1 or 2 is to form seed patterns directly on the undersubstrates without an Al$_{0.8}$Ga$_{0.2}$N buffer. Embodiment 3 makes thick Al$_{0.3}$Ga$_{0.3}$In$_{0.4}$N mixture crystal layers on Undersubstrates J, K, L and M by an HVPE method. The HVPE apparatus for Embodiment 3 is a furnace which has heaters, H2, HCl, AlCl3 and ammonia (NH3) gas inlets, a Ga-boat and an In-boat at upper heights and a susceptor at a lower height. Supply of H$_2$ gas and HCl gas to the Ga-melt and the In-melt synthesizes GaCl and InCl$_3$. Falling in the furnace, AlCl$_3$, GaCl and InCl$_3$ gases react with supplied ammonia (NH3) gas and makes Al$_{0.3}$Ga$_{0.3}$In$_{0.4}$N on the undersubstrate. Two step growth of piling a thin buffer layer and an epi-layer produces a thick Al$_{0.3}$Ga$_{0.3}$In$_{0.4}$N crystal.

(1. Growth of an $Al_{0.3}Ga_{0.3}In_{0.4}N$ Buffer Layer)

A buffer layer is often piled on an undersubstrate at a low temperature for enhancing the crystallographic property of over-coating layers. But, the buffer layer is not indispensable. An $Al_{0.3}Ga_{0.3}In_{0.4}N$ buffer layer is grown on a gallium arsenide (GaAs) undersubstrate, a sapphire ($Al_2O_3$) undersubstrate or a silicon (Si) undersubstrate by the HVPE (hydride vapor phase epitaxy) method under the following condition;

| | |
|---|---|
| Growth temperature | 350° C. |
| HCl partial pressure (In-boat) | 0.002 atm (200 Pa) |
| HCl partial pressure (Ga-boat) | 0.001 atm (100 Pa) |
| Ammonia ($NH_3$) partial pressure | 0.3 atm (30 kPa) |
| Growth time | 20 minutes |
| Buffer layer thickness | 30 nm |

(2. Growth of an $Al_{0.3}Ga_{0.3}In_{0.4}N$ Epitaxial Layer)

An $Al_{0.3}Ga_{0.3}In_{0.4}N$ epitaxial layer is grown upon the low-temperature grown buffer layer by the HVPE method under the condition:

| | |
|---|---|
| Growth temperature | 700° C. |
| HCl partial pressure (In-boat) | 0.03 atm (3 kPa) |
| HCl partial pressure (Ga-boat) | 0.01 atm (1 kPa) |
| Ammonia ($NH_3$) partial pressure | 0.3 atm (30 kPa) |
| Growth time | 65 hours (3900 minutes) |
| Epi-layer thickness | 900 μm (0.9 mm) |

The crystals grown on Undersubstrates J, K, L and M are named Samples J, K, L and M respectively. Samples J, K, L and M have the low-temperature grown $Al_{0.3}Ga_{0.3}In_{0.4}N$ buffer layers and the high-temperature grown $Al_{0.3}Ga_{0.3}In_{0.4}N$ epi-layer the undersubstrates. Samples J-M are all transparent substrates with a thickness of 1.3 mm. Appearance of the samples is similar to Embodiment 1. The cathode luminescence (CL) can discriminate the closed defect accumulating regions (H), the accompanying low dislocation single crystal regions (Z) and the extra low dislocation single crystal regions (Y) in Samples J-M. Since the samples have rugged surfaces carrying plenty of facet pits, the facets, the pits on the samples can be also observed by an optical microscope.

FIG. 13 (2) shows the sections of the as-grown samples. All four samples have many pits consisting of slanting facets 56 on the surface. Bottoms 59 of the pits coincide with seeds ($SiO_2$) 53 which have been initially implanted on the undersubstrate as a DIS mask. 400 μm diameter pits align in the closest packed mode (Pattern A) in contact with six surrounding pits. The pit 400 μm diameter is equal to the spatial period (pitch) of 400 μm of the seeds 53. The pits are dodecagonal. It is confirmed that smaller facets having smaller inclination angles exist at center bottoms of the pits.

Closed defect accumulating regions (H) follow the seed 53. Tops of the closed defect accumulating regions (H) are the bottoms 59 of the pits. The slanting facets 56 are followed by the accompanying low dislocation single crystal regions (Z) 54. The extra low dislocation single crystal regions (Y) 58 have C-plane flats 57 at the tops. Both the accompanying low dislocation single crystal regions (Z) 54 and the extra low dislocation single crystal regions (Y) 58 are low-dislocation single crystals.

(Grinding)

The as-grown samples have rugged surfaces including plenty of pits and bottoms having the undersubstrates. Samples J, K, L and M are ground. The bottoms are ground for removing the foreign material undersubstrates 51 (Undersustrates J-M). The GaAs, silicon or sapphire undersubstrates and the seeds are eliminated from the samples by the back grinding. The top surfaces are also ground for removing the facets and the pits and producing a flat top surface. Flat $Al_xIn_yGa_{1-x-y}N$ wafers are made by polishing both surfaces. FIG. 13(3) shows a sectional view of the polished flat wafer. The wafers are transparent C-plane $Al_xIn_yGa_{1-x-y}N$ single crystals having a (0001) plane as a surface. The regular structure containing the closed defect accumulating regions (H), the accompanying low dislocation single crystal regions (Z) and the extra low dislocation single crystal regions (Y) appears in the CL (cathode luminescence) image. It is observed that many closed defect accumulating regions (H) 55 align at the points in a six-fold rotation (hexagonally) symmetric pattern on the surface. Centers of all the closed defect accumulating regions (H) exactly coincide with the seeds 53 which have been implanted at the earliest stage. Horizontal sectional shapes of the closed defect accumulating regions (H) are not circular but amorphous. An average of diameters of the closed defect accumulating regions (H) is about 40 μm. The size (40 μm) of H corresponds to the seed size (50 μm diameter, 400 μm pitch). It is a reasonable result that the closed defect accumulating regions (H) grow directly just upon the hexagonally symmetric $SiO_2$ seeds. Namely, the closed defect accumulating regions (H) 55 transcribe the seeds 53.

High dislocation density is observed within the closed defect accumulating regions (H). Outside of H, dislocations decrease in proportion to the distance from the closed defect accumulating regions (H). Sufficient low dislocation density which is less than $5 \times 10^6$ cm$^{-2}$ prevails in the outer accompanying low dislocation single crystal regions (Z) and the extra low dislocation single crystal regions (Y). Average dislocation densities in (Z) and (Y) of Samples J, K, L and M are,

| | |
|---|---|
| Sample J (GaAs undersubstrate; Pattern A mask); | $4 \times 10^6$ cm$^{-2}$ |
| Sample K (sapphire undersubstrate; Pattern A mask); | $2 \times 10^6$ cm$^{-2}$ |
| Sample L (Si undersubstrate; Pattern A mask); | $5 \times 10^6$ cm$^{-2}$ |
| Sample M (GaAs undersubstrate; Pattern A+ ELO mask); | $1 \times 10^6$ cm$^{-2}$. |

All the samples are favored with low dislocation density. Reduction of dislocations depends upon undersubstrates. The sapphire undersubstrate (K) has the strongest power for dislocation reduction among Sample E(GaAs), Sample F (sapphire) and Sample G (Si). The silicon undersubstrate has the weakest power of the dislocation reduction.

The most conspicuous dislocation reduction is obtained in Sample M which jointly uses the ELO mask. The use of the ELO mask exhibits an extra power of reducing dislocations. Comparison of Sample M with Sample J shows the dislocation reduction power of the closed defect accumulating regions (H) would be nearly equal to that of the ELO method. The ELO method annihilates dislocations by the sequential turn and the mutual collision as mentioned before. The closed defect accumulating regions (H) reduce dislocations by attracting, arresting and accumulating dislocations therewithin.

The states of the closed defect accumulating regions (H) in Samples J, K, L and M are similar to Embodiment 1 (Samples A~D). Facet pits originate from the seeds 53. Dislocations are swept to the bottoms of the facet pits. The dislocations gathered to the bottoms of the pits form the closed defect accumulating regions (H) following the seeds. Since the dislocations are constricted to the narrow closed defect accumulating regions (H), low dislocation density is realized in the accompanying low dislocation single crystal regions (Z) and the extra low dislocation single crystal regions (Y).

(Miracle of Sample J)

For Sample J (GaAs undersubstrate; Pattern A), two specimens are produced. Miraculously, the two specimens (named "Sample J1 and Sample J2") exhibit different crystal growth modes. One specimen (Sample J1) has clearly-discernible three kinds of regions, the closed defect accumulating regions (H), the accompanying low dislocation single crystal regions (Z) and the extra low dislocation single crystal regions (Y) like Embodiments 1 and 2. The other specimen (Sample J2) has pits just above the seeds at the same six-fold rotational symmetric spots. However, the closed defect accumulating regions (H) do not exist between the pit bottoms and the seeds. The preceding embodiments have a set of a pit, a closed defect accumulating region (H) and a seed. Three vertical parts (pit, H and seed) in series form a set in every embodiment described till now. The closed defect accumulating regions (H) are congenial to the pits and seeds. Unexpectedly, Sample J2 lacks the intermediate closed defect accumulating regions (H). The CL observation reveals the extinction of the closed defect accumulating regions (H) between the seeds and the pit bottoms. It is unreasonable that an identical method (Sample J) makes two different specimens (J1 and J2).

(Sample J2 Lacking Closed Defect Accumulating Regions (H))

H-less Sample J2 is examined in detail. The pit bottoms 59 have no closed defect accumulating regions (H). Dislocations which should be gathered and compressed within the closed defect accumulating regions (H) bluntly disperse and diffuse to wide regions below the pits in H-less Sample H2. An average of the dislocations is $6\times10^6$ cm$^{-2}$. The average dislocation density of Sample H2 is higher than the dislocation density of the accompanying low dislocation single crystal regions (Z) and the extra low dislocation single crystal regions (Y) of other preceding samples. Groups of dislocations originate linearly from some pit bottoms 59 in Sample H2. Planar defects accompany the linear defects. The planar defects meet at 60 degrees with each other along vertical extensions of the pit bottoms as shown in FIG. 1(*b*). The linear defects are crossing lines of the planar defects. Some of the planar defects diffuse over 100 μm wide from the pit bottoms. Perhaps once converged dislocations to narrow regions below the pits are released out.

Sample J2 is devoid of the closed defect accumulating regions (H) which can absorb and accumulate plenty defects. Thus, dislocations diffuse bluntly. Planar defects appear at the bottoms of the pits. The pits are produced at points just above the seeds. The pits transcribe the seeds. But the pits are vacant. The vacant pits are useless for gathering, absorbing and storing dislocations. Thus, Sample J2 is not a low-dislocation crystal.

Production of low-dislocation $Al_xIn_yGa_{1-x-y}N$ single crystals requires a first condition that the pits are made just above the implanted seeds with fidelity and a second condition that the closed defect accumulating regions (H) are made just below the pit bottoms. Two conditions are essential for reducing the dislocations. H-less pit occurrence transcribing the seeds is still insufficient. The closed defect accumulating regions (H) are significant and essential for making low-dislocation $Al_{0.3}Ga_{0.3}In_{0.4}N$ crystals.

Embodiment 4

Figure 14:
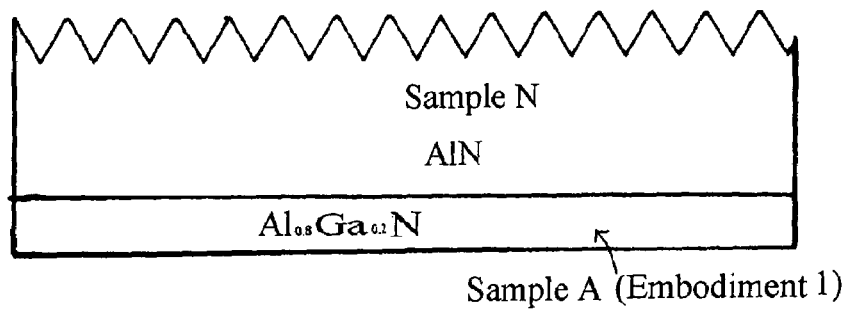
FIG. 14 is a sectional view of Embodiment 4 having an $Al_xIn_yGa_{1-x-y}N$ undersubstrate and an AlN crystal grown on the undersubstrate.

(Growth of Thick AlN Crystal; x=1, y=0 of $Al_xIn_yGa_{1-x-y}N$; Sample N; FIG. 14)

FIG. 14 shows Embodiment 4. Thick AlN substrate crystals are made by the method of the present invention. An undersubstrate is prepared by eliminating the sapphire undersubstrate from Sample A ($Al_{0.8}Ga_{0.2}N$/sapphire) substrate which has already produced by Embodiment 1 and polishing the top surface of Sample A. The undersubstrate is called Undersubstrate A ($Al_{0.8}Ga_{0.2}N$: abbr. AlGaN). An AlN (aluminum nitride) thick crystal is grown on Undersubstrate A (AlGaN) by the HVPE method. The hot-wall type HVPE apparatus has H2 and HCl gas-inlets at a top, an Al-boat having an Al-melt at a higher position and a susceptor at a lower position. Undersubstrate A is laid upon the susceptor. The susceptor and Al-boat are heated. HCl+H2 gases are introduced via the top inlets to the Al-melt. Reaction of HCl gas with Al produces $AlCl_3$ (aluminum chloride) gas. The $AlCl_3$ gas falls toward Undersubstrate A on the susceptor. Ammonia gas (NH3) is introduced near the susceptor and reacts with $AlCl_3$ gas. AlN is synthesized and is deposited upon Undersubstrate A. The growth conditions are as follows;

| | |
|---|---|
| Growth Temperature (susceptor) | 1050° C. |
| HCl partial pressure (Al-boat) | 0.02 atm (2 kPa) |
| NH3 partial pressure | 0.3 atm (30 kPa) |
| Growth Time | 140 hours |
| AlN thickness | 9000 μm (9 mm) |

The HVPE growth makes a 9000 μm thick AlN (aluminum nitride) crystal (Sample N) on Undersubstrate A. CL observation shows Sample N (AlN crystal substrate) has a pattern of aligning regularly a set of facet pits having a 400 μm diameter lengthwise and crosswise without gap. The pattern of Sample N exactly transcribes the original pattern of Undersubstrate A (Al0.8Ga0.2N). The dislocation density is measured by the TEM observation. Except the (H) region, the dislocations are sufficiently reduced. The average of the dislocation density is $8\times10^5$cm$^{-2}$ in the (Z) regions and (Y) region. Sample N turns out to be an excellent AlN substrate of low dislocation density.

Embodiment 5

Figure 15:
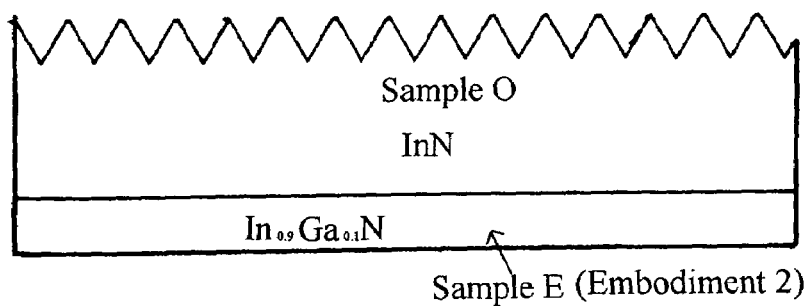
FIG. 15 is a sectional view of Embodiment 5 having an $In_{0.9}Ga_{0.1}N$ undersubstrate and an InN crystal grown on the undersubstrate.

(Growth of thick InN crystals: x=0, y=1 of $Al_xIn_yGa_{1-x-y}N$; Sample O; FIG. 15)

FIG. 15 shows Embodiment 5. Thick InN (indium nitride) substrate crystals are made by the method of the present invention. Another undersubstrate is prepared by eliminating the sapphire undersubstrate from Sample E ($In_{0.9}Ga_{0.1}N$/sapphire) substrate which has already produced by Embodiment 2 and polishing the top surface of Sample E. The undersubstrate is called Undersubstrate E ($In_{0.9}Ga_{0.1}N$: abbr. InGaN). An InN (aluminum nitride) thick crystal is grown on Undersubstrate E (InGaN) by the HVPE method. The hot-wall type HVPE apparatus has H2 and HCl gas-inlets at a top, an In-boat having an In-melt at a higher position and a susceptor at a lower position. Undersubstrate E is laid upon the susceptor. The susceptor and In-boat are heated. HCl+H2 gases are introduced via the top inlets to the In-melt. Reaction of HCl gas with In produces InCl (indium chloride) gas. The InCl gas falls toward Undersubstrate E on the susceptor. Ammonia gas (NH3) is introduced near the susceptor and reacts with InCl gas. InN is synthesized and is deposited upon Undersubstrate E. The growth conditions are as follows;

| Growth Temperature (susceptor) | 650° C. |
|---|---|
| HCl partial pressure (In-boat) | 0.02 atm (2 kPa) |
| NH3 partial pressure | 0.3 atm (30 kPa) |
| Growth Time | 140 hours |
| InN thickness | 4500 μm (4.5 mm) |

The HVPE growth makes a 4500 μm thick InN (indium nitride) crystal (Sample O). CL observation shows Sample O (InN crystal substrate) has a pattern of aligning regularly a set of facet pits having a 400 μm diameter lengthwise and crosswise without gap. The pattern of Sample O exactly transcribes the original pattern of Undersubstrate E ($In_{0.9}Ga_{0.1}N$). The dislocation density is measured by the TEM observation. Except the (H) region, the dislocations are sufficiently reduced. The average of the dislocation density is $1\times10^6$ cm$^{-2}$ in the (Z) regions and (Y) regions. Sample O turns out to be an excellent InN substrate.

Embodiment 6

Figure 16:
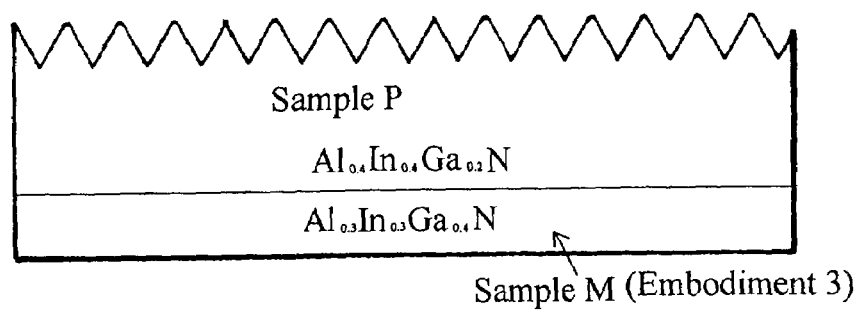
FIG. 16 is a sectional view of Embodiment 6 having an $Al_{0.3}In_{0.3}Ga_{0.4}N$ undersubstrate and an $Al_{0.4}In_{0.4}Ga_{0.2}N$ crystal grown on the undersubstrate.

(Growth of Thick $Al_{0.4}In_{0.4}Ga_{0.2}N$ Crystal; x=0.4, y=0.4 of $Al_xIn_yGa_{1-x-y}N$; Sample P; FIG. 16)

FIG. 16 shows Embodiment 6. Thick $Al_{0.4}In_{0.4}Ga_{0.2}N$ (abbr. $Al_xIn_yGa_{1-x-y}N$) substrate crystals are made by the method of the present invention. Another undersubstrate is prepared by eliminating the GaAs undersubstrate from Sample M ($Al_{0.3}In_{0.3}Ga_{0.4}N$/GaAs) substrate which has already produced by Embodiment 3 and polishing the top surface of Sample M. The undersubstrate is called Undersubstrate M ($Al_{0.3}In_{0.3}Ga_{0.4}N$: abbr. $Al_xIn_yGa_{1-x-y}N$). An $Al_{0.4}In_{0.4}Ga_{0.2}N$ thick crystal is grown on Undersubstrate M ($Al_{0.3}In_{0.3}Ga_{0.4}N$) by the HVPE method. The hot-wall type HVPE apparatus has H2, HCl and AlCl3 gas-inlets at a top, an In-boat having an In-melt and a Ga-boat having a Ga-melt at higher positions and a susceptor at a lower position. Undersubstrate A is laid upon the susceptor. The susceptor and In- and Ga-boats are heated. HCl+H₂ gases are introduced via the top inlets to the Ga-melt and the In-melt. Reaction of HCl gas with In produces InCl (indium chloride) gas. Reaction of HCl gas with Ga produces GaCl (gallium chloride) gas. The InCl gas and the GaCl gas fall toward Undersubstrate M on the susceptor. Ammonia gas (NH₃) is introduced near the susceptor and reacts with the InCl gas and the Ga gas. $Al_xIn_yGa_{1-x-y}N$ is synthesized and is deposited upon Undersubstrate M ($Al_xIn_yGa_{1-x-y}N$). The growth conditions are as follows;

| Growth Temperature (susceptor) | 690° C. |
|---|---|
| HCl partial pressure (In-boat) | 0.02 atm (2 kPa) |
| HCl partial pressure (Ga-boat) | 0.01 atm (1 kPa) |
| AlCl₃ partial pressure | 0.02 atm (2 kPa) |
| NH₃ partial pressure | 0.3 atm (30 kPa) |
| Growth Time | 160 hours |
| $Al_xIn_yGa_{1-x-y}N$ thickness | 4500 μm (9 mm) |

The HVPE growth makes a 4500 μm thick $Al_xIn_yGa_{1-x-y}N$ crystal (Sample P). CL observation shows Sample P ($Al_xIn_yGa_{1-x-y}N$ crystal substrate) has a pattern of aligning regularly a set of facet pits having a 400 μm diameter lengthwise and crosswise without gap. The pattern of Sample P exactly transcribes the original pattern of Undersubstrate M ($Al_{0.3}In_{0.3}Ga_{0.4}N$). The dislocation density is measured by the TEM observation. Except the (H) regions, the dislocations are sufficiently reduced. The average of the dislocation density is $3\times10^6$ cm$^{-2}$ in the (Z) regions and (Y) regions. Sample P turns out to be an excellent $Al_xIn_yGa_{1-x-y}N$ substrate.

We claim:

1. An aluminum indium gallium nitride ($Al_xIn_yGa_{1-x-y}N$: $0\leq x\leq 1$, $0\leq y\leq 1$, $0<x+y\leq 1$) mixture crystal substrate having a top surface and a bottom surface, comprising:
   a closed defect accumulating region (H) including a core (S) penetrating the substrate and containing many accumulated defects and a grain boundary (K) enclosing the core (S);
   an accompanying low dislocation single crystal region (Z) surrounding the closed defect accumulating region (H) and being a single crystal of a basic orientation with low dislocation density; and
   an extra low dislocation single crystal regions (Y) lying outside of the accompanying low dislocation single crystal region (Z) and being a single crystal with the same basic orientation as the accompanying low dislocation single crystal regions (Z).

2. The method of producing an $Al_xIn_yGa_{1-x-y}N$ ($0\leq x\leq 1$, $0\leq y\leq 1$, $0<x+y\leq 1$) substrate comprising the steps of:
   preparing an undersubstrate which is a single crystal $Al_xIn_yGa_{1-x-y}N$ ($0\leq x\leq 1$, $0\leq y\leq 1$, $0<x+y\leq 1$) substrate including a plurality of fundamental units (Q),
   the fundamental unit (Q) containing;
   a closed defect accumulating region (H) including a core (S) extending vertical to surfaces of the undersubstrate and containing many accumulated defects and a grain boundary (K) enclosing the core (S),
   an accompanying low dislocation single crystal region (Z) surrounding the closed defect accumulating region (H) and being a single crystal of a basic orientation with low dislocation density, and
   an extra low dislocation single crystal region (Y) lying outside of the accompanying low dislocation single crystal region (Z) and being a single crystal with the same basic orientation as the accompanying low dislocation single crystal region (Z);
   growing an $Al_xIn_yGa_{1-x-y}N$ ($0\leq x\leq 1$, $0\leq y\leq 1$, $0<x+y\leq 1$) crystal on the $Al_xIn_yGa_{1-x-y}N$ undersubstrate in vapor phase on a condition of producing facet pits;
   forming pits composed of facets on the growing $Al_xIn_yGa_{1-x-y}N$ ($0\leq x\leq 1$, $0\leq y\leq 1$, $0<x+y\leq 1$) crystal just above the closed defect accumulating regions (H) and the accompanying low dislocation single crystal regions (Z) of the $Al_xIn_yGa_{1-x-y}N$ undersubstrate;
   making closed defect accumulating regions (H) following bottoms of the facet pits and succeeding the closed defect accumulating regions (H) of the $Al_xIn_yGa_{1-x-y}N$ undersubstrate,
   the closed defect accumulating regions (H) consisting of a core (S) having converged dislocations and extending perpendicular to the undersubstrate and grain boundary (K) enclosing the core (S);
   making accompanying low dislocation single crystal regions (Z) surrounding the closed defect accumulating regions (H) under the pit facets and on the accompanying low dislocation single crystal regions (Z) of the $Al_xIn_yGa_{1-x-y}N$ undersubstrate;

making extra low dislocation single crystal regions (Y) around the accompanying low dislocation single crystal regions (Z) under a C-plane growing surface outside of the facet pits and on the extra low dislocation single crystal regions (Y) of the $Al_xIn_yGa_{1-x-y}N$ undersubstrate;

utilizing solely the grain boundaries (K) or both the grain boundaries (K) and the cores (S) enclosed by the grain boundaries (K) as dislocation annihilation/accumulation regions;

gathering dislocations by the facet pits from the accompanying low dislocation single crystal regions (Z) and the extra low dislocation single crystal regions (Y) to the closed defect accumulating regions (H);

annihilating and accumulating the dislocations in the boundaries (K) or in the boundaries (K) and the cores (S) of the closed defect accumulating regions (H);

reducing dislocations in the accompanying low dislocation single crystal regions (Z) and the extra low dislocation single crystal regions (Y);

obtaining a low dislocation $Al_xIn_yGa_{1-x-y}N$ ($0 \leq x \leq 1$, $0 \leq y \leq 1$, $0 < x+y \leq 1$) crystal;

slicing, grinding, lapping or other mechanical processing the low dislocation $Al_xIn_yGa_{1-x-y}N$ crystal for making a uniform $Al_xIn_yGa_{1-x-y}N$ ($0 \leq x \leq 1$, $0 \leq y \leq 1$, $0 < x+y \leq 1$) substrate without facets and undersubstrate;

polishing the uniform $Al_xIn_yGa_{1-x-y}N$ substrate; and obtaining a flat, smooth $Al_xIn_yGa_{1-x-y}N$ ($0 \leq x \leq 1$, $0 \leq y \leq 1$, $0 < x+y \leq 1$) substrate.

3. The method of producing an $Al_xIn_yGa_{1-x-y}N$ ($0 \leq x \leq 1$, $0 \leq y \leq 1$, $0 < x+y \leq 1$) mixture crystal substrate according to claim 2, wherein a plurality of $Al_xIn_yGa_{1-x-y}N$ ($0 \leq x \leq 1$, $0 \leq y \leq 1$, $0 < x+y \leq 1$) wafers are produced by growing a thick low dislocation $Al_xIn_yGa_{1-x-y}N$ ($0 \leq x \leq 1$, $0 \leq y \leq 1$, $0 < x+y \leq 1$) crystal on the $Al_xIn_yGa_{1-x-y}N$ undersubstrate and slicing the thick $Al_xIn_yGa_{1-x-y}N$ crystal into a plurality of $Al_xIn_yGa_{1-x-y}N$ ($0 \leq x \leq 1$, $0 \leq y \leq 1$, $0 < x+y \leq 1$) wafers.

* * * * *

UNITED STATES PATENT AND TRADEMARK OFFICE
CERTIFICATE OF CORRECTION

PATENT NO. : 7,655,960 B2
APPLICATION NO. : 11/501817
DATED : February 2, 2010
INVENTOR(S) : Nakahata et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 701 days.

Signed and Sealed this

Twenty-eighth Day of December, 2010

David J. Kappos
*Director of the United States Patent and Trademark Office*